United States Patent
Kasai et al.

(10) Patent No.: US 12,110,439 B2
(45) Date of Patent: Oct. 8, 2024

(54) PERPENDICULARLY ALIGNED LIQUID CRYSTAL CURED FILM AND LAMINATE INCLUDING SAME

(71) Applicant: Sumitomo Chemical Company, Limited, Tokyo (JP)

(72) Inventors: Tatsuaki Kasai, Nishio (JP); Nobuyuki Hatanaka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 523 days.

(21) Appl. No.: 17/289,501

(22) PCT Filed: Nov. 1, 2019

(86) PCT No.: PCT/JP2019/042999
§ 371 (c)(1),
(2) Date: Apr. 28, 2021

(87) PCT Pub. No.: WO2020/095831
PCT Pub. Date: May 14, 2020

(65) Prior Publication Data
US 2021/0403811 A1    Dec. 30, 2021

(30) Foreign Application Priority Data
Nov. 9, 2018 (JP) ................. 2018-211557

(51) Int. Cl.
| | | |
|---|---|---|
| C09K 19/60 | (2006.01) | |
| C09K 19/38 | (2006.01) | |
| C09K 19/56 | (2006.01) | |
| G02B 5/30 | (2006.01) | |
| H10K 50/86 | (2023.01) | |

(52) U.S. Cl.
CPC ........ *C09K 19/601* (2013.01); *C09K 19/3857* (2013.01); *C09K 19/3861* (2013.01); *C09K 19/56* (2013.01); *G02B 5/3016* (2013.01); *H10K 50/865* (2023.02)

(58) Field of Classification Search
CPC .............. C09K 19/601; C09K 19/3857; C09K 19/3861; C09K 19/56; H10K 50/865; G02B 5/3016
See application file for complete search history.

(56) References Cited

U.S. PATENT DOCUMENTS

| | | | | |
|---|---|---|---|---|
| 2006/0164571 A1* | 7/2006 | Broer | .......... | G02B 27/288 349/98 |
| 2009/0059368 A1* | 3/2009 | Kamada | .......... | B32B 17/10458 977/773 |
| 2013/0016296 A1 | 1/2013 | Fujita et al. | | |
| 2015/0029445 A1* | 1/2015 | Takeda | .......... | G02B 5/3016 349/194 |
| 2015/0042941 A1 | 2/2015 | Hatanaka et al. | | |
| 2015/0042942 A1 | 2/2015 | Hatanaka et al. | | |
| 2015/0042943 A1 | 2/2015 | Hatanaka et al. | | |
| 2015/0042944 A1 | 2/2015 | Hatanaka et al. | | |
| 2015/0043071 A1 | 2/2015 | Hatanaka et al. | | |
| 2015/0049291 A1 | 2/2015 | Hatanaka et al. | | |
| 2015/0079380 A1* | 3/2015 | Muramatsu | .......... | C09K 19/2028 252/299.61 |
| 2018/0212200 A1 | 7/2018 | Wang et al. | | |
| 2019/0094626 A1* | 3/2019 | Yanai | .......... | G02B 5/3025 |
| 2020/0088924 A1 | 3/2020 | Muramatsu et al. | | |
| 2021/0072444 A1 | 3/2021 | Muramatsu et al. | | |

FOREIGN PATENT DOCUMENTS

| | | | | |
|---|---|---|---|---|
| JP | 2005215435 A | * | 8/2005 | |
| JP | 2006503325 A | | 1/2006 | |
| JP | 2009075568 A | | 4/2009 | |
| JP | 2015043073 A | | 3/2015 | |
| JP | 2015163935 A | | 9/2015 | |
| JP | 2015200861 A | | 11/2015 | |
| JP | 2018022152 A | * | 2/2018 | ............... G02B 5/30 |
| WO | 2011125363 A1 | | 10/2011 | |
| WO | 2017208617 A1 | | 12/2017 | |

OTHER PUBLICATIONS

Espacenet English machine translation of JP2005215435A (Year: 2005).*
Espacenet English machine translation of JP2018022152A (Year: 2018).*

* cited by examiner

*Primary Examiner* — Dung T Nguyen
*Assistant Examiner* — David Y Chung
(74) *Attorney, Agent, or Firm* — Panitch Schwarze Belisario & Nadel LLP

(57) ABSTRACT

A laminate including a vertically oriented liquid crystal cured film and a horizontally oriented phase difference film is provided. The vertically oriented liquid crystal cured film is a cured product of a polymerizable liquid crystal composition containing a polymerizable liquid crystal compound and a dichroic coloring matter. The composition includes, as the dichroic coloring matter, at least one type of dichroic coloring matter having maximum absorption between a wavelength of 400 nm and a wavelength of 750 nm. The vertically oriented liquid crystal cured film is a cured product of the polymerizable liquid crystal composition that is cured in a state in which the polymerizable liquid crystal compound is oriented in a vertical direction with respect to a flat plane of the liquid crystal cured film, and satisfies the following formula (1) and the following formula (2):

$$0.001 \leq AxC \leq 0.3 \quad (1);$$

$$AxC(z=60)/AxC > 2 \quad (2).$$

7 Claims, No Drawings

PERPENDICULARLY ALIGNED LIQUID CRYSTAL CURED FILM AND LAMINATE INCLUDING SAME

CROSS-REFERENCE TO RELATED APPLICATIONS

This application is a Section 371 of International Application No. PCT/JP2019/042999, filed Nov. 1, 2019, which was published in the Japanese language on May 14, 2020, under International Publication No. WO 2020/095831 A1, which claims priority under 35 U.S.C. § 119(b) to Japanese Application No. 2018-211557, filed Nov. 9, 2018, the disclosure of each of which is incorporated herein by reference in their entireties.

TECHNICAL FIELD

The present invention relates to a vertically oriented liquid crystal cured film and a laminate including the same.

BACKGROUND ART

In generally widely used organic EL display devices, the hue when viewed from the front and the hue when viewed from an oblique direction are different during the display of white due to the microcavity structure, so there is the problem that color changes depending on an angle at which an image is viewed. Efforts are being made to solve such a problem by improving the structure itself of a flat panel display (Patent Document 1).

In addition, elliptical polarizing plates including a vertically oriented liquid crystal cured film, in which a polymerizable liquid crystal compound is polymerized and cured in a state of being oriented in the vertical direction with respect to the flat plane of a phase difference plate, have been developed in recent years, for the purpose of improving, when the elliptical polarizing plate is incorporated into an organic EL display device, a change in the oblique reflection hue during the display of black. For example, Patent Document 2 proposes an elliptical polarizing plate in which a vertically oriented liquid crystal cured film and a horizontally oriented liquid crystal cured film are combined.

PRIOR ART DOCUMENTS

Patent Documents

Patent Document 1: WO 2011/125363 A
Patent Document 2: JP-A-2015-163935

SUMMARY OF THE INVENTION

Problems to be Solved by the Invention

However, there are strong demands for further improving the oblique hue during the display of white in an organic EL display device, and for improving the change in the oblique reflection hue during the display of black.

In view of the above desires, an object of the present invention is to provide: a vertically oriented liquid crystal cured film that can exhibit good image display characteristics with improvements both in the front reflection hue and the oblique reflection hue during the display of black and in a reduction in the hue difference between the front hue and the oblique hue during the display of white, when incorporated into an organic EL display device in combination with a horizontally oriented phase difference film; and a laminate including the same.

MEANS FOR SOLVING THE PROBLEMS

As a result of diligent studies to solve the above problems, the present inventors have completed the present invention. That is, the present invention includes the following aspects.

[1] A laminate that: includes a vertically oriented liquid crystal cured film, which is a cured product of a polymerizable liquid crystal composition containing a polymerizable liquid crystal compound and a dichroic coloring matter, and a horizontally oriented phase difference film, the composition containing, as the dichroic coloring matter, at least one type of dichroic coloring matter having maximum absorption from a wavelength of 400 nm and a wavelength of 750 nm, the vertically oriented liquid crystal cured film being a cured product of the polymerizable liquid crystal composition that is cured in a state in which the polymerizable liquid crystal compound is oriented in a vertical direction with respect to a flat plane of the liquid crystal cured film, and satisfying the following formula (1) and the following formula (2):

$$0.001 \leq AxC \leq 0.3 \quad (1)$$

$$AxC(z=60)/AxC > 2 \quad (2),$$

[where, AxC and AxC(z=60) are both absorbances of the vertically oriented liquid crystal cured film at maximum absorption wavelengths between a wavelength of 400 nm and a wavelength of 750 nm, in which AxC represents an absorbance of linearly polarized light that oscillates in an x-axis direction, and AxC (z=60) represents an absorbance of linearly polarized light that oscillates in the x-axis direction when the vertically oriented liquid crystal cured film is rotated by 60° with a y-axis as a rotation axis, where the x-axis means any direction in the plane of the vertically oriented liquid crystal cured film, the y-axis means a direction perpendicular to the x-axis in the plane of the film, and a z-axis means a thickness direction of the vertically oriented liquid crystal cured film].

[2] The laminate according to the [1], in which the horizontally oriented phase difference film satisfies the following formula (3):

$$ReA(450)/ReA(550) < 1.00 \quad (3),$$

[where, ReA(λ) represents an in-plane phase difference value, at a wavelength of λ nm, of the horizontally oriented phase difference film, and ReA(λ)=(nxA(λ)−nyA(λ))×dA holds (where, nxA(λ) represents a main refractive index at the wavelength of λ nm and in the plane of the horizontally oriented phase difference film, nyA(λ) represents a refractive index at the wavelength of λ nm and in a direction perpendicular to a direction of nxA in the same plane as nxA, and dA indicates a film thickness of the horizontally oriented phase difference film).]

[3] The laminate according to the [1] or [2], in which the horizontally oriented phase difference film satisfies the formula (4):

$$120 \text{ nm} \leq ReA(550) \leq 170 \text{ nm} \quad (4),$$

[where, ReA($\lambda$) represents an in-plane phase difference value, at the wavelength of $\lambda$ nm, of the horizontally oriented phase difference film, and ReA($\lambda$)=(nxA($\lambda$)−nyA($\lambda$))×dA holds (where, nxA($\lambda$) represents the main refractive index at the wavelength of $\lambda$ nm and in the plane of the horizontally oriented phase difference film, nyA($\lambda$) represents the refractive index at the wavelength of $\lambda$ nm and in the direction perpendicular to the direction of nxA in the same plane as nxA, and dA indicates the film thickness of the horizontally oriented phase difference film)].

[4] The laminate according to any one of the [1] to [3], in which the horizontally oriented phase difference film is a cured product of a polymerizable liquid crystal composition containing a polymerizable liquid crystal compound (a) that is cured in a state in which the polymerizable liquid crystal compound is oriented in a horizontal direction with respect to a flat plane of the phase difference film.

[5] The laminate according to any one of the [1] to [4], in which the vertically oriented liquid crystal cured film has a film thickness of 0.2 to 3 $\mu$m.

[6] The laminate according to any one of the [1] to [5], in which the vertically oriented liquid crystal cured film satisfies the following formula (5):

$$RthC(450)/RthC(550)<1.00 \tag{5}$$

[where, RthC($\lambda$) represents a phase difference value, at the wavelength of $\lambda$ nm and in a film thickness direction, of the vertically oriented liquid crystal cured film, which is a value determined by RthC($\lambda$)=((nxC($\lambda$)+nyC($\lambda$))/2−nzC($\lambda$))×dC (where, RthC($\lambda$) represents the phase difference value, at the wavelength of $\lambda$ nm and in the film thickness direction, of the vertically oriented liquid crystal cured film, where nxC($\lambda$) indicates an in-plane main refractive index, at the wavelength of $\lambda$ nm, of the vertically oriented liquid crystal cured film, nyC($\lambda$) indicates a refractive index at the wavelength of $\lambda$ nm and in a direction perpendicular, in the plane, to nxC($\lambda$), nzC($\lambda$) indicates a refractive index, at the wavelength of $\lambda$ nm and in a thickness direction, of the vertically oriented liquid crystal cured film, and dC indicates the film thickness of the vertically oriented liquid crystal cured film)].

[7] The laminate according to any one of the [1] to [6], in which the polymerizable liquid crystal composition that forms the vertically oriented liquid crystal cured film contains, as the dichroic coloring matter, at least one type of azo coloring matter.

[8] The laminate according to any one of the [1] to [7], in which the polymerizable liquid crystal composition that forms the vertically oriented liquid crystal cured film contains, as the dichroic coloring matter, at least one type of azo coloring matter, and the vertically oriented liquid crystal cured film satisfies either the following condition (6) or (7):

(6) having maximum absorption from a wavelength of 400 nm to a wavelength of less than 550 nm, and no maximum absorption between a wavelength of 550 nm and a wavelength of 700 nm;

(7) having maximum absorption between a wavelength of 550 nm and a wavelength of 700 nm, and no maximum absorption from a wavelength of 400 nm to a wavelength of less than 550 nm.

[9] The laminate according to any one of the [1] to [8], which is used for an organic EL display device.

[10] A vertically oriented liquid crystal cured film which is a cured product of a polymerizable liquid crystal composition containing a polymerizable liquid crystal compound and a dichroic coloring matter;

which is cured in a state in which the polymerizable liquid crystal compound is oriented in a vertical direction with respect to a flat plane of the liquid crystal cured film, in which the composition contains, as the dichroic coloring matter, at least one type of dichroic coloring matter having maximum absorption between a wavelength of 400 nm and a wavelength of 750 nm; and which satisfies the following formula (1) and the following formula (2):

$$0.001 \leq AxC \leq 0.3 \tag{1}$$

$$AxC(z=60)/AxC > 2 \tag{2},$$

[where, AxC and AxC(z=60) are both absorbances of the vertically oriented liquid crystal cured film at maximum absorption wavelengths between a wavelength of 400 nm and a wavelength of 750 nm, in which AxC represents an absorbance of linearly polarized light that oscillates in an x-axis direction, and AxC (z=60) represents an absorbance of linearly polarized light that oscillates in the x-axis direction when the vertically oriented liquid crystal cured film is rotated by 60° with a y-axis as a rotation axis, where the x-axis means any direction in a plane of the vertically oriented liquid crystal cured film, the y-axis means a direction perpendicular to the x-axis in the plane of the film, and a z-axis means a thickness direction of the vertically oriented liquid crystal cured film].

[11] The vertically oriented liquid crystal cured film according to the [10], containing an orientation promoter.

[12] The vertically oriented liquid crystal cured film according to the [11], which contains, as a vertical orientation promoter, an ionic compound made of a non-metal atom.

[13] The vertically oriented liquid crystal cured film according to the [11] or [12], which contains, as the vertical orientation promoter, an ionic compound made of a non-metal atom, said ionic compound having a molecular weight of 100 to 10,000.

[14] The vertically oriented liquid crystal cured film according to any one of the [11] to [13], which contains, as the vertical orientation promoter, a nonionic silane compound.

[15] The vertically oriented liquid crystal cured film according to any one of the [11] to [14], which contains, as the vertical orientation promoter, a nonionic silane compound that is a silane coupling agent.

[16] The vertically oriented liquid crystal cured film according to any one of the [11] to [15], which contains, as the vertical orientation promoter, a nonionic silane compound and an ionic compound.

[17] The vertically oriented liquid crystal cured film according to any one of the [9] to [$1^6$], which satisfies the following formula (5):

$$RthC(450)/RthC(550)<1.00 \tag{5},$$

[where, RthC($\lambda$) represents a phase difference value, at the wavelength of $\lambda$ nm and in a film thickness direction, of the vertically oriented liquid crystal cured film, which is a value determined by RthC($\lambda$)=((nxC($\lambda$)+ nyC(λ))/2−nzC(λ))×dC (where, RthC(λ) represents the phase difference value, at the wavelength of λ nm and in the film thickness direction, of the vertically oriented liquid crystal cured film, where nxC(λ) indicates an in-plane main refractive index, at the wavelength of λ nm, of the vertically oriented liquid crystal cured film, nyC(λ) indicates a refractive index at the wavelength of λ nm and in a direction perpendicular, in the plane, to nxC(λ), nzC(λ) indicates a refractive index, at the wavelength of λ nm and in a thickness direction, of the vertically oriented liquid crystal cured film, and dC indicates the film thickness of the vertically oriented liquid crystal cured film)].

[18] The vertically oriented liquid crystal cured film according to any one of the [9] to [17], which contains, as the dichroic coloring matter, at least one type of azo coloring matter.

[19] The vertically oriented liquid crystal cured film according to any one of the [9] to [18], which contains, as the dichroic coloring matter, at least one type of azo coloring matter; and
which satisfies either the following condition (6) or (7):
(6) having maximum absorption from a wavelength of 400 nm to a wavelength of less than 550 nm, and no maximum absorption between a wavelength of 550 nm and a wavelength of 700 nm;
(7) having maximum absorption between a wavelength of 550 nm and a wavelength of 700 nm, and no maximum absorption from a wavelength of 400 nm to a wavelength of less than 550 nm.

[20] The vertically oriented liquid crystal cured film according to any one of the [9] to [19], which is used for an organic EL display device.

[21] An elliptical polarizing plate which includes the laminate according to any one of the [1] to [9] and a polarizing film.

[22] The elliptical polarizing plate according to the [21], in which an angle between a slow axis of the horizontally oriented phase difference film and an absorption axis of the polarizing film in the laminate is 45±5°.

[23] An organic EL display device including the elliptical polarizing plate according to the [22].

Effect of the Invention

According to the present invention, a vertically oriented liquid crystal cured film that simultaneously achieves, when incorporated into an organic EL display device in combination with a horizontally oriented phase difference film, improvements in the front reflection hue and the oblique reflection hue during the display of black and a reduction in the hue difference between the front hue and the oblique hue during the display of white, so that good image display characteristics can be exhibited, and a laminate including the vertically oriented liquid crystal cured film can be provided.

MODE FOR CARRYING OUT THE INVENTION

The laminate of the present invention includes: a vertically oriented liquid crystal cured film that is a cured product of a polymerizable liquid crystal composition containing a polymerizable liquid crystal compound and a dichroic coloring matter; and a horizontally oriented phase difference film.

<Vertically Oriented Liquid Crystal Cured Film>

The vertically oriented liquid crystal cured film that forms the laminate of the present invention is a cured product of a polymerizable liquid crystal composition in which the polymerizable liquid crystal compound and dichroic coloring matter contained in the polymerizable liquid crystal composition are cured, and the cured film satisfies the following formulae (1) and (2):

$$0.001 \leq AxC \leq 0.3 \quad (1)$$

$$AxC(z=60)/AxC > 2 \quad (2),$$

Wherein, AxC and AxC(z=60) both represent the absorbances of the vertically oriented liquid crystal cured film at maximum absorption wavelengths between a wavelength of 400 nm and a wavelength of 750 nm. In addition, AxC represents the absorbance of linearly polarized light that oscillates in an x-axis direction, and AxC(z=60) represents the absorbance of linearly polarized light that oscillates in the x-axis direction when the vertically oriented liquid crystal cured film is rotated by 60° with a y-axis as a rotation axis. The x-axis means any direction in the plane of the vertically oriented liquid crystal cured film, the y-axis means the direction perpendicular, in the plane of the film, to the x-axis, and a z-axis means the thickness direction of the vertically oriented liquid crystal cured film. The absorbances in the present description indicate ones obtained by measurement performed in a state in which all influences of interface reflection at the time of the measurement are excluded. Examples of a method for removing the influence of interface reflection include a method in which by using a spectrophotometer, absorbance at a wavelength in which the absorption of a compound can be ignored at a long wavelength such as a wavelength of 800 nm is set to 0, and the absorbance at a wavelength in the region where the absorption of the compound exists in that state is measured.

The AxC can be measured by making linearly polarized light that oscillates in the x-axis direction incident from the z-axis direction toward the film plane of the liquid crystal cured film. The above formula (1) means that the absorbance in the front direction in the plane of the vertically oriented liquid crystal cured film is from 0.001 to 0.3, and it is considered that the smaller the value of AxC, the more accurately oriented in the vertical direction the dichroic coloring matter with respect to the flat plane of the liquid crystal cured film obtained.

When the value of AxC exceeds 0.3, the vertically oriented liquid crystal cured film is strongly colored in the front direction, so that the front hue tends to be inferior when applied to an organic EL display device in combination with a horizontally oriented phase difference film. Therefore, the value of AxC is preferably 0.1 or less, and more preferably 0.05 or less. The lower limit of the value of AxC is usually 0.001 or more, preferably 0.003 or more, and more preferably 0.005 or more.

In the above liquid crystal cured film, the polymerizable liquid crystal compound and the dichroic coloring matter are usually cured in the state of being oriented in the vertical direction with respect to the flat plane of the liquid crystal cured film.

The effect of improving (changing) the "front hue" in the present description means the effect of improving the front hue during the display of white when a laminate (elliptical polarizing plate) including the vertically oriented liquid crystal cured film in combination with a horizontally oriented phase difference film is applied to a display device. The effect of improving (changing) the "oblique hue" means the effect of improving the oblique hue during the display of white when a laminate (elliptical polarizing plate) including the vertically oriented liquid crystal cured film in combination with a horizontally oriented phase difference film is applied to a display device. In particular, when the effect of improving the oblique hue during the display of white is high, the hue difference between the front hue and the oblique hue during the display of white tends to become small, which is preferable.

The above $AxC(z=60)$ can be measured by making the same linear deflection as the linearly polarized light with which Ax is measured in a state in which the vertically oriented liquid crystal cured film is rotated by 60° with the y-axis as a rotation axis.

Here, the rotation of the film is performed by rotating the film in a state in which Ax is measured by 60° in the incident direction of the linearly polarized light with the y-axis as a rotation axis. The value of the above $AxC(z=60)/AxC$ is 2 or less, with the result that good hardly is light absorption anisotropy obtained, and that hardly is the effect of reducing the hue difference between the front hue and oblique hue during the display of while exerted when applied to an organic EL display device. Therefore, the value of $AxC(z=60)/AxC$ is preferably 2.5 or more, and more preferably 3 or more. On the other hand, if the value of $AxC(z=60)/AxC$ is too large, a hue changes greatly only in the oblique hue, and the difference between the front hue and the oblique hue may become large. Therefore, the value of $AxC(z=60))/AxC$ is preferably 50 or less, more preferably 30 or less, and even more preferably 20 or less. In addition, $AxC(z=60)$ is preferably 0.01 or more, more preferably 0.03 or more, and even more preferably 0.05 or more, and preferably 1.0 or less, more preferably 0.5 or less, and even more preferably 0.3 or less.

The absorbance of the linearly polarized light that oscillates in the y-axis direction is expressed as AyC, but in the vertically oriented liquid crystal cured film described in the present invention, the values of AxC and AyC usually become approximately equal. When AxC and AyC are different, there is dichroism in the plane, and in this case, the coloring of the front hue of the vertically oriented liquid crystal cured film tends to become large.

When a vertical liquid crystal cured film satisfies the above formulae (1) and (2), the vertical liquid crystal orientation film can be considered to have an excellent polarization performance (absorption anisotropy), whereby the light from the front direction can be effectively transmitted and the light from an oblique direction can be effectively absorbed. By incorporating a laminate including such a vertical liquid crystal cured film and a horizontally oriented phase difference film into an organic EL display device, the hue difference between the front hue and the oblique hue during the display of white can be reduced.

In the present invention, AxC and $AxC(z=60)$ in the vertically oriented liquid crystal cured film can be controlled by adjusting, for example, the film thickness, the conditions of the manufacturing process, the types or blending amounts of the polymerizable liquid crystal compound and dichroic coloring matter that form the vertically oriented liquid crystal cured film, and the like. In general, the value of $AxC(z=60)/AxC$ becomes about 2 to 10 when the polymerizable liquid crystal compound is nematic liquid crystal and becomes about 5 to 30 when the polymerizable liquid crystal compound is smectic liquid crystal, which can be appropriately selected to meet the desired optical characteristics.

Preferably, the vertically oriented liquid crystal cured film satisfies the following formula (5):

$$RthC(450)/RthC(550)<1.00 \quad (5),$$

[where, $RthC(\lambda)$ represents a phase difference value, at a wavelength of $\lambda$ nm and in the film thickness direction, of the vertically oriented liquid crystal cured film.]

When the above formula (5) is satisfied, a decrease in ellipticity on the short wavelength side in the laminate including the vertically oriented liquid crystal cured film can be suppressed, and the oblique reflection hue during the display of black can be improved. The value of $RthC(450)/RthC(550)$ in the vertically oriented liquid crystal cured film is more preferably 0.95 or less, even more preferably 0.92 or less, and particularly preferably 0.9 or less, and preferably 0.7 or more, more preferably 0.75 or more, and even more preferably 0.8 or more. The $RthC(450)$ can be controlled by a three-dimensional refractive index and the film thickness dC, similarly to the $RthC(550)$ described later.

In the vertically oriented liquid crystal cured film, the dichroic coloring matter preferably exists together with the polymerizable liquid crystal compound with the polymerizable liquid crystal compound and the dichroic coloring matter being oriented in the vertical direction of the liquid crystal cured film with a high degree of order. By orientating the polymerizable liquid crystal compound and the dichroic coloring matter with a high degree of order in the vertically oriented liquid crystal cured film, the effect of suppressing a change in the oblique reflection hue during the display of black tends to be excellent when incorporating the laminate including the vertical liquid crystal cured film into an organic EL display device. Preferably, as an index that represents the high orientation state of the polymerizable liquid crystal compound and the dichroic coloring matter in the vertically oriented liquid crystal cured film and that indicates the degree of an oblique optical compensation effect during the display of black, the phase difference value ($RthC(550)$), at the wavelength of 550 nm and in the film thickness direction, of the vertically oriented liquid crystal cured film is in the range of −120 nm to −30 nm.

From the viewpoint of further improving the oblique reflection hue during the display of black, the phase difference value $RthC(550)$, in the film thickness direction, of the vertically oriented liquid crystal cured film is more preferably −100 nm or more, even more preferably −90 nm or more, and particularly preferably −80 nm or more, and more preferably −40 nm or less, and even more preferably −50 nm or less.

The phase difference value $RthC(550)$, in the film thickness direction, of the vertically oriented liquid crystal cured film can be adjusted by the thickness dC of the vertically oriented liquid crystal cured film. The in-plane phase difference value can be determined by the following formula:

$$RthC(\lambda)=((nxC(\lambda)+nyC(\lambda))/2-nzC(\lambda))\times dC$$

(where, $nxC(\lambda)$ indicates the in-plane main refractive index, at the wavelength of $\lambda$ nm, of the vertically oriented liquid crystal cured film, $nyC(\lambda)$ indicates the refractive index at the wavelength of $\lambda$ nm and in the direction perpendicular, in the plane, to $nxC(\lambda)$, and $nzC(\lambda)$ indicates the refractive index, at the wavelength of $\lambda$ nm and in the thickness direction, of the vertically oriented liquid crystal cured film. When $nxC(\lambda)=nyC(\lambda)$, $nxC(\lambda)$ can be a refractive index in any direction in the plane of the film, and dC indicates the film thickness of the vertically oriented liquid crystal cured film). Therefore, in order to obtain a desired phase difference value $RthC(550)$ in the film thickness direction, the three-dimensional refractive index and the film thickness dC may be adjusted. The three-dimensional refractive index depends on the molecular structure and orientation state of the polymerizable liquid crystal compound described later.

When the polymerizable liquid crystal compound and the dichroic coloring matter are oriented in the vertical direction of the liquid crystal cured film with a high degree of order, there is a tendency that AxC and AxC(z=60) satisfy the above ranges and RthC(550) simultaneously satisfies the above range. When arranged on an organic EL display, such a vertically oriented liquid crystal cured film tends to have more excellent effects of suppressing the difference between the front hue and the oblique hue during the display of white, and of improving the front reflection hue and the oblique reflection hue during the display of black.

Since the vertically oriented liquid crystal cured film in the present invention satisfies the above formula (1) and formula (2), the vertically oriented liquid crystal cured film has light absorption characteristics that can cancel the coloring possibly occurring when the display forming an organic EL display device is viewed from an oblique direction. Therefore, according to the present invention, a change in the oblique hue during the display of white in the organic EL display device can be effectively suppressed.

In the present invention, a dichroic coloring matter having a maximum absorption wavelength between 400 nm and 750 nm is preferably contained such that the vertically oriented liquid crystal cured film is in a complementary color relationship with the hue occurring when the organic EL display emits white light (during the display of white) at an angle of 45°.

When such a dichroic coloring matter is contained, the hue of the display, possibly occurring when the organic EL display device is viewed from an oblique direction, can be canceled by adjusting to satisfy the above formula (1) and formula (2). Therefore, a change in the oblique hue can be suppressed without affecting the hue in the front direction during the display of white.

In general, most of the displays for organic EL display devices that are conventionally widely used appear bluish or yellowish when viewed from an oblique direction. In order to make an organic EL display device using such a display excellent in the effect of suppressing a change in the oblique hue, the vertically oriented liquid crystal cured film preferably satisfies the following condition (6) or (7):

(6) having maximum absorption from a wavelength of 400 nm to a wavelength of less than 550 nm, and no maximum absorption between a wavelength of 550 nm and a wavelength of 700 nm;

(7) having maximum absorption between a wavelength of 550 nm and a wavelength of 700 nm, and no maximum absorption from a wavelength of 400 nm to a wavelength of less than 550 nm.

When the vertically oriented liquid crystal cured film satisfies the formula (6), the oblique hue during the display of white can be improved by using the vertically oriented liquid crystal cured film in combination with a display having maximum emission between a wavelength of 400 nm and a wavelength of 550 nm during the display of white at an angle of 45° (e.g., typically a display whose oblique hue appears bluish).

When the vertically oriented liquid crystal cured film satisfies the formula (7), the oblique hue during the display of white can be improved by using the vertically oriented liquid crystal cured film in combination with a display having maximum emission between a wavelength of 550 nm and a wavelength of 700 nm during the display of white at an angle of 45° (e.g., typically a display whose oblique hue appears yellowish).

The light absorption characteristics of the vertically oriented liquid crystal cured film can be controlled by selecting a dichroic coloring matter having desired maximum absorption or by a host-guest interaction between the liquid crystal and the dichroic coloring matter.

The vertically oriented liquid crystal cured film is a cured product of a polymerizable liquid crystal composition containing at least one type of polymerizable liquid crystal compound and a dichroic coloring matter. In the present invention, the polymerizable liquid crystal compound contained in the polymerizable liquid crystal composition that forms the vertically oriented liquid crystal cured film means a liquid crystal compound having a polymerizable group, especially a photopolymerizable group. The polymerizable liquid crystal compound is not particularly limited as long as it can form a liquid crystal cured film satisfying the above formulae (1) and (2). A polymerizable liquid crystal compound conventionally known, for example, in the field of phase difference film can be used.

The polymerizable group refers to a group that can participate in a polymerization reaction. The photopolymerizable group refers to a group that is a polymerizable group and can participate in a polymerization reaction by a reaction active species generated from a photopolymerization initiator, for example, an active radical or an acid. Examples of the photopolymerizable group include, for example, a vinyl group, vinyloxy group, 1-chlorovinyl group, isopropenyl group, 4-vinylphenyl group, acryloyloxy group, methacryloyloxy group, oxylanyl group, oxetanyl group, etc. Among them, an acryloyloxy group, methacryloyloxy group, vinyloxy group, oxylanyl group, and oxetanyl group are preferable, and an acryloyloxy group is more preferable. The liquid crystallinity exhibited by the polymerizable liquid crystal compound may be thermotropic liquid crystal or lyotropic liquid crystal, but thermotropic liquid crystal is preferable in that a film thickness can be precisely controlled. In addition, the phase-ordered structure of the thermotropic liquid crystal may be either nematic liquid crystal or smectic liquid crystal. Smectic liquid crystal is preferred from the viewpoint that the value of AxC becomes small and the value of AxC(z=60)/AxC becomes large. When the value of AxC is small, the effect on the front hue during the display of white becomes small. When the value of AxC(z=60)/AxC becomes large, only the oblique hue can be more effectively improved while suppressing the effect on the front hue during the display of white. The polymerizable liquid crystal compound can be used alone or in combination of two or more.

Examples of the polymerizable liquid crystal compound generally include a polymerizable liquid crystal compound exhibiting positive wavelength dispersibility and a polymerizable liquid crystal compound exhibiting reverse wavelength dispersibility. Only one type of the polymerizable liquid crystal compounds can be used, or both types of the polymerizable liquid crystal compounds can be mixed and used.

From the viewpoint of having a large effect of suppressing the oblique reflection hue during the display of black, a polymerizable liquid crystal compound exhibiting reverse wavelength dispersibility is preferably contained.

As the polymerizable liquid crystal compound exhibiting reverse wavelength dispersibility, a compound having the following characteristics (A) to (D) is preferred:

(A) A compound capable of forming a nematic phase or a smectic phase;
(B) Having π electrons on the major axis direction (a) of the polymerizable liquid crystal compound.
(C) Having π electrons on the direction [crossing direction (b)] crossing the major axis direction (a); and
(D) A polymerizable liquid crystal compound in which: a π-electron density, in the major axis direction (a), of the compound, said density being defined by the following formula (i):

$$D(\pi a) = N(\pi a)/N(Aa) \qquad (i)$$

[where, $N(\pi a)$ is the total number of π electrons existing in the major axis direction (a), and $N(Aa)$ is the total of molecular weights existing in the major axis direction], and a π-electron density, in the crossing direction (b), of the compound, said density being by the following formula (ii):

$$D(\pi b) = N(\pi b)/N(Ab) \qquad (ii)$$

[where, $N(\pi b)$ is the total number of π electrons existing in the crossing direction (b), and $N(Ab)$ is the total of molecular weights existing in the crossing direction (b)]

have the relationship represented by formula (iii):

$$0 \leq [D(\pi a)/D(\pi b)] < 1 \qquad (iii)$$

[i.e., the π-electron density in the crossing direction (b) is larger than the π-electron density in the major axis direction (a)]. In addition, the polymerizable liquid crystal compound having, as described above, π electrons on the major axis and on a direction crossing the major axis has, for example, a T-shaped structure.

In the above characteristics (A) to (D), the major axis direction (a) and the number N of π electrons are defined as follows:

In the case of a compound having, for example, a rod-shaped structure, the major axis direction (a) is the major axis direction of the rod shape.

$N(\pi a)$, the number of π electrons existing on the major axis direction (a), does not include the π electrons that disappear due to a polymerization reaction.

$N(\pi a)$, the number of π electrons existing on the major axis direction (a), is the total number of π electrons on the major axis and π electrons conjugated with them, and includes the number of π electrons existing, for example, in a ring that exists on the major axis direction (a) and satisfies the Hückel's rule.

$N(\pi b)$, the number of π electrons existing in the crossing direction (b), does not include the π electrons that disappear due to a polymerization reaction.

The polymerizable liquid crystal compound satisfying the above has a mesogen structure in the major axis direction. The liquid crystal phase (nematic phase, smectic phase) is expressed by this mesogen structure.

The polymerizable liquid crystal compound satisfying the above (A) to (D) can form a nematic phase or a smectic phase by being coated on a base material or an orientation film and heated to the phase transition temperature or higher. In the nematic phase or smectic phase formed with the polymerizable liquid crystal compound oriented, the polymerizable liquid crystal compound is usually oriented such that the major axis directions are parallel to each other, and this major axis direction becomes the orientation direction of the nematic phase. When such a polymerizable liquid crystal compound is formed into a film and polymerized in the state of the nematic phase or the smectic phase, a polymer film made of a polymer polymerized in the state of being oriented in the major axis direction (a) can be formed. This polymer film absorbs ultraviolet rays by the π electrons on the major axis direction (a) and the π electrons on the crossing direction (b). Here, the maximum absorption wavelength of the ultraviolet rays absorbed by the π electrons on the crossing direction (b) is defined as λbmax. λbmax is usually 300 nm to 400 nm. Since the π-electron densities satisfy the above formula (iii) and the π-electron density in the crossing direction (b) is larger than the π-electron density in the major axis direction (a), a polymer film is formed in which the absorption of linearly polarized ultraviolet rays (wavelength is λbmax) that have oscillating surfaces in the crossing direction (b) is larger than the absorption of linearly polarized ultraviolet rays (wavelength is λbmax) that have oscillating surfaces in the major axis direction (a). The ratio (ratio of the absorbance in the crossing direction (b)/the absorbance in the major axis direction (a) of the linearly polarized ultraviolet rays) is, for example, more than 1.0, and preferably 1.2 or more, and usually 30 or less, and for example, 10 or less.

Most of the polymerizable liquid crystal compounds having the above characteristics generally exhibit reverse wavelength dispersibility. Specifically, for example, a compound represented by the following formula (X) can be mentioned.

[Chemical 1]

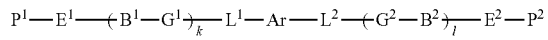

(X)

Where, Ar represents a divalent group having an aromatic group that may have a substituent. The aromatic group described above refers to a group in which the number of π electrons that the ring structure has is [4n+2] according to the Hückel's rule. The aromatic group may have, via a divalent linking group, two or more Ar groups as illustrated by, for example, (Ar-1) to (Ar-23) described later. Here, n represents an integer. In the case where a ring structure is formed by containing a hetero atom such as —N═ or —S—, a case is also included, where the Hückel's rule is satisfied including the non-covalent bond electron pairs on these hetero atoms and aromaticity is held. Preferably the aromatic group contains at least one of a nitrogen atom, oxygen atom, and sulfur atom. The divalent group Ar may contain one aromatic group or two or more aromatic groups. When one aromatic group is contained, the divalent group Ar may be a divalent aromatic group that may have a substituent. When two or more aromatic groups are contained in the divalent group Ar, the two or more aromatic groups may be bonded to each other by a single bond or a divalent linking group such as —CO—O— or —O—.

$G^1$ and $G^2$ each independently represent a divalent aromatic group or a divalent alicyclic hydrocarbon group. Here, the hydrogen atom contained in the divalent aromatic group or the divalent alicyclic hydrocarbon group may be substituted with a halogen atom, alkyl group having 1 to 4 carbon atoms, fluoroalkyl group having 1 to 4 carbon atoms, alkoxy group having 1 to 4 carbon atoms, cyano group, or nitro group. The carbon atom forming the divalent aromatic group or the divalent alicyclic hydrocarbon group may be substituted with an oxygen atom, sulfur atom, or nitrogen atom.

$L^1$, $L^2$, $B^1$, and $B^2$ are each independently a single bond or divalent linking group.

k and l each independently represent an integer from 0 to 3, and satisfy the relationship of $1 \leq k+l$. Here, when $2 \leq k+l$, each of $B^1$ and $B^2$ and $G^1$ and $G^2$ may be the same as or different from each other.

$E^1$ and $E^2$ each independently represent an alkanediyl group having 1 to 17 carbon atoms. Here, an alkanediyl group having 4 to 12 carbon atoms is more preferable. In addition, the hydrogen atom contained in the alkanediyl group may be substituted with a halogen atom, and —$CH_2$— contained in the alkanediyl group may be substituted with —O—, —S—, —$SiH_2$—, and —C(=O)—.

$P^1$ and $P^2$ each independently represent a polymerizable group or a hydrogen atom, and at least one of them is a polymerizable group.

$G^1$ and $G^2$ are each independently: preferably 1,4-phenylenediyl group that may be substituted with at least one substituent selected from the group consisting of halogen atom and alkyl groups having 1 to 4 carbon atoms or 1,4-cyclohexanediyl group that may be substituted with at least one substituent selected from the group consisting of halogen atom and alkyl groups having 1 to 4 carbon atoms; more preferably 1,4-phenylenediyl group substituted with a methyl group, unsubstituted 1,4-phenylenediyl group, or unsubstituted 1,4-trans-cyclohexanediyl group; and particularly preferably unsubstituted 1,4-phenylenediyl group or unsubstituted 1,4-trans-cyclohexanediyl group.

Additionally, at least one of a plurality of $G^1$ and $G^2$ that are present is preferably a divalent alicyclic hydrocarbon group, and at least one of $G^1$ and $G^2$ bound to $L^1$ or $L^2$ is more preferably a divalent alicyclic hydrocarbon group.

$L^1$ and $L^2$ are, each independently, preferably a single bond, alkylene group having 1 to 4 carbon atoms, —O—, —S—, —$R^{a1}OR^{a2}$—, —$R^{a3}COOR^{a4}$—, —$R^{a5}OCOR^{a6}$—, —$R^{a7}OC=OOR^{a8}$—, —N=N—, —$CR^c=CR^d$—, or C≡C—. Here, $R^{a1}$ to $R^{a8}$ each independently represent a single bond or alkylene group having 1 to 4 carbon atoms, and Re and Rd represent an alkyl group having 1 to 4 carbon atoms or a hydrogen atom. $L^1$ and $L^2$ are, each independently, more preferably a single bond, —$OR^{a2-1}$—, —$CH_2$—, —$CH_2CH_2$—, —$COOR^{a4-1}$—, or $OCOR^{a6-1}$—. Here, $R^{a2-1}$, $R^{a4-1}$, and $R^{a6-1}$ each independently represent one of a single bond, —$CH_2$—, and —$CH_2CH_2$—. $L^1$ and $L^2$ are, each independently, even more preferably a single bond, —O—, —$CH_2CH_2$—, —COO—, —$COOCH_2CH_2$—, or OCO—.

$B^1$ and $B^2$ are, each independently, preferably a single bond, alkylene group having 1 to 4 carbon atoms, —O—, —S—, —$R^{a9}OR^{a10}$—, —$R^{a11}COOR^{a12}$—, —$R^{a13}OCOR^{a14}$—, or —$R^{a15}OC=OOR^{a16}$—. Here, $R^{a9}$ to $R^{a16}$ each independently represent a single bond or alkylene group having 1 to 4 carbon atoms. $B^1$ and $B^2$ are, each independently, more preferably a single bond, —$OR^{a10-1}$—, —$CH_2$—, —$CH_2CH_2$—, —$COOR^{a12-1}$—, or $OCOR^{a14-1}$—. Here, $R^{a10-1}$, $R^{a12-1}$, and $R^{a14-1}$ each independently represent any one of a single bond, —$CH_2$—, and —$CH_2CH_2$—. $B^1$ and $B^2$ are, each independently, even more preferably a single bond, —O—, —$CH_2CH_2$—, —COO—, —$COOCH_2CH_2$—, —OCO—, or $OCOCH_2CH_2$—.

From the viewpoint of exhibiting reverse wavelength dispersibility, it is preferable that k and l are within the range of $2 \leq k+l \leq 6$, preferable that k+l=4, and more preferable that k=2 and l=2. When k=2 and l=2, a symmetrical structure is formed, which is preferable.

Examples of the polymerizable group represented by $P^1$ or $P^2$ include an epoxy group, vinyl group, vinyloxy group, 1-chlorovinyl group, isopropenyl group, 4-vinylphenyl group, acryloyloxy group, methacryloyloxy group, oxylanyl group, oxetanyl group, etc.

Among them, an acryloyloxy group, methacryloyloxy group, vinyloxy group, oxylanyl group, and oxetanyl group are preferable, and an acryloyloxy group is more preferable.

Preferably Ar has at least one selected from an aromatic hydrocarbon ring that may have a substituent, an aromatic heterocycle that may have a substituent, and an electron-withdrawing group. Examples of the aromatic hydrocarbon ring include, for example, a benzene ring, naphthalene ring, anthracene ring, etc., and a benzene ring and naphthalene ring are preferable. Examples of the aromatic heterocycle include a furan ring, benzofuran ring, pyrrole ring, indole ring, thiophene ring, benzothiophene ring, pyridine ring, pyrazine ring, pyrimidine ring, triazole ring, triazine ring, pyrroline ring, imidazole ring, pyrazole ring, thiazole ring, benzothiazole ring, thienothiazole ring, oxazole ring, benzoxazole ring, phenanthroline ring, etc. Among them, it is preferable to have a thiazole ring, benzothiazole ring, or benzofuran ring, and more preferable to have a benzothiazole group. When Ar contains a nitrogen atom, it is preferable that the nitrogen atom has π electrons.

In the formula (X), $N_\pi$, the total number of π electrons contained in the divalent aromatic group represented by Ar, is preferably 8 or more, more preferably 10 or more, even more preferably 14 or more, and particularly preferably 16 or more. On the other hand, it is preferably 30 or less, more preferably 26 or less, and even more preferably 24 or less.

Examples of the aromatic group represented by Ar include the following groups.

[Chemical 2]

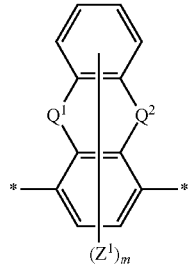

(Ar-1)

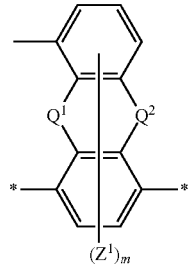

(Ar-2)

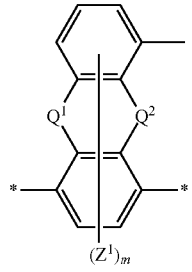

(Ar-3)

-continued
(Ar-4)
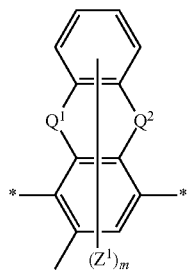
(Ar-5)
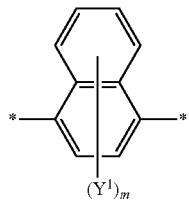
(Ar-6)
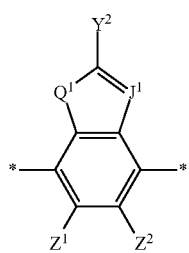
(Ar-7)
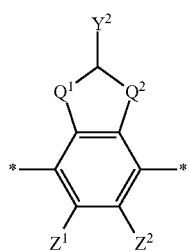
(Ar-8)
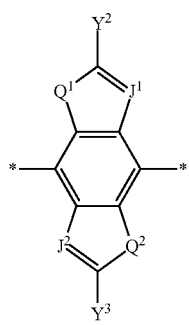
(Ar-9)
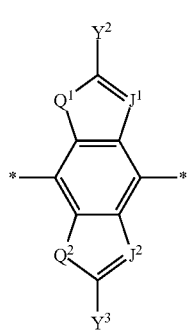
-continued
(Ar-10)
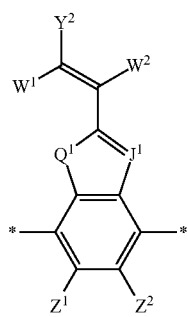
(Ar-11)
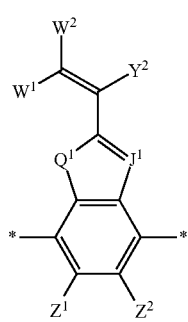
(Ar-12)
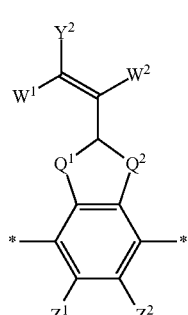
(Ar-13)
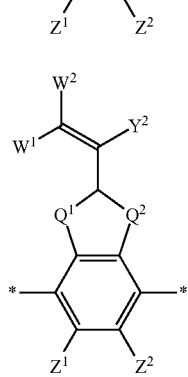
(Ar-14)
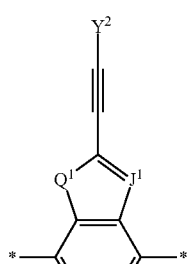
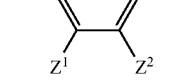

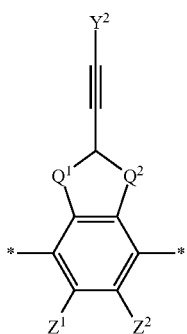
(Ar-15)

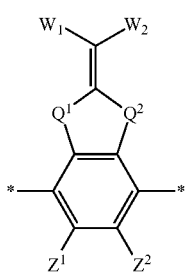
(Ar-16)

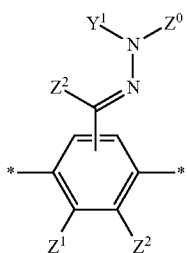
(Ar-17)

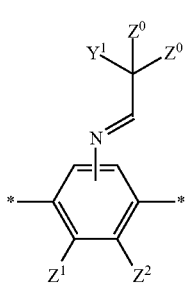
(Ar-18)

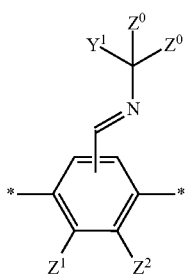
(Ar-19)

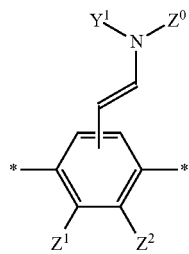
(Ar-20)

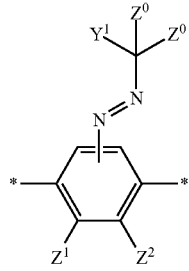
(Ar-21)

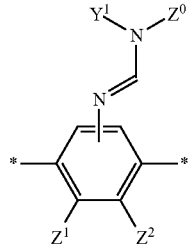
(Ar-22)

(Ar-23)

In the formulae (Ar-1) to (Ar-23), mark represents a connecting part; and $Z^0$, $Z^1$, and $Z^2$ each independently represent a hydrogen atom, halogen atom, alkyl group having 1 to 12 carbon atoms, cyano group, nitro group, alkyl sulfinyl group having 1 to 12 carbon atoms, alkyl sulfonyl group having 1 to 12 carbon atoms, carboxyl group, fluoroalkyl group having 1 to 12 carbon atoms, alkoxy group having 1 to 12 carbon atoms, alkylthio group having 1 to 12 carbon atoms, N-alkylamino group having 1 to 12 carbon atoms, N,N-dialkylamino group having 2 to 12 carbon atoms, N-alkylsulfamoyl group having 1 to 12 carbon atoms, or N,N-dialkylsulfamoyl group having 2 to 12 carbon atoms. In addition, $Z^0$, $Z^1$, and $Z^2$ may contain a polymerizable group.

$Q^1$ and $Q^2$ each independently represent —$CR^{2\prime}R^{3\prime}$—, —S—, —NH—, —$NR^{2\prime}$—, —CO—, or O—. and $R^{2\prime}$ and $R^{3\prime}$ each independently represent a hydrogen atom or alkyl group having 1 to 4 carbon atoms.

$J^1$ and $J^2$ each independently represent a carbon atom or a nitrogen atom.

$Y^1$, $Y^2$, and $Y^3$ each independently represent an aromatic hydrocarbon group or aromatic heterocyclic group that may be substituted.

$W^1$ and $W^2$ each independently represent a hydrogen atom, cyano group, methyl group, or halogen atom, and m represents an integer from 0 to 6.

Examples of the aromatic hydrocarbon groups in $Y^1$, $Y^2$, and $Y^3$ include aromatic hydrocarbon groups having 6 to 20 carbon atoms, such as a phenyl group, naphthyl group, anthryl group, phenanthryl group, and biphenyl group. A phenyl group and naphthyl group are preferable, and a phenyl group is more preferable. Examples of the aromatic heterocyclic groups include aromatic heterocyclic groups that contain at least one hetero atom such as a nitrogen atom, oxygen atom, or sulfur atom and have 4 to 20 carbon atoms, such as a furyl group, pyrrolyl group, thienyl group, pyridinyl group, thiazolyl group, and benzothiazolyl group. A furyl group, thienyl group, pyridinyl group, thiazolyl group, and benzothiazolyl group are preferable.

$Y^1$, $Y^2$, and $Y^3$ may be, each independently, a polycyclic aromatic hydrocarbon group or polycyclic aromatic heterocyclic group that may be substituted. The polycyclic aromatic hydrocarbon group means a condensed polycyclic aromatic hydrocarbon group or a group derived from an aromatic ring assembly. The polycyclic aromatic heterocyclic group means a condensed polycyclic aromatic heterocyclic group or a group derived from an aromatic ring assembly.

$Z^0$, $Z^1$, and $Z^2$ are, each independently, preferably a hydrogen atom, halogen atom, alkyl group having 1 to 12 carbon atoms, cyano group, nitro group, and alkoxy group having 1 to 12 carbon atoms. $Z^0$ is more preferably a hydrogen atom, alkyl group having 1 to 12 carbon atoms, or cyano group. $Z^1$ and $Z^2$ are more preferably a hydrogen atom, fluorine atom, chlorine atom, methyl group, or cyano group. In addition, $Z^0$, $Z^1$, and $Z^2$ may contain a polymerizable group.

$Q^1$ and $Q^2$ are preferably —NH—, —S—, —NR$^{2'}$—, and —O—, and R$^{2'}$ is preferably a hydrogen atom. Among them, —S—, —O—, and —NH— are particularly preferable.

Among the formulae (Ar-1) to (Ar-23), the formula (Ar-6) and the formula (Ar-7) are preferable from the viewpoint of molecular stability.

In the formulae (Ar-16) to (Ar-23), together with the nitrogen atom to which it is bound and $Z^0$, may form an aromatic heterocyclic group. Examples of the aromatic heterocyclic group include those described above as the aromatic heterocyclic ring that Ar may have, and examples thereof include, for example, a pyrrole ring, imidazole ring, pyrroline ring, pyridine ring, pyrazine ring, pyrimidine ring, indole ring, quinoline ring, isoquinoline ring, purine ring, pyrrolidine ring, etc. This aromatic heterocyclic group may have a substituent. Alternatively, $Y^1$, together with the nitrogen atom to which it is bound and $Z^0$, may be the above polycyclic aromatic hydrocarbon group or polycyclic aromatic heterocyclic group that may be substituted. Examples thereof include a benzofuran ring, benzothiazole ring and benzoxazole ring.

In addition, as the polymerizable liquid crystal compound that forms the vertically oriented liquid crystal cured film in the present invention, for example, a compound containing a group represented by the following formula (Y) (hereinafter, also referred to as a "polymerizable liquid crystal compound (Y)") may be used. The polymerizable liquid crystal compound (Y) generally tends to exhibit positive wavelength dispersibility. The polymerizable liquid crystal compound can be used alone or in combination of two or more.

P11-B11-E11-B12-A11-B13-     (Y)

[where, P11 represents a polymerizable group.

A11 represents a divalent alicyclic hydrocarbon group or a divalent aromatic hydrocarbon group. The hydrogen atom contained in the divalent alicyclic hydrocarbon group and the divalent aromatic hydrocarbon group may be substituted with a halogen atom, alkyl group having 1 to 6 carbon atoms, alkoxy group having 1 to 6 carbon atoms, cyano group, or nitro group. The hydrogen atom contained in the alkyl group having 1 to 6 carbon atoms and the alkoxy group having 1 to 6 carbon atoms may be substituted with a fluorine atom.

B11 represents —O—, —S—, —CO—O—, —O—CO—, —O—CO—O—, —CO—NR$^{16}$—, —NR$^{16}$—CO—, —CO—, —CS—, or a single bond. R$^{16}$ represents a hydrogen atom or an alkyl group having 1 to 6 carbon atoms.

B12 and B13 each independently represent —C≡C—, —CH=CH—, —CH$_2$—CH$_2$—, —O—, —S—, —C(=O)—, —C(=O)—O—, —O—C(=O)—, —O—C(=O)—O—, —CH=N—, —N=CH—, —N=N—, —C(=O)—NR$^{16}$—, —NR$^{16}$—C(=O)—, —OCH$_2$—, —OCF$_2$—, —CH$_2$O—, —CF$_2$O—, —CH=CH—C(=O)—O—, —O—C(=O)—CH=CH—, or a single bond.

E11 represents an alkanediyl group having 1 to 12 carbon atoms, and the hydrogen atom contained in the alkanediyl group may be substituted with an alkoxy group having 1 to 5 carbon atoms, and the hydrogen atom contained in the alkoxy group may be substituted with a halogen atom. In addition, the —CH$_2$— forming the alkanediyl group may be replaced by —O— or —CO—].

The number of carbon atoms in the aromatic hydrocarbon group and the alicyclic hydrocarbon group represented by A11 is preferably in the range of 3 to 18, more preferably in the range of 5 to 12, and particularly preferably in the range of 5 or 6. As A11, a cyclohexane-1,4-diyl group and a 1,4-phenylene group are preferable.

As E11, a linear alkanediyl group having 1 to 12 carbon atoms is preferable. The —CH$_2$— forming the alkanediyl group may be replaced by —O—.

Specific examples thereof include: a methylene group; an ethylene group; linear alkanediyl groups having 1 to 12 carbon atoms such as a propane-1,3-diyl group, butane-1,4-diyl group, pentane-1,5-diyl group, hexane-1,6-diyl group, heptane-1,7-diyl group, octane-1,8-diyl group, nonane-1,9-diyl group, decane-1,10-diyl group, undecane-1,11-diyl group, and dodecane-1,12-diyl group; —CH$_2$—CH$_2$—O—CH$_2$—CH$_2$—; —CH$_2$—CH$_2$—O—CH$_2$—CH$_2$—O—CH$_2$—CH$_2$—; and —CH$_2$—CH$_2$—O—CH$_2$—CH$_2$—O—CH$_2$—CH$_2$—O—CH$_2$—CH$_2$—.

As B11, —O—, —S—, —CO—O—, and —O—CO— are preferable, and among them —CO—O— is more preferable.

As B12 and B13, —O—, —S—, —C(=O)—, —C(=O)—O—, —O—C(=O)—, and —O—C(=O)—O— are each independently preferable, and among them —O— or —O—C(=O)—O— is more preferable.

As the polymerizable group represented by P11, a radically polymerizable group or a cationically polymerizable group is preferable in terms of high polymerization reactivity, especially high photopolymerization reactivity. Preferably the polymerizable group is groups represented by the following formulae (P-11) to (P-15) because they are easy to handle and manufacture itself of the liquid crystal compound is easy.

[Chemical 3]

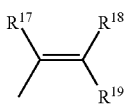 (P-11)

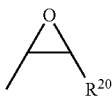 (P-12)

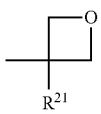 (P-13)

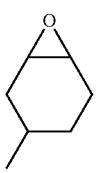 (P-14)

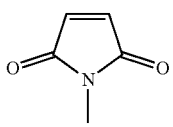 (P-15)

[where, $R^{17}$ to $R^{21}$ each independently represent an alkyl group having 1 to 6 carbon atoms or a hydrogen atom.]

Specific examples of the groups represented by the formulae (P-11) to (P-15) include the groups represented by the following formulae (P-16) to (P-20).

[Chemical 4]

 (P-16)

 (P-17)

 (P-18)

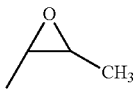 (P-19)

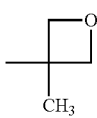 (P-20)

P11 is preferably the groups represented by the formulae (P-14) to (P-20), and a vinyl group, a p-stilbene group, an epoxy group, or an oxetanyl group is more preferable.

More preferably, the group represented by P11-B11- is an acryloyloxy group or a methacryloyloxy group.

Examples of the polymerizable liquid crystal compound (Y) include compounds represented by the formula (I), the formula (II), the formula (III), the formula (IV), the formula (V), or the formula (VI).

P11-B11-E11-B12-A11-B13-A12-B14-A13-B15-
A14-B16-E12-B17-P12    (I)

P11-B11-E11-B12-A11-B13-A12-B14-A13-B15-
A14-F11    (II)

P11-B11-E11-B12-A11-B13-A12-B14-A13-B15-E12-
B17-P12    (III)

P11-B11-E11-B12-A11-B13-A12-B14-A13-F11    (IV)

P11-B11-E11-B12-A11-B13-A12-B14-E12-B17-P12    (V)

P11-B11-E11-B12-A11-B13-A12-F11    (VI)

(where,

A12 to A14 are each independently synonymous with A11, B14 to B16 are each independently synonymous with B12, B17 is synonymous with B11, and E12 is synonymous with E11.

F11 represents a hydrogen atom, alkyl group having 1 to 13 carbon atoms, alkoxy group having 1 to 13 carbon atoms, cyano group, nitro group, trifluoromethyl group, dimethylamino group, hydroxy group, methylol group, formyl group, sulfo group (—SO$_3$H), carboxy group, alkoxycarbonyl group having 1 to 10 carbon atoms, or halogen atom. The —CH$_2$— forming the alkyl group and the alkoxy group may be replaced by —O—.)

Specific examples of the polymerizable liquid crystal compound (Y) include: compounds having a polymerizable group among the compounds described in "3.8.6 Network (completely cross-linked type)" and "6.5.1 Liquid Crystal Materials b. Polymerizable Nematic Liquid Crystal Materials" in Liquid Crystal Handbook (edited by Liquid Crystal Handbook Editorial Committee, published by Maruzen Co., Ltd. on Oct. 30, 2000); and polymerizable liquid crystals described in JP-A-2010-31223, JP-A-2010-270108, JP-A-2011-6360, and JP-A-2011-207765.

Specific examples of the polymerizable liquid crystal compound (Y) include compounds represented by the following formulae (I-1) to (I-4), formulae (II-1) to (II-4), formulae (III-1) to (III-26), formulae (IV-1) to (IV-26), formulae (V-1) to (V-2), and formulae (VI-1) to (VI-6). In the following formulae, k1 and k2 each independently represent an integer from 2 to 12. These polymerizable liquid crystal compounds (Y) are preferable in terms of easy synthesis or easy availability.

[Chemical 5]
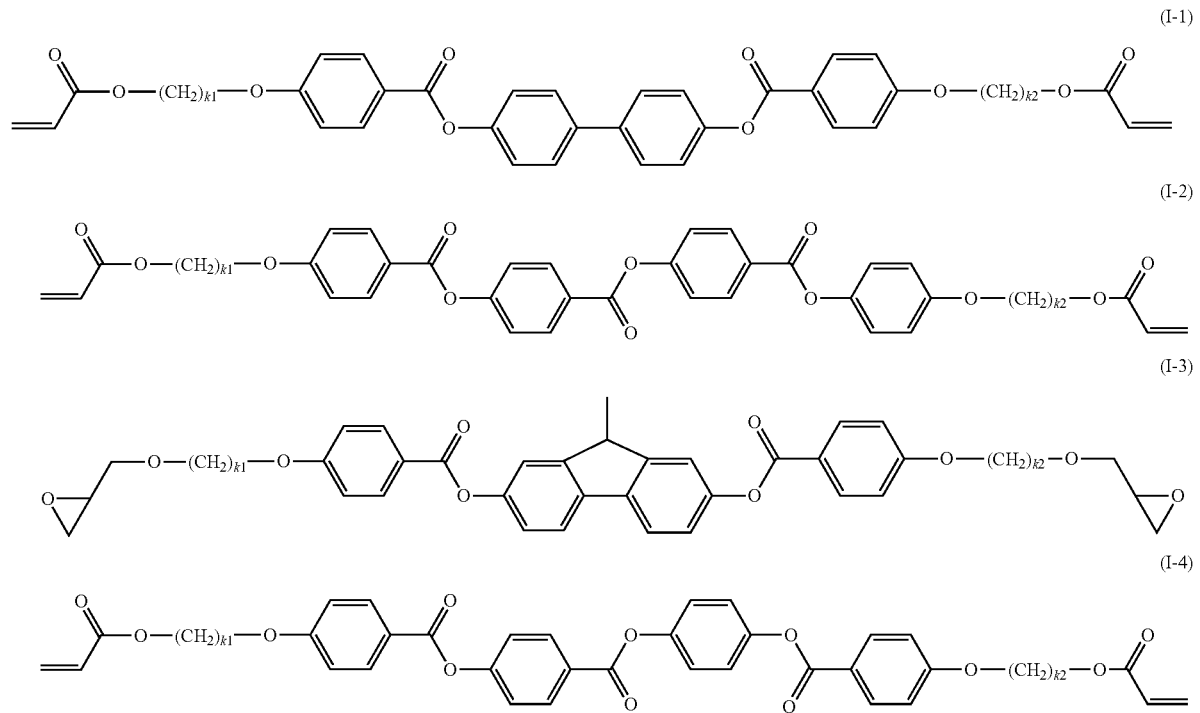
[Chemical 6]
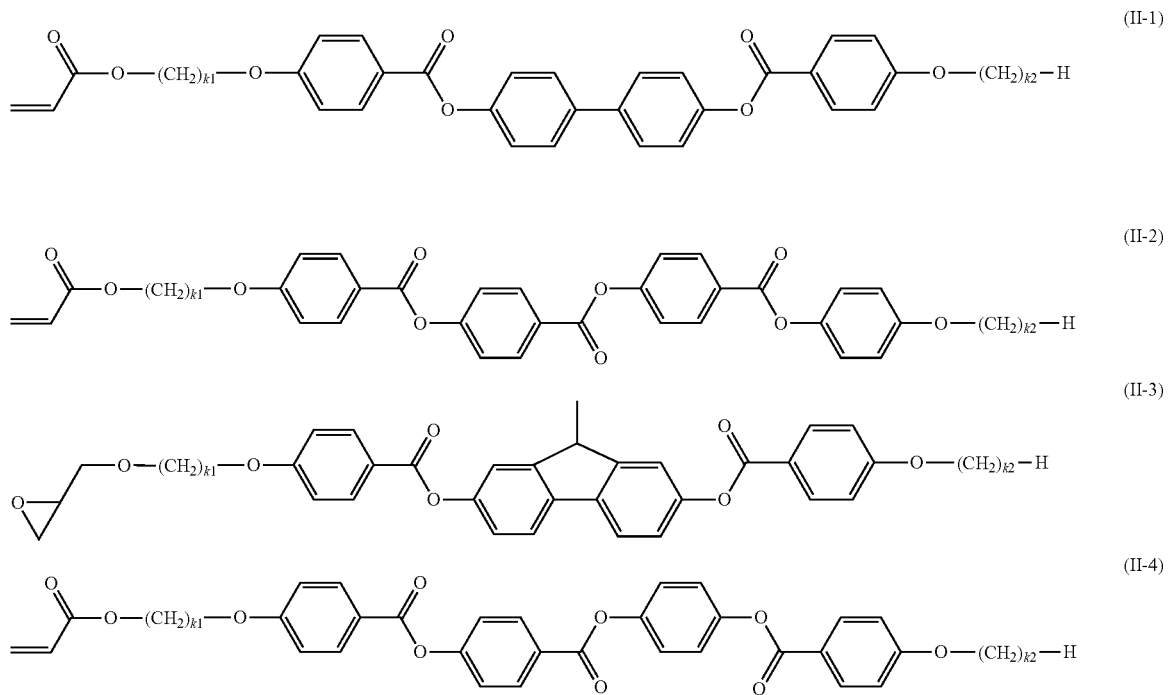
[Chemical 7]
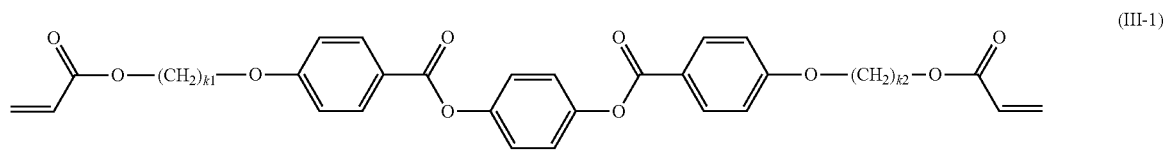

-continued
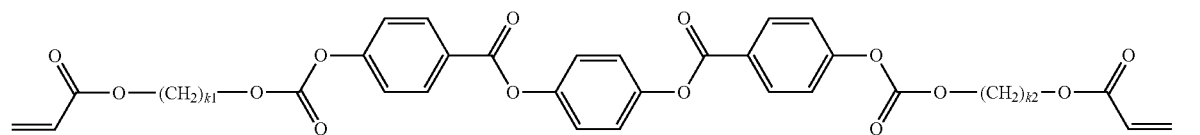
(III-2)
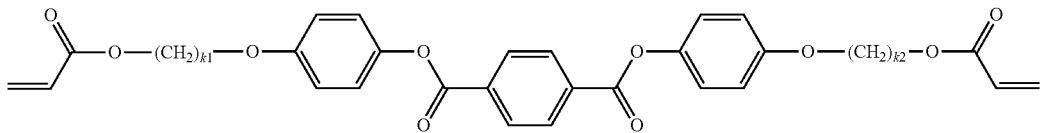
(III-3)
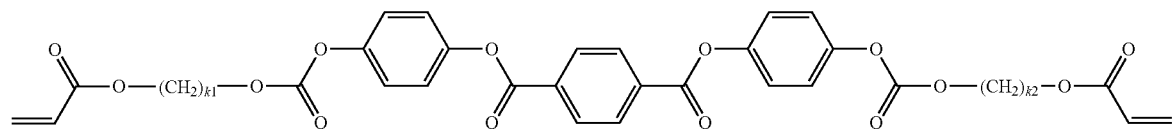
(III-4)
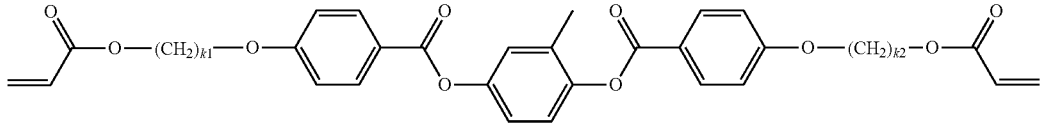
(III-5)
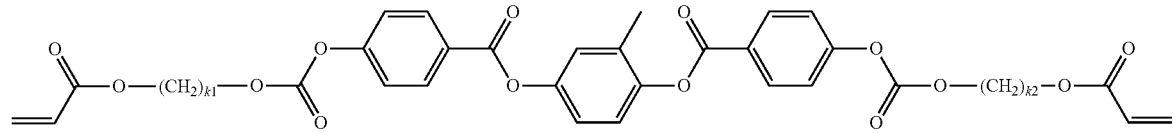
(III-6)
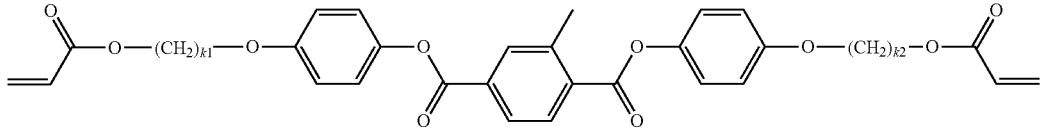
(III-7)
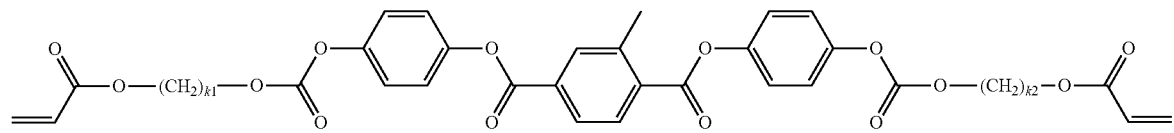
(III-8)
[Chemical 8]
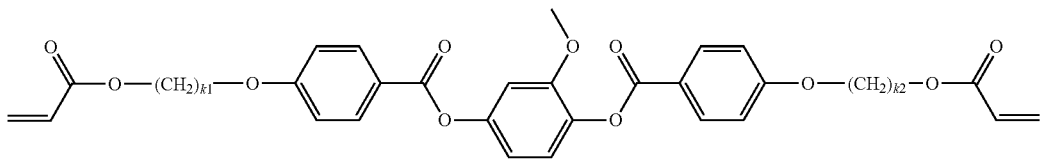
(III-9)
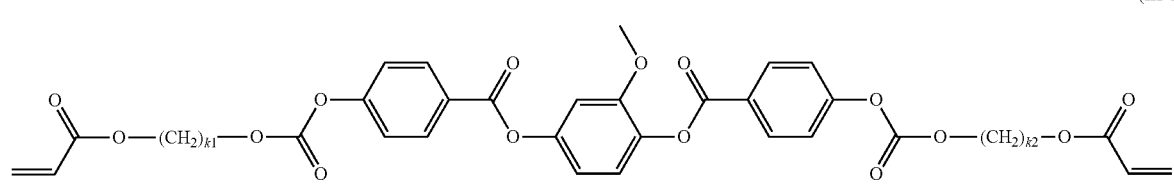
(III-10)

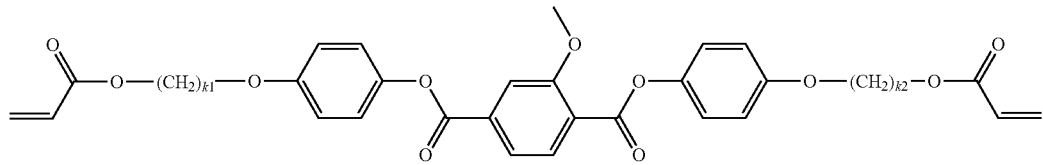
(III-11)
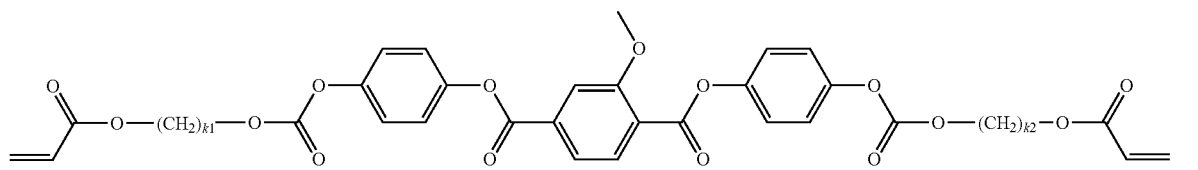
(III-12)
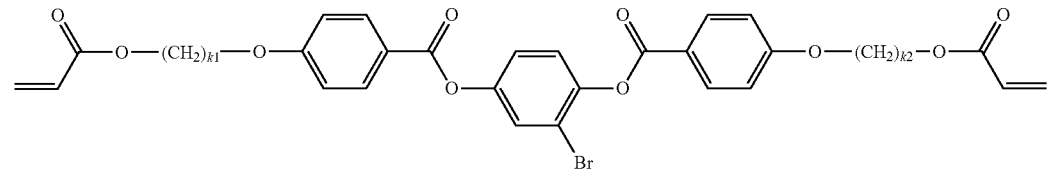
(III-13)
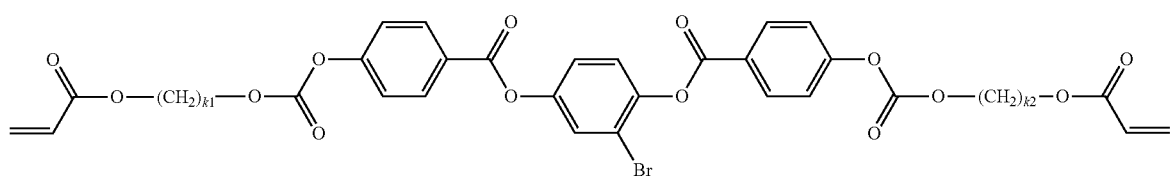
(III-14)
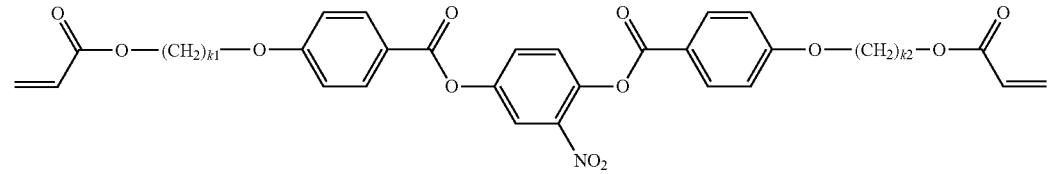
(III-15)
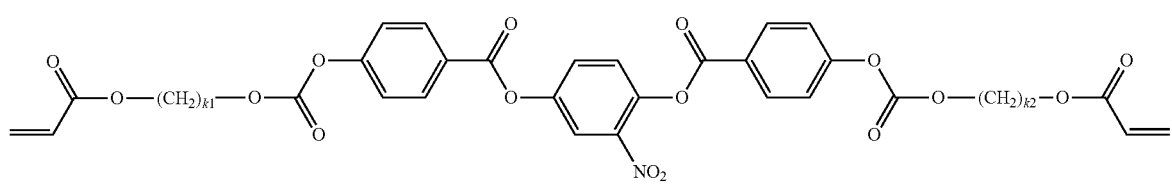
(III-16)
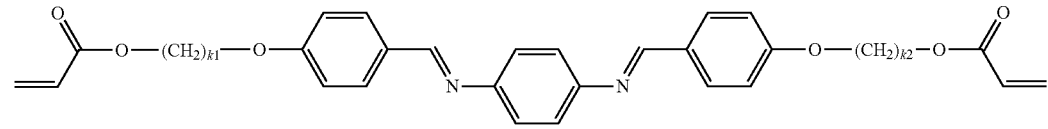
(III-17)
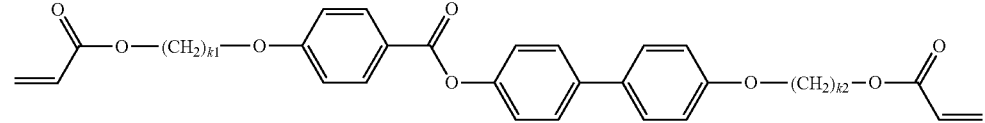
(III-18)
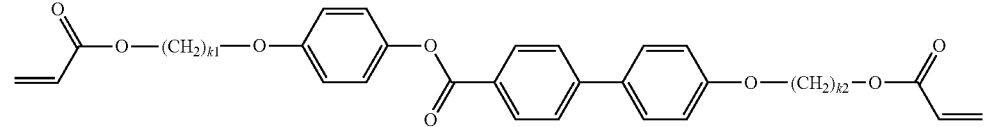
(III-19)

-continued
[Chemical 9]
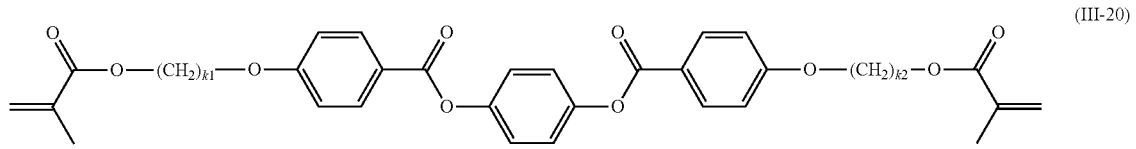
(III-20)
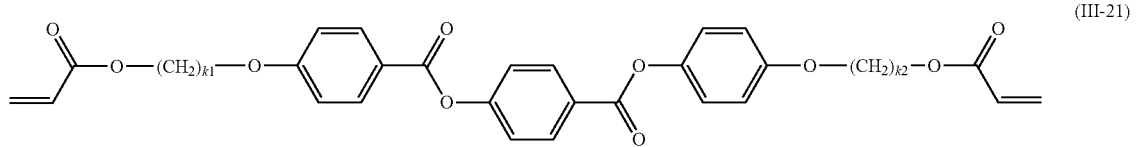
(III-21)
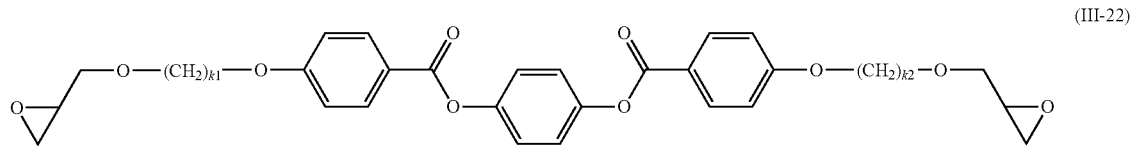
(III-22)
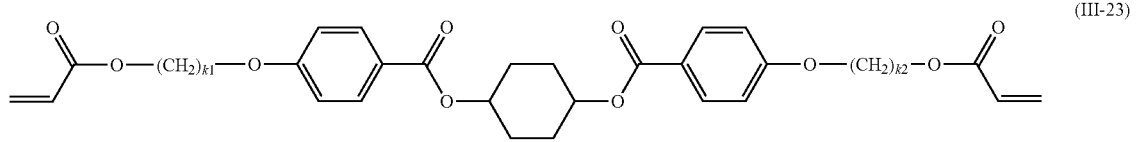
(III-23)
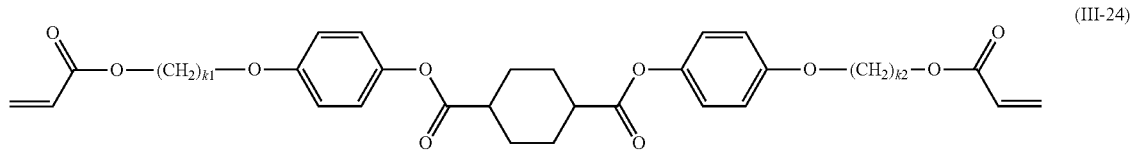
(III-24)
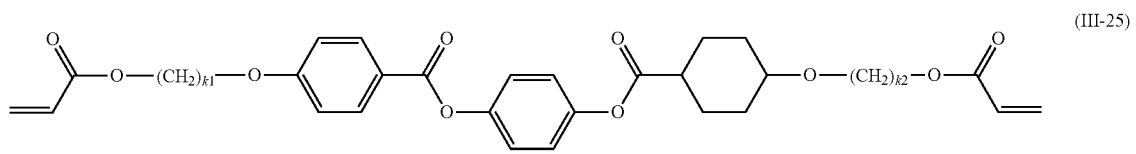
(III-25)
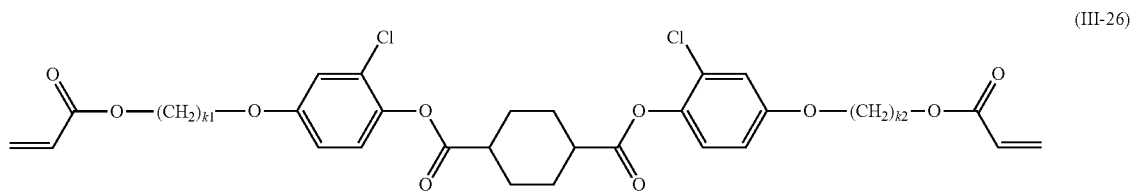
(III-26)
[Chemical 10]
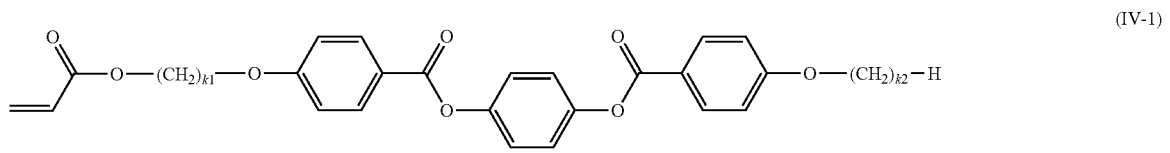
(IV-1)
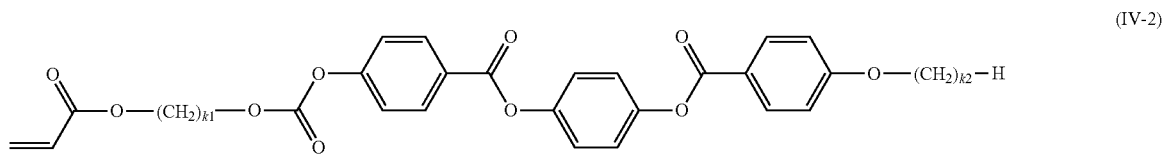
(IV-2)
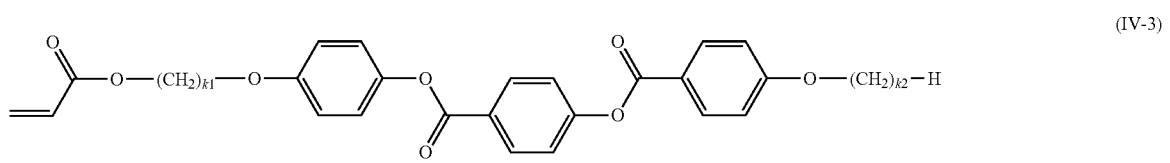
(IV-3)

-continued
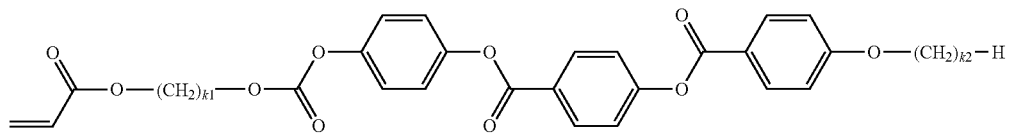
(IV-4)
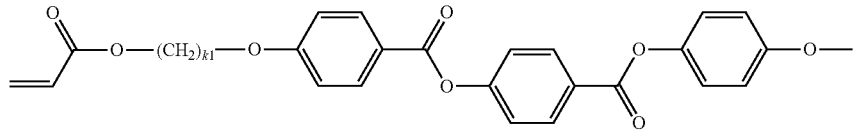
(IV-5)
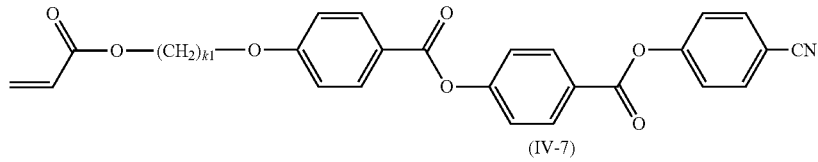
(IV-6)
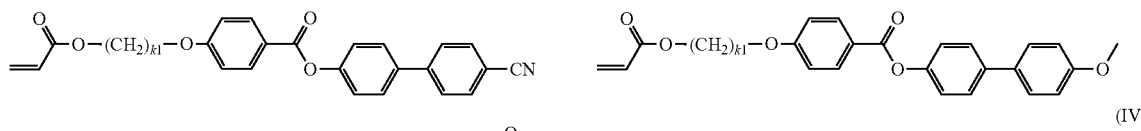
(IV-7) (IV-8)
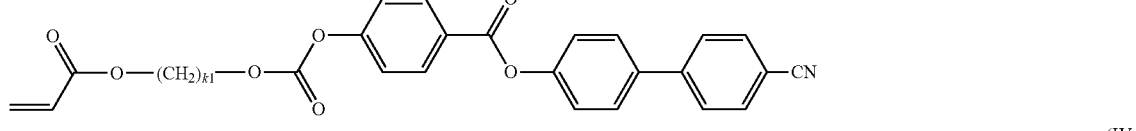
(IV-9)
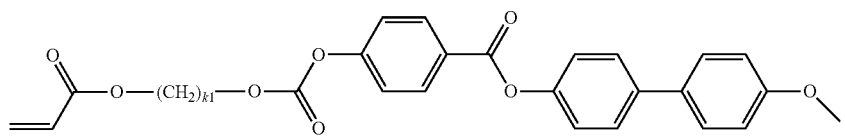
(IV-10)
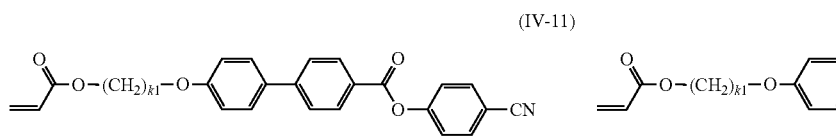
(IV-11) (IV-12)
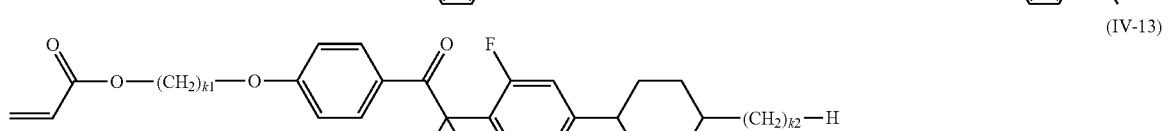
(IV-13)
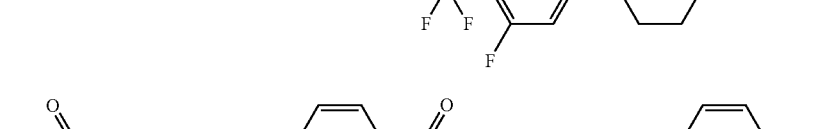
(IV-14)
[Chemical 11]
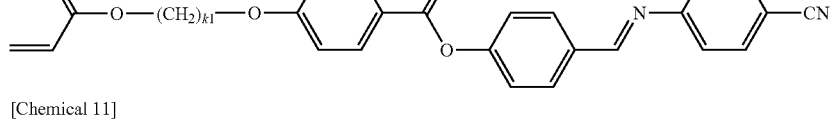
(IV-15)
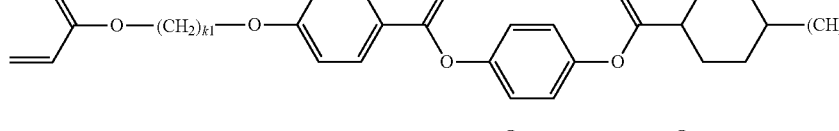
(IV-16)
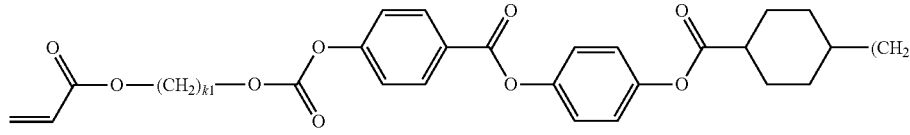

-continued
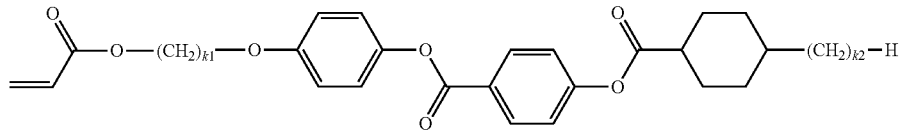 (IV-17)
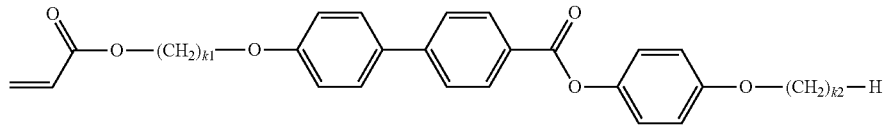 (IV-18)
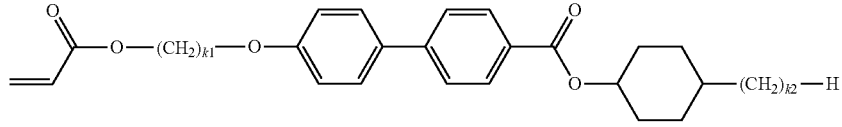 (IV-19)
[Chemical 12]
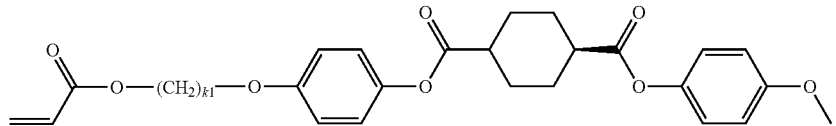 (IV-20)
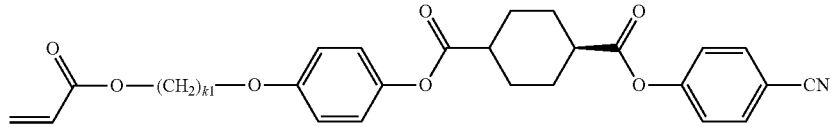 (IV-21)
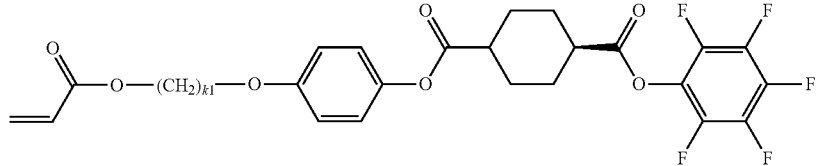 (IV-22)
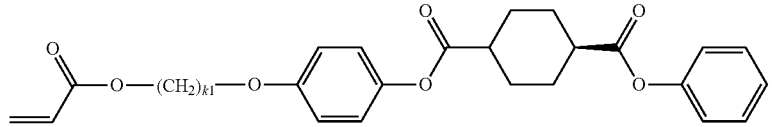 (IV-23)
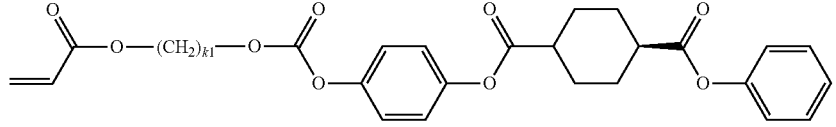 (IV-24)
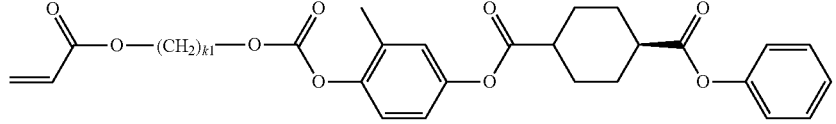 (IV-25)
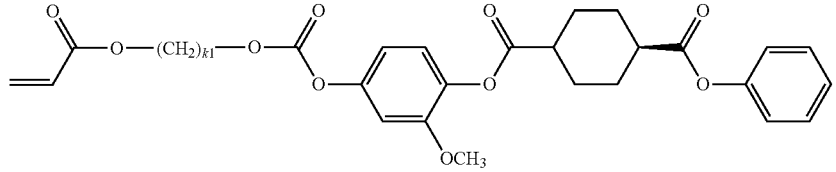 (IV-26)

[Chemical 13]

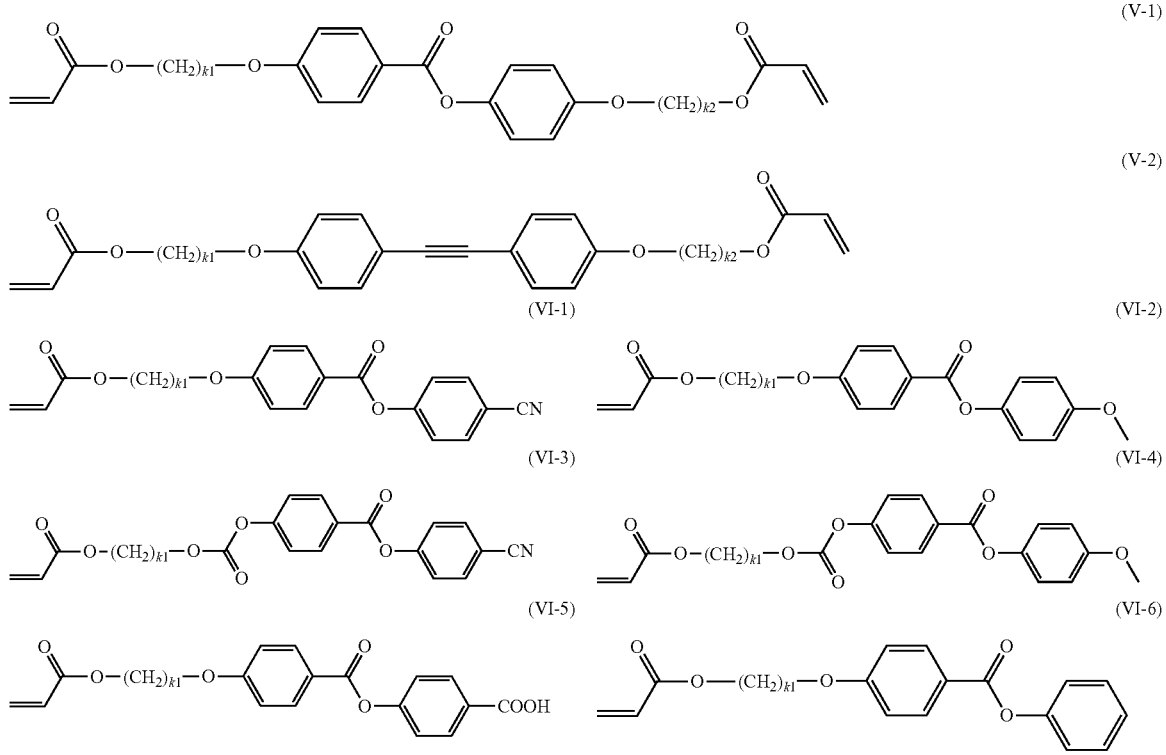

By using a polymerizable liquid crystal compound exhibiting smectic liquid crystallinity, a vertically oriented liquid crystal cured film having a high degree of orientation order can be formed. When a degree of orientation order is high, the value of AxC becomes small and the value of AxC (z=60)/AxC becomes large. When a polymerizable liquid crystal compound exhibiting smectic liquid crystallinity is used as the polymerizable liquid crystal compound that forms the vertically oriented liquid crystal cured film in the present invention, more preferably the polymerizable liquid crystal compound has a high-order smectic phase (high-order smectic liquid crystal state) from the viewpoint of being able to achieve a higher degree of orientation order. Here, the high-order smectic phase means a smectic B phase, smectic D phase, smectic E phase, smectic F phase, smectic G phase, smectic H phase, smectic I phase, smectic J phase, smectic K phase, and smectic L phase. Among them, a smectic B phase, smectic F phase, and smectic I phase are more preferable. The liquid crystallinity may be a thermotropic liquid crystal or a lyotropic liquid crystal, but the thermotropic liquid crystal is preferable because a film thickness can be precisely controlled. In addition, the polymerizable liquid crystal compound exhibiting smectic liquid crystallinity may be a monomer, but may be an oligomer or a polymer in which the polymerizable group is polymerized.

The polymerizable liquid crystal compound exhibiting smectic liquid crystallinity is a liquid crystal compound having at least one polymerizable group, and it is preferable that the polymerizable liquid crystal compound is a liquid crystal compound having two or more polymerizable groups from the viewpoint of improving the heat resistance of the vertically oriented liquid crystal cured film. Examples of the polymerizable group include a (meth)acryloyloxy group, vinyl group, vinyloxy group, 1-chlorovinyl group, isopropenyl group, 4-vinylphenyl group, oxylanyl group, and oxetanyl group. Among them, a (meth)acryloyloxy group is preferably contained because of easiness to manufacture, the heat resistance of the vertically oriented liquid crystal cured film is easily improved, and the adhesion between the vertically oriented liquid crystal cured film and the base material is easily adjusted.

Examples of the polymerizable liquid crystal compound exhibiting smectic liquid crystallinity include compounds represented by the following formula (Z) (hereinafter, may be referred to as a "polymerizable liquid crystal compound (Z)").

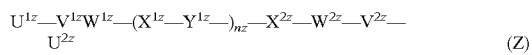

(Z)

[where, $X^{1z}$ and $X^{2z}$ each independently represent a divalent aromatic group or a divalent alicyclic hydrocarbon group, in which: the hydrogen atom contained in the divalent aromatic group or the divalent alicyclic hydrocarbon group may be substituted with a halogen atom, alkyl group having 1 to 4 carbon atoms, fluoroalkyl group having 1 to 4 carbon atoms, alkoxy group having 1 to 4 carbon atoms, cyano group, or nitro group; and the carbon atom forming the divalent aromatic group or the divalent alicyclic hydrocarbon group may be substituted with an oxygen atom, sulfur atom, or nitrogen atom. However, at least one of $X^{1z}$ and $X^{2z}$ is a 1,4-phenylene group that may have a substituent or a cyclohexane-1,4-diyl group that may have a substituent.

$Y^{1z}$ is a single bond or a divalent linking group.

nz is from 1 to 3, and when nz is 2 or more, a plurality of $X^{1z}$s may be the same as or different from each other. $X^{2z}$ may be the same as or different from any or all of the plurality of $X^{1z}$s. When nz is 2 or more, a plurality of $Y^{1z}$s may be the same as or different from each other. It is preferable from the viewpoint of liquid crystallinity that nz is 2 or more.

$U^{1z}$ represents a hydrogen atom or a (meth)acryloyloxy group.

$U^{2z}$ represents a polymerizable group.

$W^{1z}$ and $W^{2z}$ are, each independently, a single bond or a divalent linking group.

$V^{1z}$ and $V^{2z}$ each independently represent an alkanediyl group having 1 to 20 carbon atoms that may have a substituent, and the —$CH_2$— forming the alkanediyl group may be replaced by —O—, —CO—, —S—, or NH—.]

In the polymerizable liquid crystal compound (Z), $X^{1z}$ and $X^{2z}$ are, each independently, preferably a 1,4-phenylene group that may have a substituent or a cyclohexane-1,4-diyl group that may have a substituent. At least one of $X^{1z}$ and $X^{2z}$ is a 1,4-phenylene group that may have a substituent or a cyclohexane-1,4-diyl group that may have a substituent, and it is preferably a trans-cyclohexane-1,4-diyl group. Examples of the substituent that the 1,4-phenylene group that may have a substituent or the cyclohexane-1,4-diyl group that may have a substituent optionally has include: alkyl groups each having 1 to 4 carbon atoms, such as a methyl group, ethyl group, and butyl group; a cyano group; and halogen atoms such as a chlorine atom and fluorine atom. From 0.001 to 0.3 the 1,4-phenylene group and the cyclohexane-1,4-diyl group are unsubstituted.

In addition, it is preferable that in the polymerizable liquid crystal compound (Z), the portion [hereinafter, referred to as a partial structure (Z1)] of the formula (Z), represented by the formula (Z1):

[where, $X^{1z}$, $Y^{1z}$, $X^{2z}$, and nz each have the same meanings as the above.] has an asymmetrical structure, because smectic liquid crystallinity is easily exhibited.

Examples of the polymerizable liquid crystal compound (Z) whose partial structure (Z1) has an asymmetric structure include, for example, a polymerizable liquid crystal compound (Z) in which nz is 1 and one $X^{1z}$ and $X^{2z}$ have different structures from each other. The examples thereof also include: a polymerizable liquid crystal compound (Z) in which nz is 2, two $Y^{1z}$s have the same structure as each other, two $X^{1z}$s have the same structure as each other, and one $X^{2z}$ has a different structure from these two $X^{1z}$s; and a polymerizable liquid crystal compound (Z) in which of two $X^{1z}$s, the $X^{1z}$ bound to $W^{1z}$ has a different structure from the other $X^{1z}$ and $X^{2z}$, and the other $X^{1z}$ and $X^{2z}$ have the same structure as each other. The examples thereof further include a polymerizable liquid crystal compound (Z) in which nz is 3, three $Y^{1z}$s have the same structure as each other, and any one of three $X^{1z}$s and one $X^{2z}$ has a different structure from all of the other three.

$Y^{1z}$ is preferably —$CH_2CH_2$—, —$CH_2O$—, —$CH_2CH_2O$—, —COO—, —OCOO—, single bond, —N=N—, —$CR^{az}$=$CR^{bz}$—, —C≡C—, —$CR^{az}$=N—, or CO—$NR^{az}$—. $R^{az}$ and $R^{bz}$ each independently represent a hydrogen atom or an alkyl group having 1 to 4 carbon atoms. $Y^{1z}$ is more preferably —$CH_2CH_2$—, —COO—, or single bond, and when a plurality of $Y^{1z}$s exist, the $Y^{1z}$ bound to $X^{2z}$ is more preferably —$CH_2CH_2$— or $CH_2O$—. When all of $X^{1z}$ and $X^{2z}$ have the same structure, preferably two or more $Y^{1z}$s having different bonding methods from each other exist. When a plurality of $Y^{1z}$s having different bonding methods from each exist, an asymmetrical structure is formed, so that smectic liquid crystallinity tends to be easily exhibited.

$U^{2z}$ is the above polymerizable group. $U^{1z}$ is a hydrogen atom or a polymerizable group. Preferably the polymerizable group is a (meth)acryloyloxy group because of easy manufacturing, the heat resistance of the vertically oriented liquid crystal cured film is easily improved, and the adhesion between the vertically oriented liquid crystal cured film and the base material is easily adjusted. The polymerizable group may be in a polymerized state or an unpolymerized state, but is preferably in an unpolymerized state.

Examples of the alkanediyl groups represented by $V^{1z}$ and $V^{2z}$ include a methylene group, ethylene group, propane-1,3-diyl group, butane-1,3-diyl group, butane-1,4-diyl group, pentane-1,5-diyl group, hexane-1,6-diyl group, heptane-1,7-diyl group, octane-1,8-diyl group, decane-1,10-diyl group, tetradecane-1,14-diyl group and icosan-1,20-diyl group. $V^{1z}$ and $V^{2z}$ are preferably an alkanediyl group having 2 to 12 carbon atoms, and more preferably an alkanediyl group having 6 to 12 carbon atoms.

Examples of the substituent that the alkanediyl group optionally has include a cyano group, and halogen atoms. The alkanediyl group is preferably unsubstituted, and more preferably an unsubstituted linear alkanediyl group.

$W^{1z}$ and $W^{2z}$ are, each independently, preferably single bond, —O—, —S—, —COO—, or OCOO—, and more preferably single bond or O—.

The polymerizable liquid crystal compound (Z) preferably has an asymmetric molecular structure in its molecular structure, and specifically, it is more preferably a polymerizable liquid crystal compound having partial structures represented by the following (A-a) to (A-i). From the viewpoint of easily exhibiting high-order smectic liquid crystallinity, it is more preferable to have the partial structure represented by (A-a), (A-b), or (A-c). In the following (A-a) to (A-i), * represents a bond (single bond).

[Chemical 14]

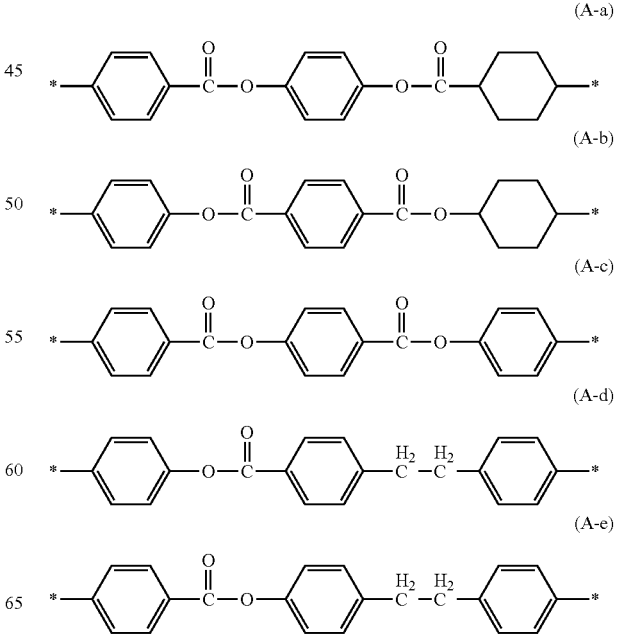

(A-f)
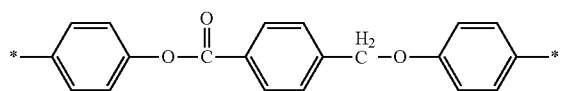
(A-h)
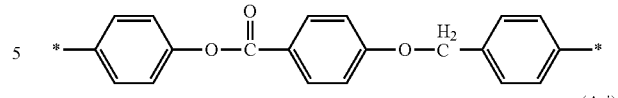
(A-i)
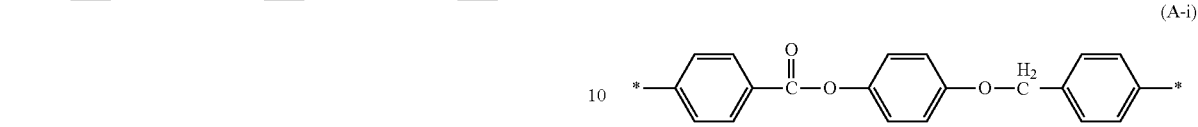
(A-g)
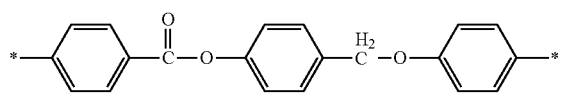
Specific examples of the polymerizable liquid crystal compound (Z) include, for example, compounds represented by formulae (A-1) to (A-25). When the polymerizable liquid crystal compound (Z) has a cyclohexane-1,4-diyl group, it is preferable that the cyclohexane-1,4-diyl group has a trans-form.
[Chemical 15]
(A-1)
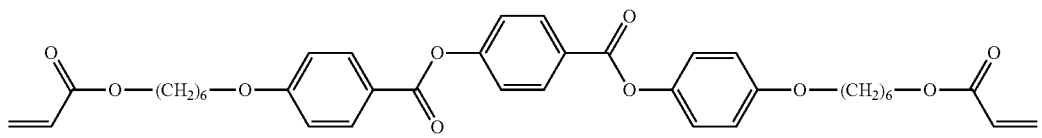
(A-2)
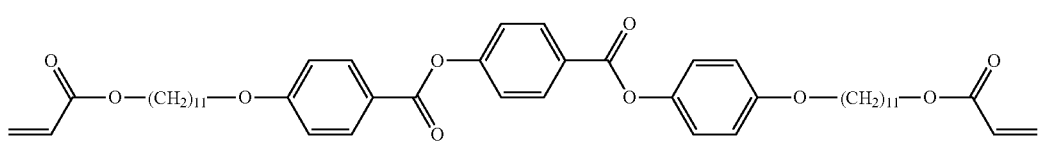
(A-3)
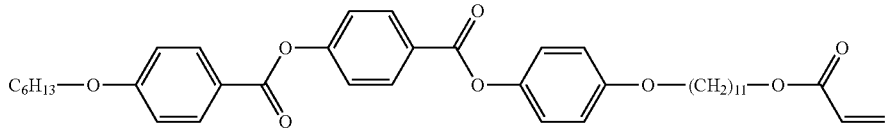
(A-4)
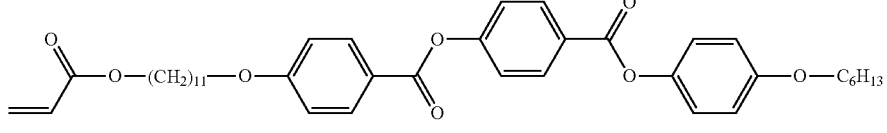
(A-5)
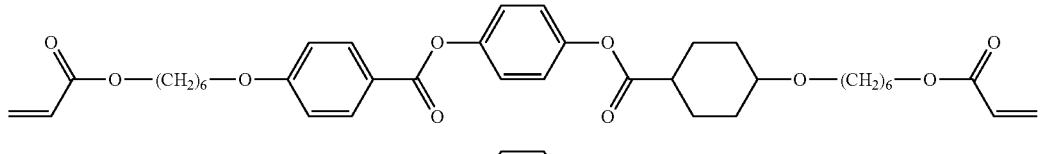
(A-6)
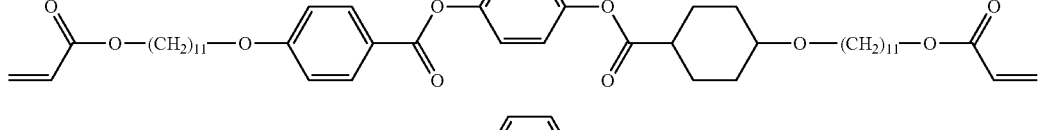
(A7)
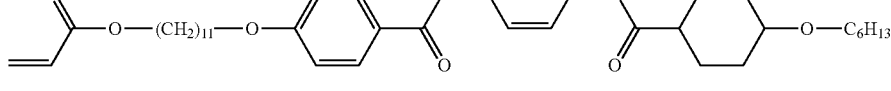
(A-8)
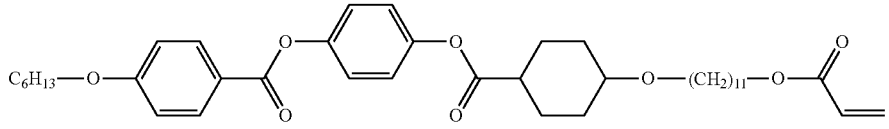

-continued
[Chemical 16]
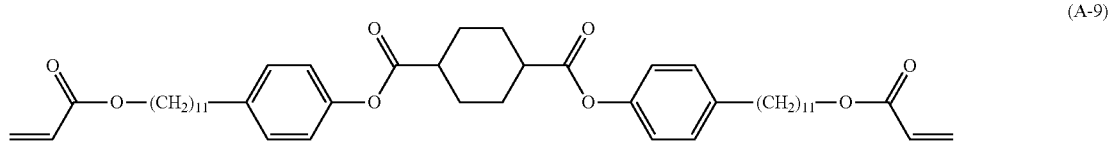
(A-9)
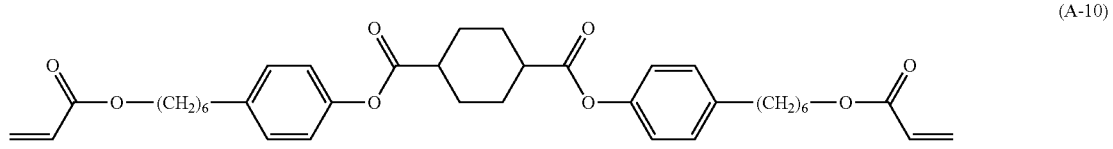
(A-10)
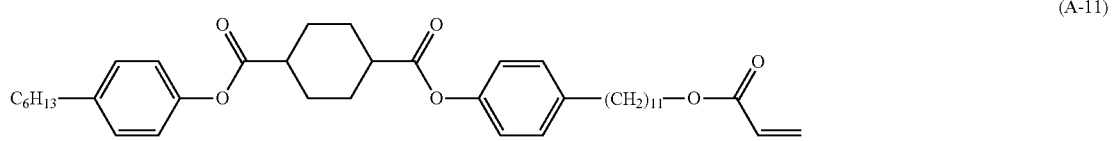
(A-11)
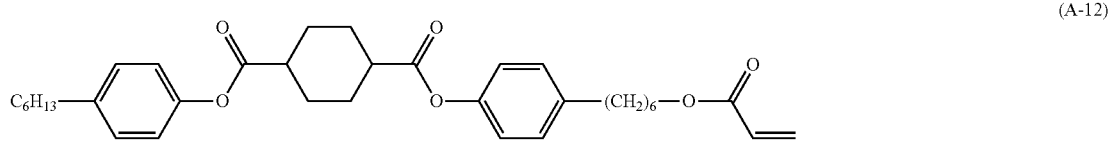
(A-12)
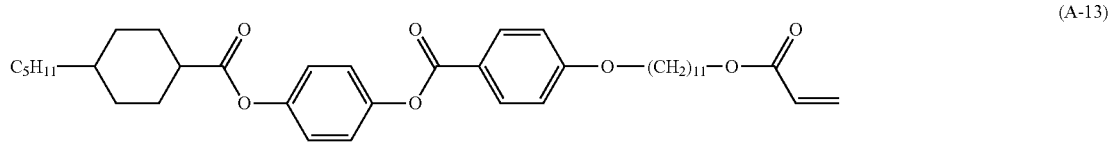
(A-13)
[Chemical 17]
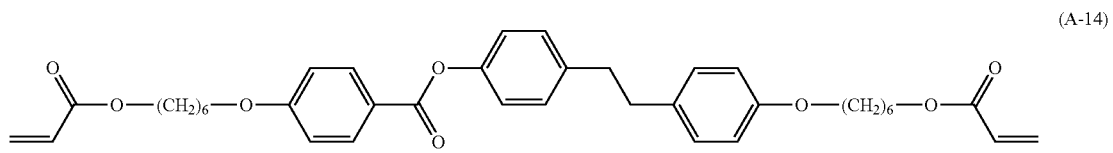
(A-14)
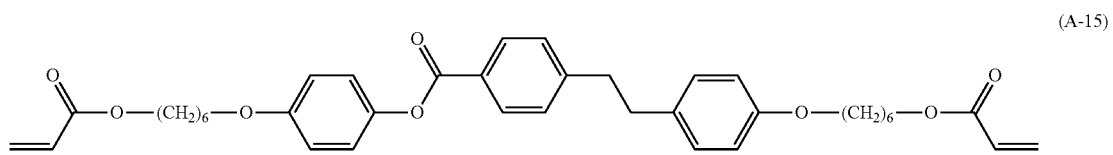
(A-15)
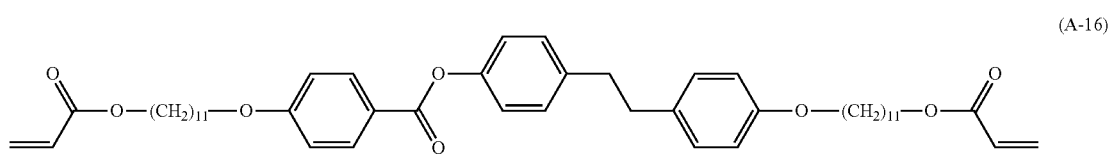
(A-16)
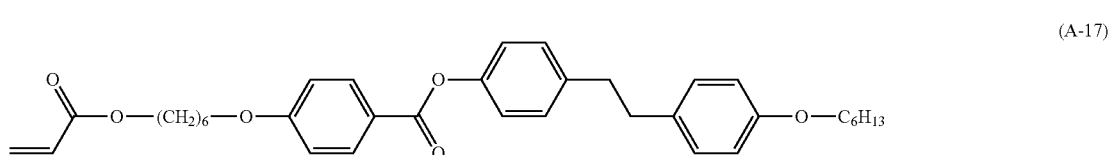
(A-17)
[Chemical 18]
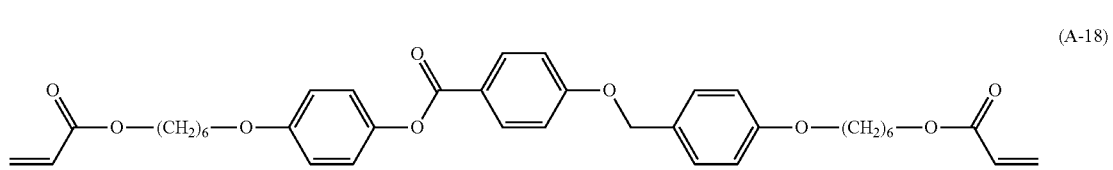
(A-18)

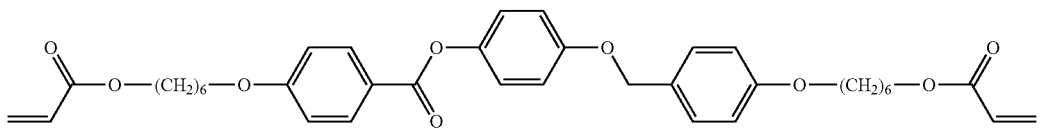
(A-19)

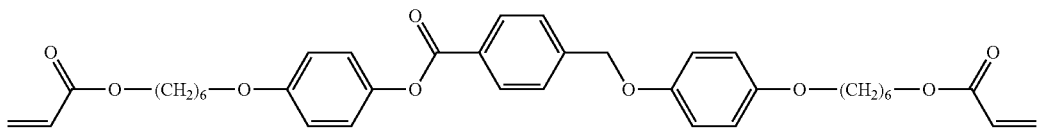
(A-20)

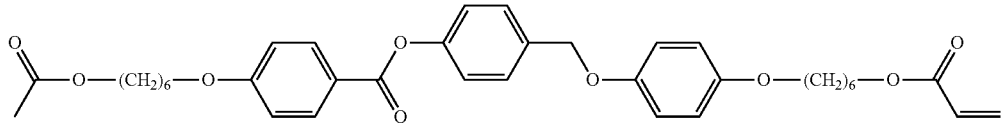
(A-21)

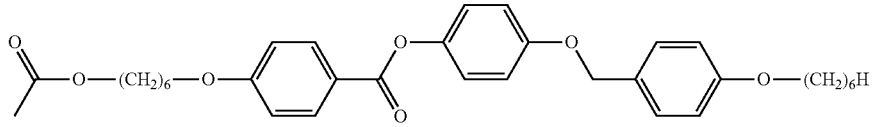
(A-22)

[Chemical 19]

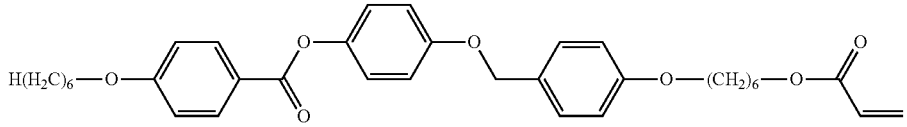
(A-23)

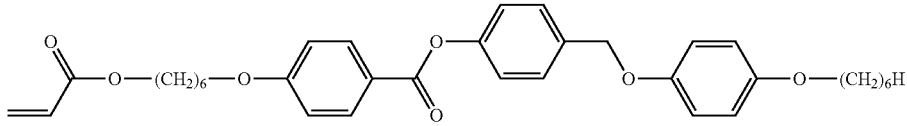
(A-24)

(A-25)

Among them, at least one type, selected from the group consisting of compounds represented by the formula (A-2), formula (A-3), formula (A-4), formula (A-5), formula (A-6), formula (A-7), formula (A-8), formula (A-13), formula (A-14), formula (A-15), formula (A-16), and formula (A-17), is preferable. As the polymerizable liquid crystal compound (Z), one type may be used alone, or two or more types may be used in combination.

The polymerizable liquid crystal compound (Z) can be manufactured by a known method described in, for example, Lub et al., Recl. Tray. Chim. Pays-Bas, 115, 321-328(1996), or JP-B2-4719156.

The polymerizable liquid crystal compound that forms the vertically oriented liquid crystal cured film is preferably a polymerizable liquid crystal compound having a maximum absorption wavelength between a wavelength of 300 nm and a wavelength of 400 nm. When the polymerizable liquid crystal composition contains a photopolymerization initiator, there is a risk that the polymerization reaction and gelation of the polymerizable liquid crystal compound may proceed during long-term storage. However, when the maximum absorption wavelength of the polymerizable liquid crystal compound is between 300 nm and 400 nm, the generation of a reaction active species from the photopolymerization initiator and the progress of the polymerization reaction and gelation of the polymerizable liquid crystal compound, due to the reaction active species, can be effectively suppressed even if exposed to ultraviolet rays during storage. Therefore, it is advantageous in terms of long-term stability of the polymerizable liquid crystal composition, and the orientation and uniformity in film thickness of the obtained liquid crystal cured film can be improved. The maximum absorption wavelength of the polymerizable liquid crystal compound can be measured in a solvent using an ultraviolet-visible spectrophotometer. The solvent is a solvent capable of dissolving the polymerizable liquid crystal compound, and examples thereof include, for example, chloroform, etc.

The content of the polymerizable liquid crystal compound in the polymerizable liquid crystal composition that forms the vertically oriented liquid crystal cured film is, for example, 70 to 99.5 parts by mass, preferably 80 to 99 parts by mass, more preferably 85 to 98 parts by mass, and even more preferably 90 to 95 parts by mass, based on 100 parts by mass of the solid content of the polymerizable liquid crystal composition. When the content of the polymerizable liquid crystal compound is within the above range, it is advantageous from the viewpoint of the orientation of the obtained liquid crystal cured film. In the present description, the solid content of the polymerizable liquid crystal composition means all the components obtained by excluding volatile components such as an organic solvent from the polymerizable liquid crystal composition.

The vertically oriented liquid crystal cured film contains at least one type of dichroic coloring matter having maximum absorption between a wavelength of 400 nm and a wavelength of 750 nm. The dichroic coloring matter means a coloring matter having a property in which the absorbance in the major axis direction of the molecule and the absorbance in the minor axis direction are different. As long as having such a property, the dichroic coloring matter may be a dye or a pigment, or a combination of two or more dyes may be used, a combination or two or more pigments may be used, or a combination of a dye and a pigment may be used.

When the vertically oriented liquid crystal cured film contains at least one type of dichroic coloring matter having maximum absorption between a wavelength of 400 nm and a wavelength of 750 nm, an effect of suppressing a change in the oblique hue during the display of white can be obtained when the vertically oriented liquid crystal cured film is applied to an organic EL display device. That is, a change in the oblique hue can be effectively suppressed by the vertically oriented liquid crystal cured film containing at least one type of dichroic coloring matter having light absorption capable of canceling the coloring when the organic EL display device is viewed from an oblique direction.

By adjusting the maximum absorption wavelength between 400 nm and 750 nm such that the transmitted hue of the vertically oriented liquid crystal cured film, when viewed from, for example, a 45° oblique direction, is in a complementary color relationship with the hue, at an angle of 45°, of the organic EL display during the emission of white (during the display of white), the hue of the display, possibly occurring when the organic EL display device is viewed from an oblique direction, can be cancelled, and a change in the oblique hue can be suppressed without affecting the hue in the front direction during the display of white.

Examples of the dichroic coloring matter having a maximum absorption wavelength ($\lambda_{MAX}$) in the range of a wavelength of 400 nm to a wavelength of 750 nm include, for example, an acridine coloring matter, oxazine coloring matter, cyanine coloring matter, naphthalene coloring matter, azo coloring matter, anthraquinone coloring matter, etc. Among them, an azo coloring matter is preferable. In addition, the dichroic coloring matter may exhibit liquid crystallinity.

Examples of an azo coloring matter include a monoazo coloring matter, bisazo coloring matter, trisazo coloring matter, tetrakisazo coloring matter, stilbene azo coloring matter, etc. A bisazo coloring matter and a trisazo coloring matter are preferable, and for example, a compound represented by the formula (I) (hereinafter, also referred to as a "compound (I)) is mentioned.

$$K^1(-N=N-K^2)_p-N=N-K^3 \quad (I)$$

[where, $K^1$ and $K^3$ each independently represent a phenyl group that may have a substituent, a naphthyl group that may have a substituent, or a monovalent heterocyclic group that may have a substituent. $K^2$ represents a p-phenylene group that may have a substituent, a naphthalene-1,4-diyl group that may have a substituent, or a divalent heterocyclic group that may have a substituent.

p represents an integer from 1 to 4. When p is an integer more than or equal to 2, a plurality of $K^2$s may be the same as or different from each other. The —N=N— bond may be replaced with —C=C—, —COO—, —NHCO—, or —N=CH— bond within a range where absorption is exhibited in the visible region.]

Examples of the monovalent heterocyclic group include groups obtained by removing one hydrogen atom from heterocyclic compounds such as, for example, quinoline, thiazole, benzothiazole, thienothiazole, imidazole, benzimidazole, oxazole, and benzoxazole. Examples of the divalent heterocyclic group include groups obtained by removing two hydrogen atoms from the heterocyclic compounds.

Examples of the substituent that the phenyl group, naphthyl group, and monovalent heterocyclic group in $K^1$ and $K^3$, and the p-phenylene group, naphthalene-1,4-diyl group, and divalent heterocyclic group in $K^2$ optionally have include: an alkyl group having 1 to 20 carbon atoms, an alkyl group having a polymerizable group and having 1 to 20 carbon atoms, an alkenyl group having 1 to 4 carbon atoms; alkoxy groups having 1 to 20 carbon atoms, such as a methoxy group, ethoxy group, and butoxy group; an alkoxy group having a polymerizable group and having 1 to 20 carbon atoms; alkyl fluoride groups having 1 to 4 carbon atoms, such as a trifluoromethyl group; a cyano group; a nitro group; a halogen atom; substituted or unsubstituted amino groups such as an amino group, diethylamino group, and pyrrolidino group (the substituted amino group means an amino group having one or two alkyl groups having 1 to 6 carbon atoms, an amino group having one or two alkyl groups having a polymerizable group and having 1 to 6 carbon atoms, or an amino group in which two substituted alkyl groups are bound to each other to form an alkanediyl group having 2 to 8 carbon atoms. The unsubstituted amino group is —NH$_2$). Here, examples of the polymerizable group include an acryloyl group, methacryloyl group, acryloyloxy group, and methacryloyloxy group.

Among the compounds (I), a compound represented by any one of the following formulae (I-1) to (I-8) is preferable, a compound represented by any one of the formula (I-2), formula (I-3), formula (I-7), and formula (I-8) is more preferable, and a compound represented by any one of the formula (I-3), formula (I-7), and formula (I-8) is even more preferable.

[Chemical 20]

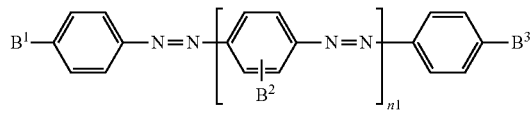

(I-1)

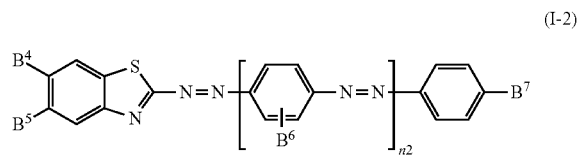

(I-2)

-continued (I-3)

(I-4)

(I-5)

(I-6)

(I-7)

(I-8)

[In the formulae (I-1) to (I-8),
$B^1$ to $B^{30}$ each independently represent a hydrogen atom, alkyl group having 1 to 6 carbon atoms, alkenyl group having 1 to 6 carbon atoms, alkoxy group having 1 to 4 carbon atoms, cyano group, nitro group, substituted or unsubstituted amino group (the substituted amino group and unsubstituted amino group are defined as described above), chlorine atom, or trifluoromethyl group.

n1 to n4 each independently represent an integer from 0 to 3.

When n1 is 2 or more, a plurality of $B^2$s may be the same as or different from each other.

When n2 is 2 or more, a plurality of $B^6$s may be the same as or different from each other.

When n3 is 2 or more, a plurality of may be the same as or different from each other.

When n4 is 2 or more, a plurality of $B^{14}$s may be the same as or different from each other].

Preferably, the anthraquinone coloring matter is a compound represented by the formula (I-9).

[Chemical 21]

(I-9)

[In the formula (I-9),
$R^1$ to $R^8$ each independently represent a hydrogen atom, $-R^x$, $-NH_2$, $-NHR^x$, $-NR^x_2$, $-SR^x$, or halogen atom.

$R^x$ represents an alkyl group having 1 to 4 carbon atoms or an aryl group having 6 to 12 carbon atoms.]

Preferably, the oxazone coloring matter is a compound represented by the formula (I-10).

[Chemical 22]

(I-10)

[In the formula (I-10),
$R^9$ to $R^{15}$ each independently represent a hydrogen atom, $-R^x$, $-NH_2$, $-NHR^x$, $-NR^x_2$, $-SR^x$, or halogen atom.

$R^x$ represents an alkyl group having 1 to 4 carbon atoms or an aryl group having 6 to 12 carbon atoms.]

Preferably, the acridine coloring matter is a compound represented by the formula (I-11).

[Chemical 23]

(I-11)

[In the formula (I-11),

R$^{16}$ to R$^{23}$ each independently represent a hydrogen atom, —R$^x$, —NH$_2$, —NHR$^x_2$, —SR$^x$, or halogen atom.

R$^x$ represents an alkyl group having 1 to 4 carbon atoms or an aryl group having 6 to 12 carbon atoms.]

Examples of the alkyl groups having 1 to 6 carbon atoms represented by R$^x$ in the formula (I-9), formula (I-10), and formula (I-11) include a methyl group, ethyl group, propyl group, butyl group, pentyl group, hexyl group, etc. Examples of the aryl groups having 6 to 12 carbon atoms include a phenyl group, tolyl group, xylyl group, naphthyl group, etc.

As the cyanine coloring matter, a compound represented by the formula (I-12) and a compound represented by the formula (I-13) are preferable.

[Chemical 24]

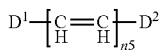

(I-12)

[In the formula (I-12),

D$^1$ and D$^2$ each independently represent a group represented by any one of the formulae (I-12a) to (I-12d).

[Chemical 25]

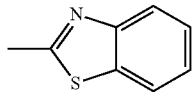

(I-12a)

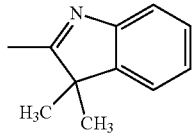

(I-12b)

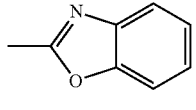

(I-12c)

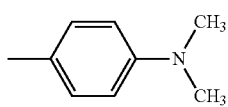

(I-12d)

n5 represents an integer from 1 to 3.]

[Chemical 26]

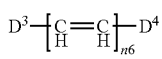

(I-13)

[In the formula (I-13),

D$^3$ and D$^4$ each independently represent a group represented by any one of the formulae (I-13a) to (I-13h).

[Chemical 27]

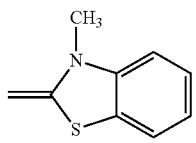

(I-13a)

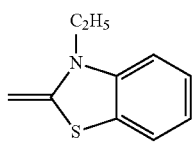

(I-13b)

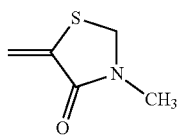

(I-13c)

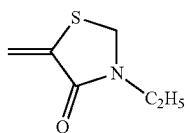

(I-13d)

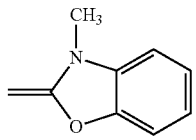

(I-13e)

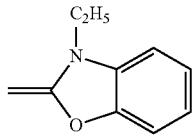

(I-13f)

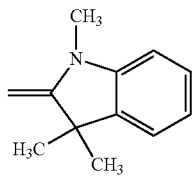

(I-13g)

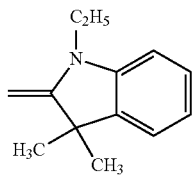

(I-13h)

n6 represents an integer from 1 to 3.]

From the viewpoint of orientation, preferably the vertically oriented liquid crystal cured film contains, among these dichroic coloring matters, at least one type of azo coloring matter as the dichroic coloring matter.

In the present invention, the weight average molecular weight of the dichroic coloring matter is usually 300 to 2000, and preferably 400 to 1000.

As described above, in order to make an organic EL display device excellent in the effect of suppressing the difference between the front hue and the oblique hue during the display of white, it is preferable that the vertically oriented liquid crystal cured film satisfies either the following condition (6) or (7):

(6) having maximum absorption from a wavelength of 400 nm to a wavelength of less than 550 nm, and no maximum absorption between a wavelength of 550 nm and a wavelength of 700 nm;

(7) having maximum absorption between a wavelength of 550 nm and a wavelength of 700 nm, and no maximum absorption from a wavelength of 400 nm to a wavelength of less than 550 nm.

As described above, examples of the dichroic coloring matter to be added include an acridine coloring matter, oxazine coloring matter, cyanine coloring matter, naphthalene coloring matter, azo coloring matter, and anthraquinone coloring matter. From the viewpoint of orientation, an azo coloring matter is preferably selected.

The content of the dichroic coloring matter in the polymerizable liquid crystal composition that forms the vertically oriented liquid crystal cured film can be appropriately determined depending on the type, etc., of the dichroic coloring matter to be used, but it is preferably 0.1 to 20 parts by mass, more preferably 0.1 to 10 parts by mass, and even more preferably 0.1 to 5 parts by mass, based on 100 parts by mass of the polymerizable liquid crystal compound. When the content of the dichroic coloring matter is within the above range, the effect of suppressing a change in the oblique hue during the display of white can be easily exerted without excess or deficiency, and three-dimensional refractive index control, in which a hue change during the display of black can be suppressed, can be performed. In addition, a liquid crystal cured film, in which the orientation of the polymerizable liquid crystal compound is not easily disturbed and which has a high degree of orientation order, can be obtained.

The polymerizable liquid crystal composition to be used for forming the vertically oriented liquid crystal cured film may further contain additives such as a solvent, photopolymerization initiator, leveling agent, antioxidant, photosensitizer in addition to the polymerizable liquid crystal compound and the dichroic coloring matter. Each of these components may be used alone or in combination of two or more.

Since the polymerizable liquid crystal composition for forming the vertically oriented liquid crystal cured film is usually coated on the base material, etc., in the state of being dissolved in a solvent, it is preferable to contain a solvent. As the solvent, a solvent capable of dissolving the polymerizable liquid crystal compound is preferable, and a solvent that is inert to the polymerization reaction of the polymerizable liquid crystal compound is preferable. Examples of the solvent include, for example: water; alcohol solvents such as methanol, ethanol, ethylene glycol, isopropyl alcohol, propylene glycol, ethylene glycol methyl ether, ethylene glycol butyl ether, 1-methoxy-2-propanol, 2-butoxyethanol, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; alicyclic hydrocarbon solvents such as ethylcyclohexane; aromatic hydrocarbon solvents such as toluene and xylene; nitrile solvents such as acetonitrile; ether solvents such as tetrahydrofuran and dimethoxyethane; chlorine-containing solvents such as chloroform and chlorobenzene; amide-based solvents such as dimethylacetamide, dimethylformamide, N-methyl-2-pyrrolidone (NMP), and 1,3-dimethyl-2-imidazolidinone; and the like.

These solvents can be used alone or in combination of two or more. Among them, alcohol solvents, ester solvents, ketone solvents, chlorine-containing solvents, amide-based solvents, and aromatic hydrocarbon solvents are preferable.

The content of the solvent in the polymerizable liquid crystal composition is preferably 50 to 98 parts by mass, and more preferably 70 to 95 parts by mass, based on 100 parts by mass of the polymerizable liquid crystal composition. Therefore, the solid content in 100 parts by mass of the polymerizable liquid crystal composition is preferably 2 to 50 parts by mass. When the solid content is 50 parts by mass or less, the viscosity of the polymerizable liquid crystal composition is low, so that the thickness of the film becomes substantially uniform, and unevenness tends to be less likely to occur. The solid content can be appropriately determined in consideration of the thickness of the liquid crystal cured film to be manufactured.

The polymerization initiator is a compound that can generate a reaction active species by the contribution of heat or light and initiate the polymerization reaction of a polymerizable liquid crystal compound, etc. Examples of the reaction active species include active species such as radicals, cations, or anions. Among them, a photopolymerization initiator that generates radicals by light irradiation is preferable from the viewpoint of easy reaction control.

Examples of the photopolymerization initiator include, for example, benzoin compounds, benzophenone compounds, benzyl ketal compounds, α-hydroxyketone compounds, α-aminoketone compounds, oxime compounds, triazine compounds, iodonium salts, and sulfonium salts. Specific examples thereof include Irgacure (registered trademark) 907, Irgacure 184, Irgacure 651, Irgacure 819, Irgacure 250, Irgacure 369, Irgacure 379, Irgacure 127, Irgacure 2959, Irgacure 754, Irgacure 379EG (all manufactured by BASF Japan Co., Ltd.), SEIKUOL BZ, SEIKUOL Z, SEIKUOL BEE (all manufactured by Seiko Chemical Co., Ltd.), Kayacure BP100 (manufactured by Nippon Kayaku Co., Ltd.), Kayacure UVI-6992 (manufactured by Dow), ADEKA OPTOMER SP-152, ADEKA OPTOMER SP-170, ADEKA OPTOMER N-1717, ADEKA OPTOMER N-1919, ADEKA ARKLS NCI-831, ADEKA ARKLS NCI-930 (all manufactured by ADEKA CORPORATION), TAZ-A, TAZ-PP (all manufactured by Nihon Siber Hegner K.K.), and TAZ-104 (manufactured by Sanwa Chemical Co., Ltd.).

The photopolymerization initiator has a maximum absorption wavelength preferably between 300 nm and 400 nm, and more preferably between 300 nm and 380 nm because in that case, the photopolymerization initiator can fully utilize the energy emitted from a light source and is excellent in productivity. Among them, an α-acetophenone-based polymerization initiator and an oxime-based photopolymerization initiator are preferable.

Examples of α-acetophenone compounds include 2-methyl-2-morpholino-1-(4-methylsulfanylphenyl)propan-1-one, 2-dimethylamino-1-(4-morpholinophenyl)-2-benzylbutane-1-one, and 2-dimethylamino-1-(4-morpholinophenyl)-2-(4-methylphenylmethyl)butane-1-one, etc. More preferred examples include 2-methyl-2-morpholino-1-(4-methylsulfanylphenyl)propan-1-one and 2-dimethylamino-1-(4-morpholinophenyl)-2-benzylbutane-1-one. Examples of commercially available α-acetophenone compounds include Irgacure 369, 379EG, 907 (all manufactured by BASF Japan Co., Ltd.) and SEIKUOL BEE (manufactured by Seiko Chemical Co., Ltd.).

Oxime-based photopolymerization initiators generate radicals such as phenyl radicals and methyl radicals when irradiated with light. The polymerization of the polymerizable liquid crystal compound proceeds suitably by these radicals. Among them, the oxime-based photopolymerization initiator that generates methyl radicals is preferable in that the initiation efficiency of a polymerization reaction is high. In addition, from the viewpoint of allowing the polymerization reaction to proceed more efficiently, a photopolymerization initiator capable of efficiently utilizing ultraviolet rays having a wavelength of 350 nm or more is preferably used. As the photopolymerization initiator capable of efficiently utilizing ultraviolet rays having a wavelength of 350 nm or more, a triazine compound or carbazole compound containing an oxime structure is preferred, and a carbazole compound containing an oxime ester structure is more preferable from the viewpoint of sensitivity. Examples of the carbazole compound containing an oxime structure include 1,2-octanedione, 1-[4-(phenylthio)-2-(o-benzoyloxime)], ethanone, and 1-[9-ethyl-6-(2-methylbenzoyl)-9H-carbazole-3-yl]-1-(o-acetyloxime).

Examples of commercially available oxime ester-based photopolymerization initiators include Irgacure OXE-01, Irgacure OXE-02, Irgacure OXE-03 (all manufactured by BASF Japan Co., Ltd.), ADEKA OPTOMER N-1919, and ADEKA ARKLS NCI-831 (all manufactured by ADEKA CORPORATION).

The content of the photopolymerization initiator is usually 0.1 to 30 parts by mass, preferably 1 to 20 parts by mass, and more preferably 1 to 15 parts by mass, based on 100 parts by mass of the polymerizable liquid crystal compound. Within the above range, the reaction of the polymerizable group proceeds sufficiently, and the orientation of the polymerizable liquid crystal compound is not easily disturbed.

The leveling agent is an additive having functions of adjusting the fluidity of the polymerizable liquid crystal composition and making a coating film obtained by coating the composition flatter. Examples thereof include, for example, silicone-based leveling agents, polyacrylate-based leveling agents, and perfluoroalkyl-based leveling agents. As the leveling agent, commercially available products may be used. Specific examples include DC3PA, SH7PA, DC11PA, SH28PA, SH29PA, SH30PA, ST80PA, ST86PA, SH8400, SH8700, FZ2123 (all manufactured by Toray Dow Corning Co., Ltd.), KP321, KP323, KP324, KP326, KP340, KP341, X22-161A, KF6001 (all manufactured by Shin-Etsu Chemical Co., Ltd.), TSF400, TSF401, TSF410, TSF4300, TSF4440, TSF4445, TSF-4446, TSF4452, TSF4460 (all manufactured by Momentive Performance Materials Japan LLC), Fluorinert (registered trademark) FC-72, Fluorinert FC-40, Fluorinert FC-43, Fluorinert FC-3283 (all manufactured by Sumitomo 3M Co., Ltd.), MEGAFACE (registered trademark) R-08, MEGAFACE R-30, MEGAFACE R-90, MEGAFACE F-410, MEGAFACE F-411, MEGAFACE F-443, MEGAFACE F-445, MEGAFACE F-470, MEGAFACE F-477, MEGAFACE F-479, MEGAFACE F-482, MEGAFACE F-483, MEGAFACE F-556 (all manufactured by DIC Co., Ltd.), F-Top (product name) EF301, F-Top EF303, F-Top EF351, F-Top EF352 (all manufactured by Mitsubishi Materials Electronic Chemicals Co., Ltd.), Surflon (registered trademark) S-381, Surflon S-382, Surflon S-383, Surflon S-393, Surflon SC-101, Surflon SC-105, KH-40, SA-100 (all manufactured by AGC Seimi Chemical Co., Ltd.), product name E1830, product name E5844 (manufactured by Daikin Fine Chemical Laboratory Co., Ltd.), BM-1000, BM-1100, BYK-352, BYK-353, BYK-361N (all are product names: manufactured by BM Chemie), etc. The leveling agent can be used alone or in combination of two or more.

The content of the leveling agent is preferably 0.01 to 5 parts by mass, and more preferably 0.05 to 3 parts by mass, based on 100 parts by mass of the polymerizable liquid crystal compound. When the content of the leveling agent is within the above range, the polymerizable liquid crystal compound can be easily oriented and the obtained liquid crystal cured film tends to become smoother, which is preferable.

By blending an antioxidant, the polymerization reaction of the polymerizable liquid crystal compound can be controlled. The antioxidant may be a primary antioxidant selected from phenol-based antioxidants, amine-based antioxidants, quinone-based antioxidants, and nitroso-based antioxidants, or may be a secondary antioxidant selected from phosphorus-based antioxidants and sulfur-based antioxidants.

In order to polymerize the polymerizable liquid crystal compound without disturbing the orientation of the polymerizable liquid crystal compound, the content of the antioxidant is usually 0.01 to 10 parts by mass, preferably 0.1 to 5 parts by mass, and more preferably 0.1 to 3 parts by mass, based on 100 parts by mass of the polymerizable liquid crystal compound.

The antioxidant can be used alone or in combination of two or more.

In addition, the sensitivity of the photopolymerization initiator can be increased by using a photosensitizer. Examples of the photosensitizer include, for example: xanthones such as xanthone and thioxanthone; anthracenes having a substituent, such as anthracene and alkyl ether; phenothiazine; and rubrene. The photosensitizer can be used alone or in combination of two or more. The content of the photosensitizer is usually 0.01 to 10 parts by mass, preferably 0.05 to 5 parts by mass, and more preferably 0.1 to 3 parts by mass, based on 100 parts by mass of the polymerizable liquid crystal compound.

The polymerizable liquid crystal composition can be obtained by stirring, at a predetermined temperature, the polymerizable liquid crystal compound and the dichroic coloring matter and components other than the polymerizable liquid crystal compound and the dichroic coloring matter, such as the solvent and the photopolymerization initiator.

The vertically oriented liquid crystal cured film can be manufactured by a method including, for example:

a step of forming a coating film of the polymerizable liquid crystal composition for forming the vertically oriented liquid crystal cured film;

a step of drying the coating film to form a dried coating film; and a step of irradiating the dried coating film with active energy rays to form the vertically oriented liquid crystal cured film.

The coating film of the polymerizable liquid crystal composition for forming the vertically oriented liquid crystal cured film is formed by, for example, coating the polymerizable liquid crystal composition on a base material, an orientation film, and a horizontally oriented liquid crystal cured film described later.

Examples of the base material include a glass base material and a film base material, but a resin film base material is preferable from the viewpoint of processability. Examples of the resin that forms the film base material include plastics made of, for example: polyolefins such as polyethylene, polypropylene, and norbornene-based polymers; cyclic olefin-based resins; polyvinyl alcohol; polyethylene terephthalate; polymethacrylic acid ester; polyacrylic acid ester; cellulose esters such as triacetyl cellulose, diacetyl cellulose, and cellulose acetate propionate; polyethylene naphthalate; polycarbonate; polysulfone; polyether sulfone; polyether ketone; polyphenylene sulfide; and polyphenylene oxide. The base material can be obtained by forming a film from such a resin with known means such as a solvent casting method or a melt extrusion method. The surface of the base material may have a protective layer formed of an acrylic resin, methacrylic resin, epoxy resin, oxetane resin, urethane resin, and melamine resin. Or, the surface may be subjected to a mold release treatment such as a silicone treatment or a surface treatment such as a corona treatment or plasma treatment.

As the base material, commercially available products may be used. Examples of commercially available cellulose ester base material include, for example: cellulose ester base materials manufactured by Fuji Photo Film Co., Ltd., such as Fujitac film; cellulose ester base materials manufactured by Konica Minolta Opto Co., Ltd., such as "KC8UX2M", "KC8UY", and "KC4UY"; and the like. Examples of commercially available cyclic olefin-based resins include, for example: cyclic olefin-based resins manufactured by Ticona (Germany), such as "Topas (registered trademark)"; cyclic olefin-based resins manufactured by JSR Corporation, such as "ARTON (registered trademark)"; cyclic olefin-based resins manufactured by ZEON Corporation, such as "ZEONOR (registered trademark)" and "ZEONEX (registered trademark)"; and cyclic olefin-based resins manufactured by Mitsui Chemicals Inc., such as "APEL" (registered trademark). Commercially available cyclic olefin-based resin base materials can also be used. Examples of commercially available cyclic olefin-based resin base materials include: cyclic olefin-based resin base materials manufactured by Sekisui Chemical Co., Ltd., such as "ESSINA (registered trademark)" and "SCA40 (registered trademark)"; cyclic olefin-based resin base materials manufactured by Optes Inc., such as "ZEONOR FILM (registered trademark)"; and cyclic olefin resin-based resin base materials manufactured by JSR Corporation, such as "ARTON FILM (registered trademark)".

From the viewpoints of thinning the laminate, easy peeling of the base material, handleability of the base material, etc., the thickness of the base material is usually 5 to 300 µm, and preferably 10 to 150 µm.

Examples of the method for coating the polymerizable liquid crystal composition on the base material, etc., include known methods such as: coating methods including a spin coating method, extrusion method, gravure coating method, die coating method, bar coating method, applicator method, etc.; and printing methods including a flexographic method, etc.

Then, the solvent is removed by drying or the like to form a dried coating film. Examples of the drying method include a natural drying method, ventilation drying method, heat drying method, decompression drying method, etc. At this time, by heating the coating film obtained from the polymerizable liquid crystal composition, the solvent can be dried and removed from the coating film, and the polymerizable liquid crystal compound can be oriented in the vertical direction with respect to the flat plane of the coating film.

The heating temperature of the coating film can be appropriately determined in consideration of the polymerizable liquid crystal compound to be used and the material of the base material or the like on which the coating film is to be formed. But, the temperature is required to be the liquid crystal phase transition temperature or higher in order to allow the polymerizable liquid crystal compound to make a phase transition to a liquid crystal layer state. In order to put the polymerizable liquid crystal compound in a vertically oriented state while removing the solvent contained in the polymerizable liquid crystal composition, the coating film can be heated, for example, to a temperature higher than or equal to about the liquid crystal phase transition temperature (smectic phase transition temperature or nematic phase transition temperature) of the polymerizable liquid crystal compound contained in the polymerizable liquid crystal composition.

The liquid crystal phase transition temperature can be measured using, for example, a polarizing microscope equipped with a temperature control stage, a differential scanning calorimeter (DSC), a thermogravimetric-differential thermal analyzer (TG-DTA), or the like. When two or more types of the polymerizable liquid crystal compounds are used in combination, the phase transition temperature means a temperature that is measured, in the same way as when one type of the polymerizable liquid crystal compound is used, by using a mixture of the polymerizable liquid crystal compounds that is obtained by mixing the whole polymerizable liquid crystal compounds forming the polymerizable liquid crystal composition at the same ratio as the composition of the polymerizable liquid crystal composition. It is generally known that the liquid crystal phase transition temperature of the polymerizable liquid crystal compound in the polymerizable liquid crystal composition may be lower than the liquid crystal phase transition temperature of the polymerizable liquid crystal compound alone.

The heating time can be appropriately determined depending on the heating temperature, the type of the polymerizable liquid crystal compound to be used, and the type, boiling point, amount, etc., of the solvent, but is usually 15 seconds to 10 minutes, and preferably 0.5 to 5 minutes.

The solvent may be removed from the coating film at the same time as when the coating film is heated to the liquid crystal phase transition temperature of the polymerizable liquid crystal compound or higher, or removed separately. But, it is preferable from the viewpoint of improving productivity to remove the solvent at the same time. A pre-drying step may be provided, in which before the coating film is heated to the liquid crystal phase transition temperature of the polymerizable liquid crystal compound or higher, the solvent in the coating film is moderately removed under the conditions in which the polymerizable liquid crystal compound contained in the coating film obtained from the polymerizable liquid crystal composition does not polymerize. Examples of the drying method in such a pre-drying step include a natural drying method, ventilation drying method, heat drying method, decompression drying method, etc. The drying temperature (heating temperature) in the drying step can be appropriately determined depending on the type of the polymerizable liquid crystal compound to be used, and the type, boiling point, amount, etc., of the solvent Next, in the obtained dried coating film, the polymerizable liquid crystal compound is polymerized while maintaining the state in which the polymerizable liquid crystal compound is vertically oriented. Thereby, the vertically oriented liquid crystal cured film is formed. Examples of the polymerization method include a thermal polymerization method and a photopolymerization method, but the photopolymerization method is preferable from the viewpoint of easily controlling the polymerization reaction. In the photopolymerization, the light with which the dried coating film is irradiated is appropriately selected depending on the type of the photopolymerization initiator contained in the dried coating film, and the type of the polymerizable liquid crystal compound (especially the type of the polymerizable group that the polymerizable liquid crystal compound has) and its amount. Specific examples of the light include one or more types of light or active electron beams selected from the group consisting of visible light, ultraviolet light, infrared light, X-rays, α-rays, β-rays, and γ-rays. Among them, ultraviolet light is preferable because it is easy to control the progress of the polymerization reaction and photopolymerization apparatuses widely used in this field can be used. And, it is preferable to select the types of the polymerizable liquid crystal compound and polymerization initiator contained in the polymerizable liquid crystal composition such that photopolymerization can be performed by ultraviolet light. At the time of the polymerization, the polymerization temperature can also be controlled by emitting light while cooling the dried coating film with a proper cooling unit. When the polymerizable liquid crystal compound is polymerized at a lower temperature by adopting such a cooling unit, the vertically oriented liquid crystal cured film can be properly formed even if a base material having a relatively low heat resistance is used. In addition, the polymerization reaction can be promoted by raising the polymerization temperature within a range where defects due to the heat during light irradiation (deformation due to the heat of the base material, etc.) do not occur. A patterned cured film can also be obtained by performing masking and development, in the photopolymerization.

Examples of the light source for the active energy rays include a low-pressure mercury lamp, medium-pressure mercury lamp, high-pressure mercury lamp, ultra-high-pressure mercury lamp, xenon lamp, halogen lamp, carbon arc lamp, tungsten lamp, gallium lamp, excimer laser, LED light source for emitting light having a wavelength range from 380 to 440 nm, chemical lamp, black light lamp, microwave-excited mercury lamp, and metal halide lamp.

An ultraviolet emission intensity is usually 10 to 3,000 mW/cm$^2$. The ultraviolet emission intensity is preferably an intensity in a wavelength region effective for activating the polymerization initiator. A period for emitting the light is usually 0.1 seconds to 10 minutes, preferably 0.1 seconds to 5 minutes, more preferably 0.1 seconds to 3 minutes, and even more preferably 0.1 seconds to 1 minute. When emitted once or multiple times with such an ultraviolet emission intensity, the integrated amount of the light is 10 to 3,000 mJ/cm$^2$, preferably 50 to 2,000 mJ/cm$^2$, and more preferably 100 to 1,000 mJ/cm$^2$.

The thickness of the vertically oriented liquid crystal cured film can be appropriately selected depending on the display device to be applied, which is preferably 0.2 to 3 μm, and more preferably 0.2 to 2 μm. When the vertically oriented liquid crystal cured film has positive wavelength dispersibility, the thickness is further preferably 0.2 to 1 μm. When the vertically oriented liquid crystal cured film has reverse wavelength dispersibility, the thickness is further preferably 0.4 to 2 μm. When the vertically oriented liquid crystal cured film has reverse wavelength dispersibility, the light absorption in an oblique direction is increased more than when the vertically oriented liquid crystal cured film has positive wavelength dispersibility at the same coloring matter concentration, which is preferable.

In one aspect of the present invention, the coating film of the polymerizable liquid crystal composition is formed on an orientation film. The orientation film has an orientation regulating force by which the polymerizable liquid crystal compound is liquid-crystal-oriented in a desired direction. Among them, an orientation film having an orientation regulating force for orienting the polymerizable liquid crystal compound in the horizontal direction may be referred to as a horizontal orientation film, and an orientation film having an orientation regulating force for orienting the polymerizable liquid crystal compound in the vertical direction may be referred to as a vertical orientation film.

The orientation regulating force can be arbitrarily adjusted depending on the type, surface condition, rubbing conditions, etc., of the orientation film. When the orientation film is formed of a photo-orientation polymer, the orientation regulating force can be arbitrarily adjusted depending on polarized light irradiation conditions, etc.

Preferably, the orientation film has a solvent resistance with which it does not dissolve when the polymerizable liquid crystal compound is coated, etc., and has a heat resistance for a heat treatment for removing the solvent and orienting the polymerizable liquid crystal compound described later. Examples of the orientation film include an orientation film containing an orientation polymer, a photo-orientation film, a groove orientation film having an uneven pattern or a plurality of grooves on the surface, a stretched film stretched in the orientation direction, etc. From the viewpoints of the accuracy of orientation angle and quality, a photo-orientation film is preferable.

Examples of the orientation polymer include, for example: polyamides and gelatins having an amide bond in their molecules; polyimide having an imide bond in its molecule and polyamic acid that is a hydrolyzate thereof; polyvinyl alcohol; alkyl-modified polyvinyl alcohol; polyacrylamide; polyoxazol; polyethyleneimine; polystyrene; polyvinylpyrrolidone; polyacrylic acid; and polyacrylic acid esters. Among them, polyvinyl alcohol is preferable. The orientation polymer can be used alone or in combination of two or more.

The orientation film containing the orientation polymer is usually obtained by coating a composition in which the orientation polymer is dissolved in a solvent (hereinafter, may be referred to as an "orientation polymer composition") on a base material and removing the solvent, or by coating the orientation polymer composition on a base material, removing the solvent, and rubbing (rubbing method). Examples of the solvent include the same solvents as those illustrated above as the solvents that can be used in the polymerizable liquid crystal composition.

The concentration of the orientation polymer in the orientation polymer composition may be within a range where the orientation polymer material can be completely dissolved in the solvent, but is preferably 0.1 to 20% in terms of solid content based on the solution, and more preferably about 0.1 to 10%.

As the orientation polymer composition, a commercially available orientation film material may be used as it is. Examples of the commercially available orientation film material include SUNEVER (registered trademark, manufactured by Nissan Chemical Corporation), and OPTOMER (registered trademark, manufactured by JSR Corporation).

Examples of the method for coating the orientation polymer composition on the base material include the same methods as those illustrated above as the method for coating the polymerizable liquid crystal composition on the base material.

Examples of the method for removing the solvent contained in the orientation polymer composition include a natural drying method, ventilation drying method, heat drying method, decompression drying method, etc.

In order to impart an orientation regulating force to the orientation film, a rubbing treatment (rubbing method) can be performed, if necessary. Examples of the method for imparting an orientation regulating force by the rubbing method include a method in which an orientation polymer film, formed on the surface of the base material by coating the orientation polymer composition on the base material and annealing it, is brought into contact with a rotating rubbing roll around which rubbing cloth is wrapped. When masking is performed in initiating the rubbing treatment, a plurality of regions (patterns), where the directions of orientation are different, can also be formed in the orientation film.

The photo-orientation film can usually be obtained by coating a composition containing both a polymer or monomer having a photoreactive group and a solvent (hereinafter, also referred to as a "photo-orientation film-forming composition") on the base material and by emitting polarized light (preferably polarized UV) after the solvent is removed. The photo-orientation film is also advantageous in that the direction of the orientation regulating force can be arbitrarily controlled by selecting the polarization direction of the polarized light to be emitted.

The photoreactive group refers to a group that generates a liquid crystal orientation ability when irradiated with light. Specific examples thereof include groups involved in photoreactions that are the origin of the liquid crystal orientation ability, such as a molecular orientation induction or isomerization reaction, dimerization reaction, photocrosslinking reaction, or photodecomposition reaction, which are generated by light emission. Among them, a group involved in the dimerization reaction or photocrosslinking reaction is preferred because of its excellent orientation. The photoreactive group is preferably a group having an unsaturated bond, particularly a double bond, and particularly preferably a group having at least one selected from the group consisting of a carbon-carbon double bond (C=C bond), carbon-nitrogen double bond (C=N bond), nitrogen-nitrogen double bond (N=N bond), and carbon-oxygen double bond (C=O bond).

Examples of the photoreactive group having a C=C bond include a vinyl group, polyene group, stilbene group, stilbazole group, stilbazolium group, chalcone group, and cinnamoyl group.

Examples of the photoreactive group having a C=N bond include groups having a structure such as an aromatic Schiff base or aromatic hydrazone. Examples of the photoreactive group having an N=N bond include an azobenzene group, azonaphthalene group, aromatic heterocyclic azo group, bisazo group, formazan group, group having an azoxybenzene structure, etc. Examples of the photoreactive group having a C=O bond include a benzophenone group, coumarin group, anthraquinone group, and maleimide group. These groups may have substituents such as an alkyl group, alkoxy group, aryl group, allyloxy group, cyano group, alkoxycarbonyl group, hydroxyl group, sulfonic acid group, and halogenated alkyl group.

Among them, a photoreactive group involved in a photodimerization reaction is preferable, and a cinnamoyle group and a chalcone group are preferable because a photo-orientation film, having a relatively small emission amount of polarized light necessary for photo orientation and being excellent in thermal stability and over-time stability, can be easily obtained. It is particularly preferable to adopt, as the polymer having the photoreactive group, a polymer having a cinnamoyl group such that the end of the side chain of the polymer has a cinnamic acid structure.

By coating the photo-orientation film-forming composition onto a base material, a photo-orientation induction layer can be formed on the base material. Examples of the solvent contained in the composition include the same solvents as those illustrated above as the solvents that can be used in the polymerizable liquid crystal composition. The solvent can be appropriately selected depending on the solubility of the polymer or monomer having the photoreactive group.

The content of the polymer or monomer having the photoreactive group in the photo-orientation film-forming composition can be appropriately adjusted depending on the type of the polymer or monomer and the thickness of the target photo-orientation film. The content thereof is preferably at least 0.2% by mass, and more preferably within the range from 0.3 to 10% by mass, based on the mass of the photo-orientation film-forming composition. The photo-orientation film-forming composition may contain a polymer material, such as polyvinyl alcohol or polyimide, and a photosensitizer within a range where the characteristics of the photo-orientation film are not significantly impaired.

Examples of the method for coating the photo-orientation film-forming composition on the base material include the same methods as the methods for coating the orientation polymer composition on the base material. Examples of the method for removing the solvent from the coated photo-orientation film-forming composition include a natural drying method, ventilation drying method, heat drying method, decompression drying method, etc.

In order to emit polarized light, a method for directly emitting polarized UV on the photo-orientation film-forming composition coated on the base material, from which the solvent has been removed, may be adopted; or a method for emitting polarized light from the base material side and emitting the transmitted polarized light thereon may be adopted. It is particularly preferable that the polarized light is substantially parallel light. Preferably the wavelength of the polarized light to be emitted is within a wavelength range where a photoreactive group of a polymer or monomer having the photoreactive group can absorb light energy. Specifically, UV (ultraviolet ray) having a wavelength within the range from 250 to 400 nm is particularly preferable. Examples of the light source to be used for the polarized light emission include a xenon lamp, high-pressure mercury lamp, ultra-high-pressure mercury lamp, metal halide lamp, and ultraviolet light laser such as KrF or ArF. A high-pressure mercury lamp, ultra-high-pressure mercury lamp, and metal halide lamp are more preferable. Among them, a high-pressure mercury lamp, ultra-high-pressure mercury lamp, and metal halide lamp are preferable because they have a high emission intensity of an ultraviolet ray having a wavelength of 313 nm. Polarized UV can be emitted by emitting the light from the light source through an appropriate polarizer. As such a polarizer, a polarizing filter, polarizing prisms such as Glan-Thompson and Glan-Taylor, and a wire grid type polarizer can be used.

When masking is performed during rubbing or polarized light emission, a plurality of regions (patterns), where the directions of liquid crystal orientation are different, can be formed.

The groove orientation film is a film having an uneven pattern or a plurality of grooves on the surface of the film. When the polymerizable liquid crystal compound is coated on a film having a plurality of linear grooves arranged at equal intervals, the liquid crystal molecules are oriented in the direction along the grooves.

Examples of a method for obtaining the groove orientation film include: a method in which the surface of a photosensitive polyimide film is exposed to light through an exposure mask having pattern-shaped slits, and then development and a rinsing treatment are performed to form an uneven pattern; a method in which the layer of an UV-curable resin before being cured is formed on a plate-shaped original board having grooves on its surface, and the formed resin layer is transferred to a base material and cured; a method in which a roll-shaped original board having a plurality of grooves is pressed against the film of an UV-curable resin before being cured, which is formed on the base material, in order to form irregularities and then is cured; and the like.

As the material exhibiting the orientation regulating force for orienting the polymerizable liquid crystal compound in the vertical direction with respect to the flat plane of the coating film, fluoropolymers such as perfluoroalkyl, silane compounds, and polysiloxane compounds obtained by the condensation reactions thereof, in addition to the above orientation polymers, etc., may be used.

When a silane compound is used as the material for forming the orientation film, a compound containing a Si element and a C element is preferable, and a silane compound can be suitably used, from the viewpoint of easily lowering surface tension and easily improving the adhesion with the layer adjacent to the orientation film. As the silane compound, a nonionic silane compound described later, a silane-containing ionic compound as illustrated in the section of the ionic compound, etc., can be used. The vertical orientation regulating force can be increased by using these silane compounds. These silane compounds may be used alone, in combination of two or more, or by being mixed with other materials. When the silane compound is a non-ionic silane compound, a silane compound having an alkyl group at the molecular end is preferable, and a silane compound having an alkyl group having 3 to 30 carbon atoms is more preferable, from the viewpoint of easily increasing the vertical orientation regulating force.

The thickness of the orientation film (orientation film containing an orientation polymer or photo-orientation film) is usually in the range of 10 to 10000 nm, preferably in the range of 10 to 1000 nm, more preferably 10 to 500 nm or less, even more preferably in the range of 10 to 300 nm, and particularly preferably in the range of 50 to 250 nm.

In another aspect of the present invention, the coating film of the polymerizable liquid crystal composition does not need to be an orientation film, and can be formed directly on the base material. In such an aspect, the polymerizable liquid crystal composition for forming the vertically oriented liquid crystal cured film usually contains an orientation promoter. In the present invention, the orientation promoter means a material that promotes the liquid crystal orientation of the polymerizable liquid crystal compound in a desired direction. Examples of the orientation promoter for promoting the orientation of the polymerizable liquid crystal compound in the vertical direction include an ionic compound made of a non-metal atom, a nonionic silane compound, etc. The polymerizable liquid crystal composition that forms the vertically oriented liquid crystal cured film preferably contains at least one type of an ionic compound made of a non-metal atom and a nonionic silane compound, and more preferably contains both an ionic compound made of a non-metal atom and a nonionic silane compound.

When the polymerizable liquid crystal composition that forms the vertically oriented liquid crystal cured film contains an ionic compound made of a non-metal atom, a vertical orientation regulating force for the polymerizable liquid crystal compound is exerted by an electrostatic interaction, in the dried coating film formed on the base material from the composition for forming the vertically oriented liquid crystal cured film. Thereby, in the dried coating film, the polymerizable liquid crystal compound tends to be oriented in the vertical direction with respect to the surface of the base material. Thereby, the liquid crystal cured film can be formed while maintaining the state in which the polymerizable liquid crystal compound is vertically oriented.

Examples of the ionic compound made of a non-metal atom include, for example, onium salts (more specifically, quaternary ammonium salts in which the nitrogen atom has a positive charge, tertiary sulfonium salts, quaternary phosphonium salts in which the phosphorus atom has a positive charge, etc.). Among these onium salts, quaternary onium salts are preferable from the viewpoint of being able to further improve the vertical orientation of the polymerizable liquid crystal compound. From the viewpoints of availability and improving mass productivity, quaternary phosphonium salts or quaternary ammonium salts are more preferable. The onium salt may have two or more quaternary onium salt moieties in its molecule, and may be an oligomer or a polymer. The quaternary phosphonium salt or quaternary ammonium salt preferably has an alkoxysilane group such as a trialkoxysilane group.

The molecular weight of the ionic compound is preferably from 100 to 10,000. When the molecular weight is within the above range, the vertical orientation of the polymerizable liquid crystal compound can be easily improved while ensuring the coatability of the polymerizable composition. The molecular weight of the ionic compound is more preferably 5000 or less, and even more preferably 3000 or less.

Examples of the cation components of the ionic compounds include, for example, inorganic cations and organic cations. Among them, organic cations are preferable because an orientation defect in the polymerizable liquid crystal compound is less likely to occur. Examples of the organic cations include, for example, an imidazolium cation, pyridinium cation, ammonium cation, sulfonium cation, phosphonium cation, etc.

Ionic compounds generally have a counter anion. Examples of the anion components that become the counter ions of the cation components include, for example, inorganic anions and organic anions. Among them, organic anions are preferable because an orientation defect in the polymerizable liquid crystal compound is less likely to occur. It should be noted that the cation and the anion do not necessarily need to be in a one-to-one correspondence.

Specific examples of the anion components include the following:
chloride anion [$Cl^-$],
bromide anion [$Br^-$],
iodide anion [$I^-$],
tetrachloroaluminate anion [$AlCl_4^-$],
heptachlorodialuminate anion [$Al_2Cl_7^-$],
tetrafluoroborate anion [$BF_4^-$],
hexafluorophosphate anion [$PF_6^-$],
perchlorate anion [$ClO_4^-$],
nitrate anion [$NO_3^-$],
acetate anion [$CH_3COO^-$],
trifluoroacetate anion [$CF_3COO^-$],
fluorosulfonate anion [$FSO_3^-$],
methanesulfonate anion [$CH_3SO_3^-$],
trifluoromethanesulfonate anion [$CF_3SO_3^-$],
p-toluenesulfonate anion [$p\text{-}CH_3C_6H_4SO_3^-$],
bis(fluorosulfonyl)imide anion [$(FSO_2)_2^-$], bis(trifluoromethanesulfonyl)imide anion [$(CF_3SO_2)_2N^-$],
tris(trifluoromethanesulfonyl)methanide anion [$(CF_3SO_2)_3C^-$],
hexafluoroarsenate anion [$AsF_6^-$],
hexafluoroantimonate anion [$SbF_6^-$],
hexafluoroniobate anion [$NbF_6^-$],
hexafluorotantalate anion [$TaF_6^-$],
dimethylphosphinate anion [$(CH_3)_2POO^-$],
(poly)hydrofluorofluoride anion [$F(HF)_n^-$] (e.g., n represents an integer from 1 to 3),
dicyanamide anion [$(CN)_2N^-$],
thiocyan anion [$SCN^-$],
perfluorobutanesulfonate anion [$C_4F_9SO_3^-$],
bis(pentafluoroethanesulfonyl)imide anion [$(C_2FSO_2)_2N^-$],
perfluorobutanoate anion [$C_3F_7COO^-$], and
(trifluoromethanesulfonyl) (trifluoromethanecarbonyl)imide anion [$(CF_3SO_2)(CF_3CO)N^-$].

As the anionic components, bis(fluorosulfonyl)imide anion [$(FSO_2)_2N^-$],
bis(trifluoromethanesulfonyl)imide anion [$(CF_3SO_2)_2N^-$], bis(pentafluoroethanesulfonyl)imide anion [$(C_2F_5SO_2)_2N^-$], etc., are preferable.

Specific examples of the ionic compounds can be appropriately selected from the combinations of the above cation components and anion components. Specific examples of the compounds that are combinations of cation components and anion components include the following:

(Pyridinium Salts)
N-hexylpyridinium hexafluorophosphate,
N-octylpyridinium hexafluorophosphate,
N-methyl-4-hexylpyridinium hexafluorophosphate,
N-butyl-4-methylpyridinium hexafluorophosphate,
N-octyl-4-methylpyridinium hexafluorophosphate,
N-hexylpyridinium bis(fluorosulfonyl)imide,
N-octylpyridinium bis(fluorosulfonyl)imide,
N-methyl-4-hexylpyridinium bis(fluorosulfonyl)imide,
N-butyl-4-methylpyridinium bis(fluorosulfonyl)imide,
N-octyl-4-methylpyridinium bis(fluorosulfonyl)imide,
N-hexylpvridinium bis(trifluoromethanesulfonyl)imide,
N-octylpyridinium bis(trifluoromethanesulfonyl)imide,
N-methyl-4-hexylpyridinium bis(trifluoromethanesulfonyl)imide,
N-butyl-4-methylpyridinium bis(trifluoromethanesulfonyl)imide,
N-octyl-4-methylpyridinium bis(trifluoromethanesulfonyl)imide,
N-hexylpvridinium p-toluenesulfonate,
N-octylpvridinium p-toluenesulfonate,
N-methyl-4-hexylpyridinium p-toluenesulfonate,
N-butyl-4-methylpyridinium p-toluenesulfonate, and
N-octyl-4-methylpyridinium p-toluenesulfonate.

(Imidazolium Salts)
1-Ethyl-3-methylimidazolium hexafluorophosphate,
1-ethyl-3-methylimidazolium bis(fluorosulfonyl)imide,
1-ethyl-3-methylimidazolium bis(trifluoromethanesulfonyl)imide,
1-ethyl-3-methylimidazolium p-toluenesulfonate,
1-butyl-3-methylimidazolium methanesulfonate, etc.

(Pyrrolidinium Salts)
N-butyl-N-methylpyrrolidinium hexafluorophosphate,
N-butyl-N-methylpyrrolidinium bis(fluorosulfonyl)imide,
N-butyl-N-methylpyrrolidinium bis(trifluoromethanesulfonyl)imide,
N-butyl-N-methylpyrrolidinium p-toluenesulfonate, etc.

(Ammonium Salts)
Tetrabutylammonium hexafluorophosphate,
tetrabutylammonium bis(fluorosulfonyl)imide,
tetrahexyl ammonium bis(fluorosulfonyl)imide,
trioctylmethylammonium bis(fluorosulfonyl)imide,
(2-hydroxyethyl)trimethylammonium bis(fluorosulfonyl)imide,
tetrabutylammonium bis(trifluoromethanesulfonyl)imide,
tetrahexylammonium bis(trifluoromethanesulfonyl)imide,
trioctylmethylammonium bis(trifluoromethanesulfonyl)imide,
(2-hydroxyethyl)trimethylammonium bis(trifluoromethanesulfonyl)imide,
tetrabutylammonium p-toluenesulfonate,
tetrahexylammonium p-toluenesulfonate,
trioctylmethylammonium p-toluenesulfonate,
(2-hydroxyethyl)trimethylammonium p-toluenesulfonate,
(2-hydroxyethyl)trimethylammonium dimethylphosphinate,
1-(3-trimethoxysilylpropyl)-1,1,1-tributylammonium bis(trifluoromethanesulfonyl)imide,
1-(3-trimethoxysilylpropyl)-1,1,1-trimethylammonium bis(trifluoromethanesulfonyl)imide,
1-(3-trimethoxysilylbutyl)-1,1,1-tributylammonium bis(trifluoromethanesulfonyl)imide,
1-(3-trimethoxysilylbutyl)-1,1,1-trimethylammonium bis(trifluoromethanesulfonyl)imide,
N-{(3-triethoxysilylpropyl)carbamoyloxyethyl)}-N,N,N-trimethylammonium bis(trifluoromethanesulfonyl)imide, and
N-[2-{3-(3-trimethoxysilylpropylamino)-1-oxopropoxy}ethyl]-N,N,N-trimethylammonium bis(trifluoromethanesulfonyl)imide.

(Phosphonium Salts)
Tributyl (2-methoxyethyl)phosphonium bis(trifluoromethanesulfonyl)imide,
tributylmethylphosphonium bis(trifluoromethanesulfonyl)imide,
1,1,1-trimethyl-1-[(trimethoxysilyl)methyl]phosphonium bis(trifluoromethanesulfonyl)imide,
1,1,1-trimethyl-1-[2-(trimethoxysilyl)ethyl]phosphonium bis(trifluoromethanesulfonyl)imide,
1,1,1-trimethyl-1-[3-(trimethoxysilyl)propyl]phosphonium bis(trifluoromethanesulfonyl)imide,
1,1,1-trimethyl-1-[4-(trimethoxysilyl)butyl]phosphonium bis(trifluoromethanesulfonyl)imide,
1,1,1-tributyl-1-[(trimethoxysilyl)methyl]phosphonium bis(trifluoromethanesulfonyl)imide,
1,1,1-tributyl-1-[2-(trimethoxysilyl)ethyl]phosphonium bis(trifluoromethanesulfonyl)imide, and
1,1,1-tributyl-1-[3-(trimethoxysilyl)propyl]phosphonium bis(trifluoromethanesulfonyl)imide.

Each of these ionic compounds may be used alone, or in combination of two or more.

From the viewpoint of further improving the vertical orientation of the polymerizable liquid crystal compound, the ionic compound preferably has a Si element and/or an F element in the molecular structure of the cationic moiety. When the ionic compound has a Si element and/or an F element in the molecular structure of the cation moiety, it becomes easy to segregate the ionic compound on the surface of the vertically oriented liquid crystal cured film. Among them, the following ionic compounds (i) to (iii), are preferable as the ionic compounds in which all the constituent elements are non-metal elements.

[Chemical 28]

(Ionic compounds (i))

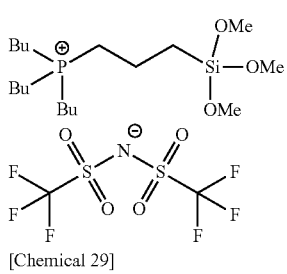

[Chemical 29]

(Ionic compounds (ii))

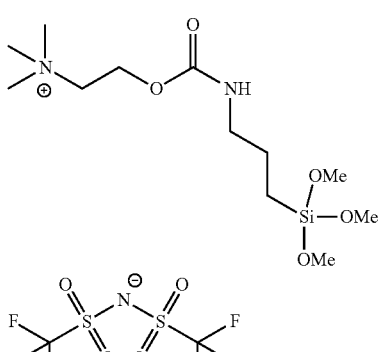

[Chemical 30]

(Ionic compounds (iii))

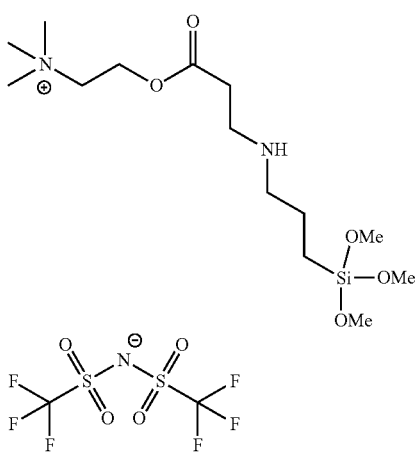

When the vertically oriented liquid crystal cured film contains an ionic compound with an alkyl group having a chain length that is long to some extent, the vertical orientation of the polymerizable liquid crystal compound can be effectively improved.

Specifically, the ionic compound preferably satisfies the following formula (8):

$$5 < M < 16 \qquad (8),$$

where, M is represented by the following formula (9):

M=(Of the substituents directly bonded onto the positively charged atoms, the number of covalent bonds from the positively charged atom to the end of the molecular chain of the substituent having the largest number of covalent bonds to the end of the molecular chain)÷(Number of the positively charged atoms)  (9).

When the ionic compound satisfies the above (8), the vertical orientation of the polymerizable liquid crystal compound can be effectively improved.

When there are two or more positively charged atoms in the molecule of the ionic compound, for the substituent having two or more positively charged atoms, the number of covalent bonds, counted from the positively charged atom considered as a base point to another positively charged atom closest to the atom, is defined as "the number of covalent bonds from the positively charged atom to the end of the molecular chain" described in the definition of the above M. When the ionic compound is an oligomer or polymer having two or more repeating units, the constituent units are considered as one molecule and the above M is calculated. When a positively charged atom is incorporated into the ring structure, the number of covalent bonds to the positively charged atom via the ring structure, or the number of covalent bonds to the end of the substituent bonded to the ring structure, are counted. Of the two numbers, the larger number is defined as "the number of covalent bonds from the positively charged atom to the end of the molecular chain" described in the definition of the above M.

When the polymerizable liquid crystal composition that forms the vertically oriented liquid crystal cured film contains the ionic compound, the content thereof is, usually, preferably 0.01 to 5'=by mass, more preferably 0.05 to 4% by mass, and even more preferably 0.1 to 3% by mass, based on the solid content of the polymerizable liquid crystal composition. When the content of the ionic compound is within the above range, the vertical orientation of the polymerizable liquid crystal compound can be effectively promoted while maintaining the good coatability of the polymerizable liquid crystal composition.

When the polymerizable liquid crystal composition that forms the vertically oriented liquid crystal cured film contains the nonionic silane compound, there are tendencies that: the nonionic silane compound lowers the surface tension of the polymerizable liquid crystal composition; in the dried coating film formed, on the base material, from the composition for forming the vertically oriented liquid crystal cured film, the nonionic silane compound exists on the surface, opposite to the dried coating film, of the base material, whereby the vertical orientation regulating force for the polymerizable liquid crystal compound is increased; and in the dried coating film, the polymerizable liquid crystal compound is oriented in the vertical direction with respect to the surface of the base material. Thereby, the liquid crystal cured film can be formed while maintaining the state in which the polymerizable liquid crystal compound is vertically oriented.

The nonionic silane compound is a compound that is nonionic and contains a Si element. Examples of the nonionic silane compound include, for example: silicon polymers such as polysilane; silicone resins such as silicone oil and silicone resin; organic-inorganic silane compounds such as silicone oligomer, silsessiloxane, and alkoxysilane (more specifically, silane coupling agents, etc.); and the silane-containing compounds described in the section of leveling agent.

The nonionic silane compound may be a silicone monomer type or a silicone oligomer (polymer) type. When the silicone oligomer is shown in the form of a (monomer)-(monomer) copolymer, examples thereof include: mercaptopropyl group-containing copolymers such as 3-mercaptopropyltrimethoxysilane-tetramethoxysilane copolymer, 3-mercaptopropyltrimethoxysilane-tetraethoxysilane copolymer, 3-mercaptopropyltriethoxysilane-tetramethoxysilane copolymer, and 3-mercaptopropyltriethoxysilane-tetraethoxysilane copolymer; mercaptomethyl group-containing copolymers such as mercaptomethyltrimethoxysilane-tetramethoxysilane copolymer, mercaptomethyltrimethoxysilane-tetraethoxysilane copolymer, mercaptomethyltriethoxysilane-tetramethoxysilane copolymer, and mercaptomethyltriethoxysilane-tetraethoxysilane copolymer; methacryloyloxypropyl group-containing copolymers such as 3-methacryloyloxypropyltrimethoxysilane-tetramethoxysilane copolymer, 3-methacloyloxypropyltrimethoxysilane-tetraethoxysilane copolymer, 3-methacyloxypropyltriethoxysilane-tetramethoxysilane copolymer, 3-methacloyloxypropyltriethoxysilane-tetraethoxysilane copolymer, 3-methacloyloxypropylmethyldimethoxysilane-tetramethoxysilane copolymer, 3-methacryloyloxypropylmethyldimethoxysilane-tetraethoxysilane copolymer, 3-methacryloyloxypropylmethyldiethoxysilane-tetramethoxysilane copolymer, and 3-methacryloxyylopropylmethyldiethoxysilane-tetraethoxysilane copolymer; acryloyloxypropyl group-containing copolymers such as 3-acryloyloxypropyltrimethoxysilane-tetramethoxysilane copolymer, 3-acryloyloxypropyltrimethoxysilane-tetraethoxysilane copolymer, 3-acryloyloxypropyltriethoxysilane-tetramethoxysilane copolymer, 3-acryloyloxypropyltriethoxysilane-tetraethoxysilane copolymer, 3-acryloyloxypropylmethyldimethoxysilane-tetramethoxysilane copolymer, 3-acryloyloxypropylmethyldimethoxysilane-tetraethoxysilane copolymer, 3-acryloyloxypropylmethyldiethoxysilane-tetramethoxysilane copolymer, and 3-acryloyloxypropylmethyldiethoxysilane-tetraethoxysilane copolymer; vinyl group-containing copolymers such as vinyltrimethoxysilane-tetramethoxysilane copolymer, vinyltrimethoxysilane-tetraethoxysilane copolymer, vinyltriethoxysilane-tetramethoxysilane copolymer, vinyltriethoxysilane-tetraethoxysilane copolymer, vinylmethyldimethoxysilane-tetramethoxysilane copolymer, vinylmethyldimethoxysilane-tetraethoxysilane copolymer, vinylmethyldiethoxysilane-tetramethoxysilane copolymer, and vinylmethyldiethoxysilane-tetraethoxysilane copolymer; amino group-containing copolymers such as 3-aminopropyltrimethoxysilane-tetramethoxysilane copolymer, 3-aminopropyltrimethoxysilane-tetraethoxysilane copolymer, 3-aminopropyltriethoxysilane-tetramethoxysilane copolymer, 3-aminopropyltriethoxysilane-tetraethoxysilane copolymer, 3-aminopropylmethyldimethoxysilane-tetramethoxysilane copolymer, 3-aminopropylmethyldimethoxysilane-tetraethoxysilane copolymer, 3-aminopropylmethyldiethoxysilane-tetramethoxysilane copolymer and 3-aminopropylmethyldiethoxysilane-tetraethoxysilane copolymer; and the like. These nonionic silane compounds may be used alone, or in combination of two or more. Among them, a silane coupling agent is preferable from the viewpoint of further improving the adhesion with the adjacent layer.

The silane coupling agent is a compound that contains: at its end, at least one type of functional group selected from the group consisting of a vinyl group, epoxy group, styryl group, methacrylic group, acrylic group, amino group, isocyanurate group, ureido group, mercapto group, isocyanate group, carboxy group, and a hydroxy group; and a Si element having at least one of an alkoxysilyl group and silanol group. By appropriately selecting these functional groups, peculiar effects, such as an improvement in the mechanical strength of the vertically oriented liquid crystal cured film, surface modification of the vertically oriented liquid crystal cured film, and an improvement in the adhesion with the layer (e.g., base material) adjacent to the vertically oriented liquid crystal cured film, can be imparted.

From the viewpoint of adhesion, it is preferable that the silane coupling agent is one having an alkoxysilyl group and another different reactive group (e.g., the above functional group). Further, it is preferable that the silane coupling agent is one having an alkoxysilyl group and a polar group. When the silane coupling agent has at least one alkoxysilyl group and at least one polar group in its molecule, the vertical orientation of the polymerizable liquid crystal compound tends to be more likely to be improved, so that the effect of promoting the vertical orientation can be remarkably obtained. Examples of the polar group include, for example, an epoxy group, amino group, isocyanurate group, mercapto group, carboxy group, and hydroxy group. The polar group may appropriately have a substituent or a protecting group in order to control the reactivity of the silane coupling agent.

Specific examples of the silane coupling agent include, for example, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-triethoxysilyl-N-(1,3-dimethyl-butylidene)propylamine, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyltrimethoxysilane, 3-mercaptopropyltrimethoxysilane, 3-glycidoxypropyltrimethoxysilane, 3-glycidoxypropyltriethoxysilane, 3-glycidoxypropyldimethoxymethylsilane, and 3-glycidoxypropylethoxydimethylsilane.

Examples of commercially available silane coupling agents include silane coupling agents manufactured by Shin-Etsu Chemical Co., Ltd., such as KP321, KP323, KP324, KP326, KP340, KP341, X22-161A, KF6001, KBM-1003, KBE-1003, KBM-303, KBM-402, KBM-403., KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, and KBE-9007.

When the polymerizable liquid crystal composition that forms the vertically oriented liquid crystal cured film contains the nonionic silane compound, the content thereof is, usually, preferably 0.01% by mass to 5% by mass, more preferably 0.05% by mass to 4% by mass, and even more preferably 0.1% by mass to 3% by mass, based on the solid content of the polymerizable liquid crystal composition. When the content of the nonionic silane compound is within the above range, the vertical orientation of the polymerizable liquid crystal compound can be effectively promoted while maintaining the good coatability of the polymerizable liquid crystal composition.

When the polymerizable liquid crystal composition that forms the vertically oriented liquid crystal cured film contains both the ionic compound and the nonionic silane compound, the vertical orientation of the polymerizable liquid crystal compound can be further promoted in the dried coating film formed, on the base material, from the composition for forming the vertically oriented liquid crystal cured film by an electrostatic interaction derived from the ionic compound and an effect of lowering surface tension derived from the nonionic silane compound. Thereby, the liquid crystal cured film can be formed while maintaining the state in which the polymerizable liquid crystal compound is vertically oriented more accurately.

<Horizontal Orientation Phase Difference Film>

The horizontally oriented phase difference film that forms the laminate of the present invention means a phase difference film oriented in the horizontal direction with respect to the in-plane direction of the vertically oriented liquid crystal cured film. It may be, for example, a stretched film, or a cured product of a polymerizable liquid crystal composition containing a polymerizable liquid crystal compound (a) that is a cured product (hereinafter, also referred to as a "horizontally oriented liquid crystal cured film") formed by being cured in a state in which the polymerizable liquid crystal compound (a) is oriented in the horizontal direction with respect to the flat plane of the phase difference film.

In the present invention, it is preferable that the horizontally oriented phase difference film satisfies the following formula (3)

$$ReA(450)/ReA(550)<1.00 \quad (3),$$

[where, $ReA(\lambda)$ represents an in-plane phase difference value, at a wavelength of $\lambda$ nm, of the horizontally oriented phase difference film, and $ReA(\lambda)=(nxA(\lambda)-nyA(\lambda))\times dA$ holds (where, $nxA(\lambda)$ represents a main refractive index at the wavelength of $\lambda$ nm and in the plane of the horizontally oriented phase difference film, $nyA(\lambda)$ represents a refractive index at the wavelength of $\lambda$ nm and in the direction perpendicular to the direction of nxA in the same plane as nxA, and dA indicates the thickness of the horizontally oriented phase difference film).]

When the horizontally oriented phase difference film satisfies the formula (3), the horizontally oriented phase difference film exhibits so-called reverse wavelength dispersibility in which an in-plane phase difference value at a short wavelength is smaller than an in-plane phase difference value at a long wavelength. By combining such a horizontally oriented phase difference film with the vertically oriented liquid crystal cured film, a laminate can be obtained, the laminate, when incorporated into an organic EL display device, being excellent not only in the effect of suppressing the difference between the front hue and the oblique hue during the display of white, but also in the effect of improving the front hue and the oblique reflection hue during the display of black. In order to improve the reverse wavelength dispersibility and further enhance the effect of improving the reflection hue in the front direction of the horizontally oriented phase difference film, ReA(450)/ReA(550) is preferably 0.70 or more, and more preferably 0.78 or more, and preferably 0.95 or less, and more preferably 0.92 or less.

The in-plane phase difference value can be adjusted by the thickness dA of the horizontally oriented phase difference film. In order to obtain a desired in-plane phase difference value ($ReA(\lambda)$: in-plane phase difference value of the horizontally oriented phase difference film at the wavelength of $\lambda$ nm), a three-dimensional refractive index and the film thickness dA may be adjusted because the in-plane phase difference value is determined by the above formula $ReA(\lambda)=(nxA(\lambda)-nyA(\lambda))\times dA$.

In addition, it is preferable that the horizontally oriented phase difference film satisfies the following formula (4):

$$120 \text{ nm} \leq ReA(550) \leq 170 \text{ nm} \quad (4),$$

[where, $ReA(\lambda)$ has the same meaning as the above.]

When the in-plane phase difference ReA(550) of the horizontally oriented phase difference film is within the range of the formula (4), and when a laminate (elliptical polarizing plate) including the horizontally oriented phase difference film is applied to an organic EL display device, the effect of improving the front reflection hue during the display of black (effect of suppressing coloring) becomes remarkable.

A more preferable range of the in-plane phase difference value is 130 nm≤ReA(550)≤150 nm.

In order to enable the desired phase difference of the phase difference film to be easily controlled and enable the film to be thinned, it is preferable that the horizontally oriented phase difference film is the horizontally oriented liquid crystal cured film. As the polymerizable liquid crystal compound for forming the horizontally oriented liquid crystal cured film, polymerizable liquid crystal compounds conventionally known in the field of phase difference film can be used. Among them, polymerizable liquid crystal compounds (a) exhibiting so-called reverse wavelength dispersibility are preferable. As such polymerizable liquid crystal compounds (a), for example, compounds represented by the above formula (X) can be suitably used. The polymerizable liquid crystal compound (a) may be the same as or different from the polymerizable liquid crystal compound that can be used in the vertically oriented liquid crystal cured film. The polymerizable liquid crystal compound (a) can be used alone or in combination of two or more.

The content of the polymerizable liquid crystal compound (a) in the polymerizable liquid crystal composition used for forming the horizontally oriented liquid crystal cured film is, for example, 70 to 99.5 parts by mass, preferably 80 to 99 parts by mass, more preferably 85 to 98 parts by mass, and even more preferably 90 to 95 parts by mass, based on 100 parts by mass of the solid content of the polymerizable liquid crystal composition.

When the content of the polymerizable liquid crystal compound (a) is within the above range, it is advantageous from the viewpoint of the orientation of the obtained liquid crystal cured film.

The polymerizable liquid crystal composition to use for forming the horizontally oriented liquid crystal cured film may further contain additives such as a solvent, photopolymerization initiator, leveling agent, antioxidant, and photosensitizer, in addition to the polymerizable liquid crystal compound (a). Examples of such components include the same components as those illustrated above as the components that can be used in the vertically oriented liquid crystal cured film. Each of such components may be used alone or in combination of two or more.

The polymerizable liquid crystal composition for forming the horizontally oriented liquid crystal cured film can be obtained by: stirring, at a predetermined temperature, the polymerizable liquid crystal compound (a) and components other than the polymerizable liquid crystal compound (a), such as a solvent and a photopolymerization initiator; and the like.

The horizontally oriented liquid crystal cured film can be manufactured by a method including, for example:
  a step of coating the polymerizable liquid crystal composition for forming the horizontally oriented liquid crystal cured film on a base material or an orientation film to obtain a coating film;
  a step of drying the coating film to form a dried coating film; and
  a step of irradiating the dried coating film with active energy rays to form the horizontally oriented liquid crystal cured film.

The coating film of the polymerizable liquid crystal composition can be formed by, for example, coating the polymerizable liquid crystal composition for forming the horizontally oriented liquid crystal cured film on a base material, an orientation film, or the like. As the base material that can be used here, the same base materials as those illustrated above as the base materials that can be used for manufacturing the vertically oriented liquid crystal cured film, can be used.

The orientation film can be appropriately selected from materials having a horizontal orientation regulating force for orienting the polymerizable liquid crystal compound (a) in the horizontal direction with respect to the flat plane of the coating film. The orientation regulating force can be arbitrarily adjusted depending on the type, surface condition, rubbing conditions, etc., of an orientation film. When the orientation film is formed of a photo-orientation polymer, the orientation regulating force can be arbitrarily adjusted depending on polarized light irradiation conditions, etc. Examples of such a material include, for example, the orientation polymers described above as the orientation films that can be used for manufacturing the vertically oriented liquid crystal cured film. The horizontally orientation film can be obtained by coating, on the base material, a composition containing such a material and a solvent, for example, the solvent illustrated in the vertically oriented liquid crystal cured film, and after the solvent is removed, by heating or the like the coated film. As the horizontal orientation film, it is preferable from the viewpoint of quality to use a photo-orientation film.

Then, the solvent is removed by drying or the like to form a dried coating film. Examples of the drying method include a natural drying method, ventilation drying method, heat drying method, decompression drying method, etc. From the viewpoint of productivity, heat drying is preferable, and the heating temperature in that case is preferably one at which the solvent can be removed and that is the phase transition temperature of the polymerizable liquid crystal compound (a) or higher. Examples of the procedures and conditions in such a step include the same ones as those that can be adopted in the method for manufacturing the vertically oriented liquid crystal cured film.

The obtained dried coating film is irradiated with active energy rays (more specifically, ultraviolet rays, etc.), and the polymerizable liquid crystal compound (a) is polymerized while maintaining the state in which the polymerizable liquid crystal compound (a) is oriented in the horizontal direction with respect to the flat plane of the coating film. Thereby, the horizontally oriented liquid crystal cured film is formed. Examples of the polymerization method include the same methods as those that can be adopted in the method for manufacturing the vertically oriented liquid crystal cured film.

In the laminate of the present invention, the vertically oriented liquid crystal cured film and the horizontally oriented phase difference film can be laminated via, for example, a pressure-sensitive adhesive layer or an adhesive layer. As a pressure-sensitive adhesive and an adhesive, those conventionally known in the art can be used. In addition, the polymerizable liquid crystal composition for forming the vertically oriented liquid crystal cured film may be directly coated on the horizontally oriented phase difference film via an orientation film, if necessary, or the polymerizable liquid crystal composition for forming the vertically oriented liquid crystal cured film may be coated on another layer that forms the laminate of the present invention.

In one aspect of the laminate of the present invention, the base material and the vertically oriented liquid crystal cured film exist adjacent to each other.

That is, such a laminate does not need a step of forming a vertical orientation film, so that it is also advantageous in terms of production efficiency and production cost. In such an aspect, preferably the vertically oriented liquid crystal cured film contains the above vertical orientation promoter.

When applied to an organic EL display device, the laminate of the present invention is excellent in the effect of suppressing changes in the front reflection hue and the oblique reflection hue during the display of black, and excellent in the effect of suppressing changes in the front hue and the oblique hue during the display of white. Therefore, the laminate can be suitably used as a laminate for an organic EL display device. By using the laminate of the present invention, an organic EL display device having good image display characteristics can be obtained.

As described above, the vertically oriented liquid crystal cured film satisfying the formula (1) and the formula (2):

$$0.001 \leq AxC \leq 0.3 \quad (1)$$

$$AxC(z=60)/AxC > 2 \quad (2),$$

[where, $AxC$ and $AxC(z=60)$ are both the absorbances of the vertically oriented liquid crystal cured film at the maximum absorption wavelengths between a wavelength of 400 nm and a wavelength of 750 nm, in which $AxC$ represents the absorbance of linearly polarized light that oscillates in an x-axis direction, and $AxC(z=60)$ represents the absorbance of linearly polarized light that oscillates in the x-axis direction when the vertically oriented liquid crystal cured film is rotated by 60° with a y-axis as a rotation axis.

Here, the x-axis means any direction in the plane of the vertically oriented liquid crystal cured film, the y-axis means the direction perpendicular to the x-axis in the plane of the film, and a z-axis means the thickness direction of the vertically oriented liquid crystal cured film.]

is excellent in the front (reflection) hue and the oblique (reflection) hue during the display of black and white in the organic EL display device to which the laminate (elliptic polarizing plate) including this film is applied. In particular, when combined with an organic EL display conventionally widely used, it is excellent in the effect of reducing the difference between the front hue and the oblique hue during the display of white in the organic EL display.

Therefore, the present invention also relates to a vertically oriented liquid crystal cured film that: is a cured product of a polymerizable liquid crystal composition containing a polymerizable liquid crystal compound and a dichroic coloring matter; is cured in a state in which the polymerizable liquid crystal compound is oriented in the vertical direction with respect to the flat plane of the liquid crystal cured film; contains, as the dichroic coloring matter, at least one type of dichroic coloring matter having maximum absorption between a wavelength of 400 nm and a wavelength of 750 nm; and satisfies the formula (1) and the formula (2).

Preferably the vertically oriented liquid crystal cured film of the present invention satisfies the optical characteristics that a vertically oriented liquid crystal cured film that forms the laminate of the present invention has, for example, each of the optical characteristics shown by the above formulae (5) and (6) or (7). Examples of the polymerizable liquid crystal compound, the dichroic coloring matter, and the various components contained in the polymerizable liquid crystal composition, all of which form the vertically oriented liquid crystal cured film of the present invention, include the same ones as those illustrated above as forming the vertically oriented liquid crystal cured film that forms the laminate of the present invention. In addition, the vertically oriented liquid crystal cured film of the present invention can be manufactured by the same method as one described as the method for manufacturing the vertically oriented liquid crystal cured film that forms the laminate of the present invention.

In a particularly preferred aspect of the vertically equilibrium liquid crystal cured film of the present invention, the vertically oriented liquid crystal cured film is formed of a polymerizable liquid crystal composition containing a vertical orientation promoter, whereby a vertical liquid crystal cured film having no or less orientation defect can be obtained without using an orientation film. Since such a vertically oriented liquid crystal cured film does not need a step of forming an orientation film, it is also advantageous in terms of production efficiency and production cost. Examples of the vertical orientation promoter include the same promoters as those illustrated above as forming the vertically oriented liquid crystal cured film that forms the laminate of the present invention.

<Elliptical Polarizing Plate>

The present invention includes an elliptical polarizing plate including the laminate of the present invention and a polarizing film.

The polarizing film is a film having a polarizing function. Examples thereof include: a stretched film having a coloring matter with absorption anisotropy adsorbed; a film including, as a polarizer, a film coated with a coloring matter with absorption anisotropy; and the like. Examples of the coloring matter with absorption anisotropy include, for example, a dichroic coloring matter.

The film including, as a polarizer, a stretched film having a coloring matter with absorption anisotropy adsorbed is usually produced by: a step of uniaxially stretching a polyvinyl alcohol-based resin film; a step of dyeing the polyvinyl alcohol-based resin film with a dichroic coloring matter in order to adsorb the dichroic coloring matter; a step of treating the polyvinyl alcohol-based resin film on which the dichroic coloring matter is adsorbed with a boric acid aqueous solution; a step of washing with water after the treatment with a boric acid aqueous solution; and then the produced polarizer is sandwiched by a transparent protective film via an adhesive on at least one side of the manufactured polarizer.

The polyvinyl alcohol-based resin is obtained by saponifying a polyvinyl acetate-based resin. As the polyvinyl acetate-based resin, polyvinyl acetate that is a homopolymer of vinyl acetate, and a copolymer of vinyl acetate and another monomer copolymerizable therewith are used. Examples of the another monomer copolymerizable with vinyl acetate include, for example, unsaturated carboxylic acids, olefins, vinyl ethers, unsaturated sulfonic acids, acrylamides having an ammonium group, etc.

The degree of saponification of the polyvinyl alcohol-based resin is usually about 85 to 100 mol %, and preferably 98 mol % or more. The polyvinyl alcohol-based resin may be modified, and for example, polyvinyl formal or polyvinyl acetal modified with aldehydes can also be used. The degree of polymerization of the polyvinyl alcohol-based resin is usually about 1,000 to 10,000, and preferably in the range of 1,500 to 5,000.

A film formed of such a polyvinyl alcohol-based resin is used as a raw film for the polarizing film. The method for forming the film of the polyvinyl alcohol-based resin is not particularly limited, and the film can be formed by a known method. The film thickness of the polyvinyl alcohol-based raw film can be, for example, about 10 to 150 µm.

The uniaxial stretching of the polyvinyl alcohol-based resin film can be performed before dyeing with a dichroic coloring matter, at the same time as the dyeing, or after the dyeing. When the uniaxial stretching is performed after the dyeing, the uniaxial stretching may be performed before the boric acid treatment or during the boric acid treatment. The uniaxial stretching can also performed in these multiple stages. In the uniaxial stretching, it may be uniaxially stretched between rolls having different peripheral speeds, or uniaxially stretched using thermal rolls. Alternatively, the uniaxial stretching may be dry stretching in which the stretching is performed in the atmosphere, or be wet stretching in which the polyvinyl alcohol-based resin film is stretched in the state of being swollen using a solvent. The stretching ratio is usually about 3 to 8 times.

The dyeing of the polyvinyl alcohol-based resin film with a dichroic coloring matter is performed by, for example, a method for immersing the polyvinyl alcohol-based resin film in an aqueous solution containing the dichroic coloring matter.

As the dichroic coloring matter, iodine or a dichroic organic dye is specifically used. Examples of the dichroic organic dye include: a dichroic direct dye made of a disazo compound such as C. I. DIRECT RED 39; a dichroic direct dye made of a compound such as trisazo and tetrakisazo; and the like. Preferably the polyvinyl alcohol-based resin film is immersed in water before the dyeing treatment.

When iodine is used as the dichroic coloring matter, a method for immersing the polyvinyl alcohol-based resin film in an aqueous solution containing iodine and potassium iodide to be dyed is usually adopted.

The content of iodine in this aqueous solution is usually about 0.01 to 1 part by mass per 100 parts by mass of water. The content of potassium iodide is usually about 0.5 to 20 parts by mass per 100 parts by mass of water. The temperature of the aqueous solution used for the dyeing is usually about 20 to 40° C. The immersion time (dyeing time) in this aqueous solution is usually about 20 to 1,800 seconds.

On the other hand, when a dichroic organic dye is used as the dichroic coloring matter, a method for immersing the polyvinyl alcohol-based resin film in an aqueous solution containing a water-soluble dichroic coloring matter to be dyed is usually adopted.

The content of the dichroic organic dye in this aqueous solution is usually about $1\times10^{-4}$ to 10 parts by mass, preferably $1\times10^{-3}$ to 1 part by mass, and more preferably $1\times10^{-3}$ to $1\times10^{-2}$ parts by mass, per 100 parts by mass of water. This aqueous solution may contain an inorganic salt such as sodium sulfate as a dyeing aid. The temperature of the dichroic dye aqueous solution used for the dyeing is usually about 20 to 80° C. The immersion time (dyeing time) in this aqueous solution is usually about 10 to 1,800 seconds.

The boric acid treatment after the dyeing with the dichroic coloring matter can usually be performed by a method for immersing the dyed polyvinyl alcohol-based resin film in a boric acid aqueous solution. The content of the boric acid in this boric acid aqueous solution is usually about 2 to 15 parts by mass, and preferably 5 to 12 parts by mass, per 100 parts by mass of water. When iodine is used as the dichroic coloring matter, it is preferable that this boric acid aqueous solution contains potassium iodide. The content of the potassium iodide in that case is usually about 0.1 to 15 parts by mass, and preferably 5 to 12 parts by mass, per 100 parts by mass of water. The immersion time in the boric acid aqueous solution is usually about 60 to 1,200 seconds, preferably 150 to 600 seconds, and more preferably 200 to 400 seconds. The temperature of the boric acid treatment is usually 50° C. or higher, preferably 50 to 85° C., and more preferably 60 to 80° C.

The polyvinyl alcohol-based resin film after the boric acid treatment is usually washed with water. The water washing treatment can be performed by, for example, a method for immersing the polyvinyl alcohol-based resin film that has been subjected to the boric acid treatment in water. The temperature of the water in the water washing treatment is usually about 5 to 40° C.

The immersion time is usually about 1 to 120 seconds.

A polarizer can be obtained by performing a drying treatment after the washing with water. The drying treatment can be performed using, for example, a hot air dryer or a far infrared heater. The temperature of the drying treatment is usually about 30 to 100° C., and preferably 50 to 80° C. The time of the drying treatment is usually about 60 to 600 seconds, and preferably 120 to 600 seconds. The moisture percentage of the polarizer is reduced to a practical level by the drying treatment. The moisture percentage is usually about 5 to 20% by weight, and preferably 8 to 15% by weight. If the moisture percentage is less than 5% by weight, the polarizer loses its flexibility and the polarizer may be damaged or broken after being dried. If the moisture percentage is more than 20% by weight, the thermal stability of the polarizer may deteriorate.

The thickness of the polarizer thus obtained by being subjected to uniaxial stretching, dyeing with the dichroic coloring matter, boric acid treatment, washing with water, and drying is preferably 5 to 40 µm.

Examples of the film coated with the coloring matter with absorption anisotropy include: a film obtained by coating a composition containing a dichroic coloring matter having liquid crystallinity; a film obtained by coating a composition containing a dichroic coloring matter and polymerizable liquid crystal; and the like. The film preferably has a protective film or protective films on one or both sides thereof. Examples of the protective film include the same resin films as those illustrated above as the base materials that can be used for manufacturing the horizontally oriented liquid crystal cured film.

The film coated with a coloring matter with absorption anisotropy is preferably thin, but if it is too thin, the strength decreases and the processability tends to deteriorate. The thickness of the film is usually 20 µm or less, preferably 5 µm or less, and more preferably 0.5 to 3 µm.

Specific examples of the film coated with the coloring matter with absorption anisotropy include the films described in JP-A-2012-33249.

The polarizing film can be obtained by laminating a transparent protective film on at least one side of the polarizer thus obtained via an adhesive. As the transparent protective film, transparent films, the same as the resin films illustrated above as the base materials that can be used for manufacturing the horizontally oriented liquid crystal cured film, can be preferably used.

The elliptical polarizing plate of the present invention is formed to include the laminate of the present invention and the polarizing film. The elliptical polarizing plate of the present invention can be obtained by, for example, laminating the laminate of the present invention and the polarizing film via an adhesive layer or the like.

In one embodiment of the present invention, when the laminate of the present invention and the polarizing film are laminated, it is preferable that they are laminated such that the angle between the slow axis (optical axis) of the horizontally oriented phase difference film that forms the laminate and the absorption axis of the polarizing film becomes 45±5°.

The elliptical polarizing plate of the present invention may further have another film or layer in addition to the polarizing film and the phase difference film. Examples of such another film or layer include, for example: a pressure-sensitive adhesive layer (sheet) for pasting the elliptical polarizing plate to the display element of an organic EL or the like; a protective film used for protecting the surface of the polarizing film or the phase difference film from scratches and dirt; and the like.

The laminate and elliptical polarizing plate of the present invention can be used in various display devices.

The display device means a device having a display element, and includes a light emitting element or a light emitting device as a light emitting source. Examples of the display device include a liquid crystal display device, organic electroluminescence (EL) display device, inorganic electroluminescence (EL) display device, touch panel display device, electron emission display device (e.g., electric field emission display device (FED), surface field emission display device (SED)), display device using electronic paper (electronic ink or electrophoretic element), plasma display device, projection type display device (e.g., grating light valve (GLV) display device, display device with digital micromirror device (DMD)), piezoelectric ceramic display, etc. The liquid crystal display device includes any of a transmissive liquid crystal display device, a semi-transmissive liquid crystal display device, a reflective liquid crystal display device, a direct-view liquid crystal display device, a projection type liquid crystal display device, etc. These display devices may be display devices that display two-dimensional images, or stereoscopic display devices that display three-dimensional images. In particular, the elliptical polarizing plate of the present invention can be suitably used in organic electroluminescence (EL) display devices because its effects are easily and remarkably exhibited, and the laminate of the present invention can be suitably used in liquid crystal display devices and touch panel display devices.

These display devices are excellent in the front reflection hue and the oblique reflection hue during the display of black, and are also excellent in the front hue and the oblique hue during the display of white. Thereby, they can exhibit good image display characteristics.

EXAMPLES

Hereinafter, the present invention will be described more specifically with reference to Examples. Here, "%" and "part(s)" in Examples mean % by mass and part(s) by mass, respectively, unless otherwise specified.

1. Example 1

(i) Preparation of Composition for Forming Horizontal Orientation Film

A composition for forming a horizontal orientation film was obtained by mixing, as components, 5 parts of a photo-orientation material (weight average molecular weight: 30000) having the following structure and 95 parts of cyclopentanone (solvent) and stirring the obtained mixture at 80° C. for 1 hour.

[Chemical 31]

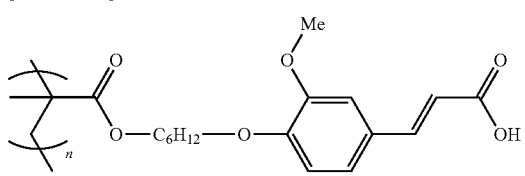

(2) Preparation of Polymerizable Liquid Crystal Compound

A polymerizable liquid crystal compound (X1) and a polymerizable liquid crystal compound (X2), each having the following molecular structures, were respectively prepared. The polymerizable liquid crystal compound (X1) was manufactured according to the method described in JP-A-2010-31223. The polymerizable liquid crystal compound (X2) was manufactured according to the method described in JP-A-2009-173893.

Polymerizable Liquid Crystal Compound (X1)

[Chemical 32]

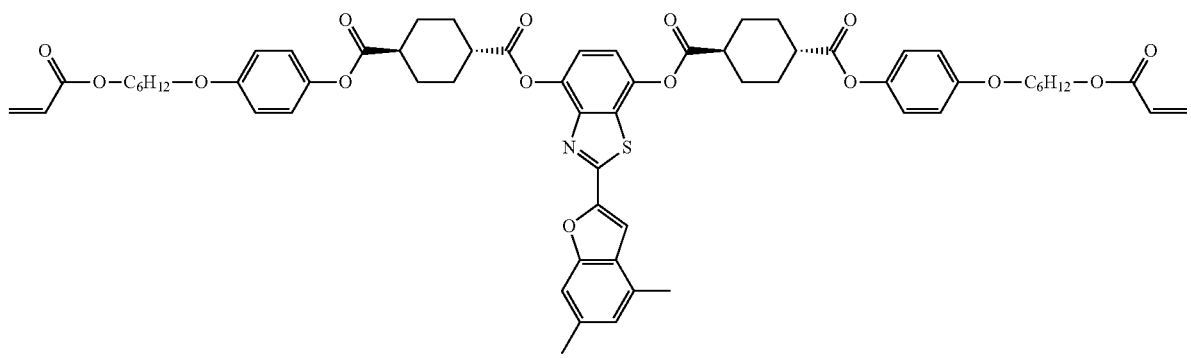

Polymerizable Liquid Crystal Compound (X2)

[Chemical 33]

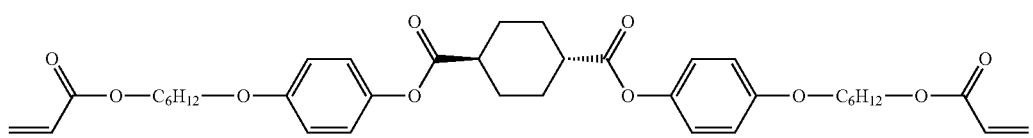

A solution was obtained by dissolving 1 mg of the polymerizable liquid crystal compound (X1) in 50 mL of tetrahydrofuran. The obtained solution was put, as a sample for measurement, into a measurement cell with an optical path length of 1 cm, and the absorption spectra of the sample for measurement were measured by setting the sample in an ultraviolet-visible spectrophotometer ("UV-2450" manufactured by Shimadzu Corporation). When the wavelength at which maximum absorbance was obtained was read from the obtained absorption spectra, a maximum absorption wavelength $\lambda_{max}$ in the range of a wavelength of 300 nm to a wavelength of 400 nm was 350 nm.

(3) Preparation of Polymerizable Liquid Crystal Composition for Forming Horizontally Oriented Phase Difference Film The polymerizable liquid crystal compound (X1) and the polymerizable liquid crystal compound (X2) were mixed at a mass ratio of 90:10 to obtain a mixture. To 100 parts by mass of the obtained mixture, 0.1 parts by mass of a leveling agent "BYK-361N" (manufactured by BM Chemie) and 6 parts by mass of 2-dimethylamino-2-benzyl-1-(4-morpholinophenyl)butan-1-one ("Irgacure (registered trademark) 369 (Irg369)" manufactured by BASF Japan Co., Ltd.) as a photopolymerization initiator were added. Further, N-methyl-2-pyrrolidone (NMP) was added such that the concentration of solid content became 13%. A polymerizable liquid crystal composition for forming a horizontally oriented phase difference film was obtained by stirring this mixture at 80° C. for 1 hour.

(4) Manufacture of Horizontally Oriented Phase Difference Film (Horizontally Oriented Liquid Crystal Cured Film)

After a corona treatment was performed on a COP film (ZF-14-50) manufactured by ZEON Corporation, the composition for forming a horizontal orientation film was coated with a bar coater and dried at 80° C. for 1 minute. It was exposed to polarized UV light at an integrated amount of light, at a wavelength of 313 nm, of 100 mJ/cm² by using a polarized UV irradiation device (SPOT CURE SP-9; manufactured by Ushio Inc.). Thereby, a horizontal orientation film was obtained. The film thickness of the obtained horizontal orientation film was measured with an ellipsometer, which was found to be 200 nm.

Subsequently, the polymerizable liquid crystal composition for forming a horizontally oriented phase difference film was coated on the horizontal orientation film using a bar coater, and it was heated at 120° C. for 60 seconds. Then, ultraviolet rays were emitted (under nitrogen atmosphere, an integrated amount of light at a wavelength of 365 nm: 500 mJ/cm²) from the surface on which the polymerizable liquid crystal composition for forming a horizontally oriented phase difference film was coated, by using a high-pressure mercury lamp (Unicure VB-15201BY-A, manufactured by Ushio Inc.). Thereby, a horizontally oriented phase difference film (horizontally oriented liquid crystal cured film) was formed. After it was confirmed that there was no phase difference in the COP film, Re(450) and Re(550) were measured using KOBRA-WPR manufactured by Oji Scientific Instruments, thereby calculating αA=Re(450)/Re(550). Results are shown in Table 1.

(5) Preparation of Polymerizable Liquid Crystal Composition for Forming Vertically Oriented Liquid Crystal Cured Film The polymerizable liquid crystal compound (X1) and the polymerizable liquid crystal compound (X2) were mixed at a mass ratio of 90:10 to obtain a mixture. To 100 parts by mass of the obtained mixture, 0.25 parts by mass of a leveling agent "F-556" (manufactured by DIC Co., Ltd.), 1.5 parts by mass of a dichroic coloring matter A described in JP-A-2013-101328, 1.5 parts by mass of an ionic compound A (molecular weight: 645) prepared with reference to JP-A-2016-514802, 0.5 parts by mass of a silane coupling agent "KBE-9103" (manufactured by Shin-Etsu Chemical Co., Ltd.), and 6 parts by mass of 2-dimethylamino-2-benzyl-1-(4-morpholinophenyl)butan-1-one ("Irgacure (registered trademark) 369 (Irg369)" manufactured by BASF Japan Co., Ltd.) as a photopolymerization initiator were added. Further, N-methyl-2-pyrrolidone (NMP) was added such that the concentration of solid content became 13%. A polymerizable liquid crystal composition for forming a vertically oriented liquid crystal cured film was obtained by stirring this mixture at 80° C. for 1 hour.

Dichroic coloring matter A: maximum absorption wavelength 592 nm (measured in chloroform solution)

[Chemical 34]

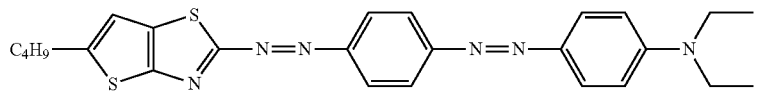

Ionic Compound A:

[Chemical 35]

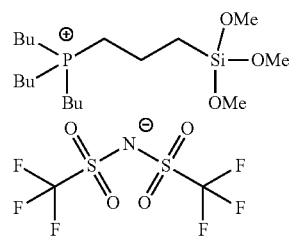

(6) Preparation of Vertically Oriented Liquid Crystal Cured Film

A corona treatment was performed on a COP film (ZF-14-50) manufactured by ZEON Corporation, the polymerizable liquid crystal composition for forming a vertically oriented liquid crystal cured film was coated using a bar coater, and it was heated at 120° C. for 60 seconds. Then, ultraviolet rays were emitted (under nitrogen atmosphere, an integrated amount of light at a wavelength of 365 nm: 500 mJ/cm²) from the surface on which the polymerizable liquid crystal composition for forming a vertically oriented liquid crystal cured film was coated, by using a high-pressure mercury lamp (Unicure VB-152013Y-A, manufactured by Ushio Inc.) to thereby form a vertically oriented liquid crystal cured film. The film thickness of the obtained vertically oriented liquid crystal cured film was measured with an ellipsometer (M-220 manufactured by JASCO Corporation), which was found to be 1.2 μm.

(7) Measurement of Optical Characteristics of Vertically Oriented Liquid Crystal Cured Film
<Measurement of Rth of Vertically Oriented Liquid Crystal Cured Film>

In order to confirm the orientation state of the polymerizable liquid crystal compound in the vertically oriented liquid crystal cured film, the phase difference value (RthC) of the vertically oriented liquid crystal cured film was measured using KOBRA-WPR manufactured by Oji Scientific instruments. Since the phase difference of a film having anisotropic absorption of visible light cannot be measured by the measuring instrument, $RthC(\lambda)$ of the vertically oriented liquid crystal cured film excluding the dichroic coloring matter was measured as a reference.

As a vertically oriented liquid crystal curing film for measurement, a polymerizable liquid crystal composition for forming a vertically oriented oriented liquid crystal cured film, obtained by excluding only the dichroic coloring matter A from the polymerizable liquid crystal composition for forming a vertically oriented liquid crystal curing film, was prepared. Then, a vertically oriented liquid crystal cured film was formed using the composition in the same way as described above. After it was confirmed that there was no phase difference in the COP film, the front phase difference value of the vertically oriented liquid crystal cured film for Rth measurement and the phase difference value of the film when it was tilted by 40° to the center of the phase advance axis were measured by using "KOBRA-WPR" manufactured by Oji Scientific Instruments and by changing the incident angle of light on the sample for optical characteristics measurement. The average refractive index at each wavelength was measured using an ellipsometer M-220 manufactured by JASCO Corporation. The film thickness was measured using the Optical NanoGauge film thickness meter C12562-01 manufactured by Hamamatsu Photonics K.K. From the above front phase difference value, phase difference value when tilted 40° to the center of the phase advance axis, average refractive index value, and film thickness value, a three-dimensional refractive index was calculated with reference to Oji Scientific Instruments Technical Data (http://www.oji-keisoku.co.jp/products/kobra/reference.html). From the obtained three-dimensional refractive index, the optical characteristics of each vertically oriented liquid crystal cured film were calculated according to the following formula. Results are shown in Table 1.

$$RthC(\lambda)=((nxC(\lambda)+nyC(\lambda))/2-nzC(\lambda))\times dC,$$

where, $RthC(\lambda)$ represents the phase difference value, at a wavelength of $\lambda$ nm and in the film thickness direction, of the vertically oriented liquid crystal cured film. In addition, $nxC(\lambda)$ indicates the in-plane main refractive index, at the wavelength of $\lambda$ nm, of the vertically oriented liquid crystal cured film, $nyC(\lambda)$ indicates the refractive index at the wavelength of $\lambda$ nm and in the direction perpendicular, in the plane, to $nxC(\lambda)$, and $nzC(\lambda)$ indicates the refractive index, at the wavelength of $\lambda$ nm and in the thickness direction, of the vertically oriented liquid crystal cured film. When $nxC(\lambda)=nyC(\lambda)$, $nxC(\lambda)$ can be a refractive index in any direction in the plane of the film, and dC indicates the film thickness of the vertically oriented liquid crystal cured film.

When the blending amount of the dichroic coloring matter with respect to the polymerizable liquid crystal compound that forms the vertically oriented liquid crystal cured film is small (about 3 parts by mass based on 100 parts by mass of the polymerizable liquid crystal compound), and when the values of AxC and AxC(z=60)/AxC satisfy the formula (1) and the formula (2), respectively, the effect of the dichroic coloring matter on $RthC(\lambda)$ can be regarded as negligible, and the $RthC(\lambda)$ of the vertically oriented liquid crystal cured film excluding the dichroic coloring matter can be regarded as the RthC(X) of the vertically oriented liquid crystal cured film containing the dichroic coloring matter.

<Measurement of Absorbance of Vertically Oriented Liquid Crystal Cured Film>

The coated surface of the vertically oriented liquid crystal cured film manufactured by the method described in the above (6) was pasted to glass having a size of 4×4 cm×0.7 mm (thickness) via a 25 μm pressure-sensitive adhesive (manufactured by LINTEC Corporation). The absorbance thereof was measured by setting in an ultraviolet-visible spectrophotometer ("UV-2450" manufactured by Shimadzu Corporation), and the maximum absorption wavelength (λmax) between a wavelength of 400 nm and a wavelength of 750 nm, AxC, and AxC(z=60) were calculated. Results are shown in Table 1.

The x-axis means any direction in the plane of the vertically oriented liquid crystal cured film, the y-axis means the direction perpendicular to the x-axis in the plane of the film, and the z-axis means the thickness direction of the vertically oriented liquid crystal cured film. AxC and AxC (z=60) are both absorbances of the vertically oriented liquid crystal cured film at the maximum absorption wavelengths between a wavelength of 400 nm and a wavelength of 750 nm, in which AxC represents the absorbance of linearly polarized light that oscillates in the x-axis direction, and AxC(z=60) represents the absorbance of linearly polarized light that oscillates in the x-axis direction when the film is rotated by 60° with the y-axis as a rotation axis.

In measuring the absorbance, the sample was set in an ultraviolet-visible spectrophotometer ("UV-2450" manufactured by Shimadzu Corporation) and correction was made such that the absorbance at 800 nm became 0. Then, AxC was measured. Also for AxC(z=60), the sample was set and tilted in the same way and correction was made such that the absorbance at 800 nm became 0. Then, AxC(z=60) was measured. Further, in performing the same measurement on the laminate of the vertically oriented liquid crystal cured film and the horizontal orientation film, which will be described later, AxC/AxC(z=60) of the vertically oriented liquid crystal cured film in the laminate can be measured by confirming that the horizontally oriented phase difference film does not have remarkable absorption between 400 nm and 750 nm, and then making measurement light incident from the side of the vertically oriented liquid crystal cured film.

(8) Manufacture of Polarizing Film

After a polyvinyl alcohol film having an average degree of polymerization of about 2,400, a saponification degree of 99.9 mol % or more, and a thickness of 75 μm was immersed in pure water at 30° C., the film was dyed with iodine by immersing, at 30° C., in an aqueous solution having a weight ratio of iodine/potassium iodide/water of 0.02/2/100 (iodine dyeing step). The polyvinyl alcohol film that had undergone the iodine dyeing step was subjected to a boric acid treatment by immersing, at 56.5° C., in an aqueous solution having a weight ratio of potassium iodide/boric acid/water of 12/5/100 (boric acid treatment step). After the polyvinyl alcohol film that had undergone the boric acid treatment step was washed with pure water at 8° C., it was dried at 65° C. to obtain a polarizer (thickness after stretching: 27 μm) in which iodine was adsorbed and oriented on the polyvinyl alcohol. At this time, stretching was performed in the iodine dyeing step and the boric acid treatment step. The total stretching ratio in such stretching was 5.3 times. The obtained polarizer and a saponified triacetyl cellulose film (KC4UYTAC 40 μm manufactured by Konica Minolta, Inc.) were pasted to each other with a nip roll via a water-based adhesive. The obtained pasted material was dried at 60° C. for 2 minutes while keeping the tension of the obtained material at 430 N/m. Thereby, a polarizing film having, on one side, a triacetyl cellulose film as a protective film was obtained. The water-based adhesive was prepared by adding 3 parts by mass of carboxyl group-modified polyvinyl alcohol (KURARAY POVAL KL318 manufactured by KURARAY) and 1.5 parts by mass of a water-soluble polyamide epoxy resin (Sumirez Resin 650 manufactured by Sumika Chemtex, aqueous solution having a concentration of solid content of 30%) to 100 parts by mass of water.

The optical characteristics of the obtained polarizing film were measured. The measurement was performed with a spectrophotometer (V7100, manufactured by JASCO), in which the polarizer surface of the polarizing film obtained above was used as an incident surface.

The obtained luminosity factor correction single transmittance was 42.1%, the luminosity factor correction polarization degree was 99.996%, the single hue a was −1.1, and the single hue b was 3.7.

(9) Manufacture of Both Laminate of Horizontally Oriented Phase Difference Film and Vertically Oriented Liquid Crystal Cured Film, and Elliptical Polarizing Plate First, the coated surfaces of the horizontally oriented phase difference film (horizontally oriented liquid crystal cured film) and the vertically oriented liquid crystal cured film were subjected to a corona treatment, and then the respective coated surface sides were bonded to each other via an adhesive (pressure-sensitive adhesive (15 μm) manufactured by LINTEC Corporation) to prepare a laminate of the horizontally oriented phase difference film and the vertically oriented liquid crystal cured film. Next, the surface, on the horizontally oriented phase difference film side, of the base material was subjected to a corona treatment, followed by bonding it to the polarizing film via an adhesive (pressure-sensitive adhesive (25 μm) manufactured by LINTEC Corporation) such that the angle between the absorption axis of the polarizing film and the slow axis of the horizontally oriented phase difference film became 45° to prepare an elliptical polarizing plate.

<Confirmation of Front Reflection Hue and Oblique Reflection Hue>

The display device of "Galaxy S5" manufactured by SAMSUNG was taken out by removing the front glass and the polarizing plate. Thereafter, the elliptical polarizing plate manufactured by the above method was bonded to the display device via an adhesive (pressure-sensitive adhesive (25 μm) manufactured by LINTEC Corporation). Reflection hues, confirmed while the power supply of the display device was turned off (during the display of black), were evaluated according to the following criteria. Results are shown in Table 1. The front reflection hue is one confirmed by visually observing the sample at a distance of 50 cm from the front of the sample, and the oblique reflection hue was confirmed by visually observing it at a distance of 50 cm from a direction in which an elevation angle is 60° and an azimuth is 0 to 360°.

Evaluation Criteria:

⊙: When a hue is confirmed at 1 m directly below a 40W 3-wavelength lamp, under the condition of being lined up with glossy black drawing paper, and with the naked eye, almost no color is observed.

Δ: When a hue is confirmed at 1.5 m directly below a 40W 3-wavelength lamp, alone, and with the naked eye, color is observed, which varies depending on the azimuth and appears bluish black or reddish black.

x: When a hue is confirmed at 1.5 m directly below a 40W 3-wavelength lamp, alone, and with the naked eye, strong color is observed, which varies depending on the azimuth and appears strongly bluish or reddish black.

Subsequently, the front hue and the oblique hue during the display of white were confirmed: by using the same sample; by turning on the power supply of the display device; by turning off all the settings for changing the screen display color, such as the blue light cut function and color balance change, after the brightness is maximized; and while white is displayed (while the HTML color code #FFFFFF is displayed). The hues were evaluated according to the following criteria. Results are shown in Table 1. The front hue is one visually confirmed at a distance of 50 cm from the front of the sample, and the oblique hue is one visually confirmed in the state of being 50 cm away from the sample and from a direction in which an elevation angle is 60° and an azimuth is 0 to 360°.

Evaluation Criteria:

⊙: When a hue is confirmed with the naked eye while white is displayed in a dark room, no color is observed at all.

○: When a hue is confirmed with the naked eye while white is displayed in a dark room, almost no color is observed.

Δ: When a hue is confirmed with the naked eye while white is displayed in a dark room, color is observed.

x: When a hue is confirmed with the naked eye while white is displayed in a dark room, color is observed strongly.

xx: When a hue is confirmed with the naked eye while white is displayed in a dark room, color is observed very strongly.

2. Examples 2 and 3

An elliptical polarizing plate was manufactured in the same way as in Example 1 except that in preparing a polymerizable liquid crystal composition for forming a vertically oriented liquid crystal cured film, the addition amount of the dichroic coloring matter was changed. The hue during the display of white and the reflection hue during the display of black were confirmed and evaluated in the same way as in Example 1. Results are shown in Table 1.

3. Examples 4 to 6

An elliptical polarizing plate was produced in the same way as in Example 1 except that in preparing a polymerizable liquid crystal composition for forming a vertically oriented liquid crystal cured film, the dichroic coloring matter was changed to the dichroic coloring matter B described in JP-A-2017-197630 and the addition amount of the dichroic coloring matter was changed. Further, the hue during the display of white and the reflection during the display of black were confirmed and evaluated in the same way as in Example 1 except that the panel used for confirming the hues during the display of white and during the display of black was changed to "Galaxy S8" manufactured by SAMSUNG. Results are shown in Table 1.

Dichroic coloring matter B: maximum absorption wavelength 445 nm (measured in chloroform solution)

[Chemical 36]

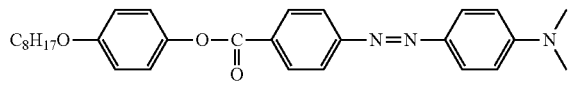

4. Example 7

The hue during the display of white and the reflection hue during the display of black were confirmed and evaluated in the same way as in Example 1 except that a vertically oriented liquid crystal cured film was manufactured according to the method described below. Results are shown in Table 1.
(1) Preparation of Polymerizable Liquid Crystal Composition for Forming Vertically Oriented Liquid Crystal Cured Film of Example 7
To 100 parts by mass of the liquid crystal compound (X2), 0.25 parts by mass of a leveling agent "F-556" (manufactured by DIC Co., Ltd.), 2.0 parts by mass of the dichroic coloring matter A, 2.0 parts by mass of the ionic compound A, 0.5 parts by mass of a silane coupling agent "KBE-9103" (manufactured by Shin-Etsu Chemical Co., Ltd.), and 6 parts by mass of 2-dimethylamino-2-benzyl-1-(4-morpholinophenyl)butane-1-one ("Irgacure (registered trademark) 369 (Irg369)" manufactured by BASF Japan Co., Ltd.) as a photopolymerization initiator were added. Further, N-methyl-2-pyrrolidone (NMP) was added such that the concentration of solid content became 13%. A composition for forming a vertically oriented liquid crystal cured film was obtained by stirring this mixture at 80° C. for 1 hour.
(2) Manufacture of Vertically Oriented Liquid Crystal Cured Film
A corona treatment was performed on a COP film (ZF-14-50) manufactured by ZEON Corporation, the polymerizable liquid crystal composition for forming a vertically oriented liquid crystal cured film was coated using a bar coater, and it was heated at 120° C. for 60 seconds. While ii was heated to 120° C., ultraviolet rays were then emitted (under nitrogen atmosphere, an integrated amount of light at a wavelength of 365 nm: 500 mJ/cm$^2$) from the surface on which the polymerizable liquid crystal composition for forming a vertically oriented liquid crystal cured film was coated, by using a high-pressure mercury lamp (Unicure VB-15201BY-A, manufactured by Ushio Inc.) to thereby form a vertically oriented liquid crystal cured film. The film thickness of the obtained vertically oriented liquid crystal cured film was measured with an ellipsometer (M-220 manufactured by JASCO Corporation), which was found to be 0.6 m.

5. Example 8

The hue during the display of white and the reflection hue during the display of black were confirmed and evaluated in the same way as in Example 1 except that a vertically oriented liquid crystal cured film was manufactured according to the method described below. Results are shown in Table 1.
(1) Preparation of Polymerizable Liquid Crystal Composition for Forming Vertically Oriented Liquid Crystal Cured Film of Example 8
As shown below, to 100 parts by mass of a mixture of polymerizable liquid crystal compounds in which the following polymerizable liquid crystal compound (Y1) and polymerizable liquid crystal compound (Y2) were mixed at a weight ratio of 90:10, 0.25 parts by mass of a leveling agent "F-556" (manufactured by DIC Co., Ltd.), 0.9 parts by mass of the dichroic coloring matter A, and 6 parts by mass of 2-dimethylamino-2-benzyl-1-(4-morpholinophenyl)butane-1-one ("Irgacure (registered trademark) 369 (Irg369)" manufactured by BASF Japan Co., Ltd.) as a photopolymerization initiator were added. Further, o-xylene was added such that the concentration of solid content became 25%. A polymerizable liquid crystal composition for forming a vertically oriented liquid crystal cured film was obtained by stirring the mixture at 80° C. for 30 minutes.
The polymerizable liquid crystal compounds indicated by the polymerizable liquid crystal compounds (Y1) and (Y2) were synthesized according to the method described in Iub et. al, Recl. Tray. Chim. Pays-Bas, 115, 321-328 (1996).

[Chemical 37]

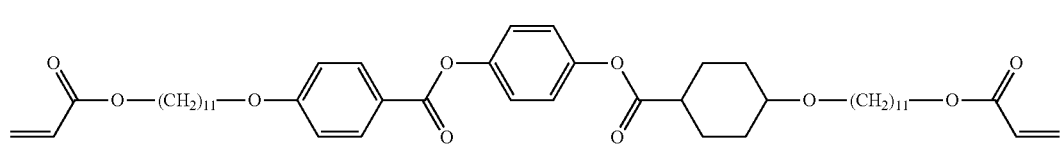
(Y1)

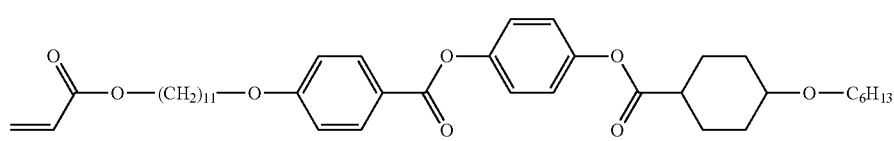
(Y2)

(2) Preparation of Composition for Forming Vertical Orientation Film

A silane coupling agent "KBE-9103" (manufactured by Shin-Etsu Chemical Co., Ltd.) was dissolved in a mixed solvent in which ethanol and water were mixed at a ratio (weight ratio) of 9:1 to form a composition for forming a vertical orientation film having a solid content of 1%.

(3) Manufacture of Vertically Oriented Liquid Crystal Cured Film

After a corona treatment was performed on a COP film (ZF-14-50) manufactured by ZEON Corporation, the composition for forming a vertical orientation film was coated using a bar coater and dried at 120° C. for 1 minute thereby to prepare a vertical orientation film. The film thickness of the obtained vertical orientation film was measured with an ellipsometer, which was found to be 100 nm.

Subsequently, the polymerizable liquid crystal composition for forming a vertically oriented liquid crystal cured film was coated on the obtained vertical orientation film using a bar coater, and it was dried at 120° C. for 1 minute. Then, ultraviolet rays were emitted (under nitrogen atmosphere, an integrated amount of light at a wavelength of 365 nm: 500 mJ/cm$^2$) form the surface on which the polymerizable liquid crystal composition for forming a vertically oriented liquid crystal cured film was coated, by using a high-pressure mercury lamp (Unicure VB-15201BY-A, manufactured by Ushio Inc.) to thereby form a vertically oriented liquid crystal cured film.

The film thickness of the obtained vertically oriented liquid crystal cured film was measured with an ellipsometer, which was found to be 0.6 μm.

6. Comparative Example 1

An elliptical polarizing plate was produced in the same way as in Example 1 except that a polymerizable liquid crystal composition for forming a vertically oriented liquid crystal cured film was prepared according to the method described below. The hue during the display of white and the reflection hue during the display of black were confirmed and evaluated by the same method as in Example 1. Results are shown in Table 1.

(1) Preparation of Polymerizable Liquid Crystal Composition for Forming Vertically Oriented Liquid Crystal Cured Film of Comparative Example 1

The polymerizable liquid crystal compound (X1) and the polymerizable liquid crystal compound (X2) were mixed at a mass ratio of 90:10 to obtain a mixture. To 100 parts by mass of the obtained mixture, 0.25 parts by mass of a leveling agent "F-556" (manufactured by DIC Co., Ltd.), 2.0 parts by mass of the ionic compound A, 0.5 parts by mass of a silane coupling agent "KBE-9103" (manufactured by Shin-Etsu Chemical Co., Ltd.), and 6 parts by mass of 2-dimethylamino-2-benzyl-1-(4-morpholinophenyl)butan-1-one ("Irgacure (registered trademark) 369 (Irg369)" manufactured by BASF Japan Co., Ltd.) as a photopolymerization initiator were added. Further, N-methyl-2-pyrrolidone (NMP) was added such that the concentration of solid content became 13%. A polymerizable liquid crystal composition for forming a vertically oriented liquid crystal cured film was obtained by stirring this mixture at 80° C. for 1 hour.

7. Comparative Example 2

The hue during the display of white and the reflection hue during the display of black were confirmed and evaluated in the same way as in Comparative Example 1 except that the panel used for confirming the hues during the display of white and the display of black was changed to "Galaxy S8" manufactured by SAMSUNG. Results are shown in Table 1.

8. Comparative Example 3

As shown below, the hue during the display of white and the reflection hue during the display of black were confirmed and evaluated in the same way as in Comparative Example 2 except that a vertically oriented liquid crystal cured film was not manufactured, the method for manufacturing an elliptical polarizing plate was changed, and the procedures for confirming the hues during the display of white and the display of black were changed. Results are shown in Table 1.

(1) Manufacture of Laminate and Elliptical Polarizing Plate of Comparative Example 3

A corona treatment was performed on the surface, on the side of the horizontally oriented phase difference film (horizontally oriented liquid crystal cured film) manufactured by the same method as in Example 1, of the base material. The polarizing film and the horizontally oriented phase difference film were bonded to each other via a pressure-sensitive adhesive (pressure-sensitive adhesive (25 μm) manufactured by LINTEC Corporation) such that the angle between the absorption axis of the polarizing film and the slow axis of the horizontally oriented phase difference film became 45°. Thereby, an elliptical polarizing plate was manufactured to thereby bond a 420 nm cut filter (SCF-50S-42L manufactured by SIGMAKOKI Co., Ltd.) to the surface on the polarizing film side via the same pressure-sensitive adhesive. When the absorbance of the above 420 nm cut filter was measured by the same method as the measurement of the absorbance of the vertically oriented liquid crystal cured film, no maximum absorption wavelength existed between a wavelength of 400 nm and a wavelength of 700 nm. When the absorbance at λ=420 nm was measured, it was found that AxC(z=60)=0.291 (wavelength 420 nm), Ax=0.382 (wavelength 420 nm), and AxC(z=60)/Ax=1.3 (wavelength 420 nm).

(2) Hue Confirmations During Display of White and During Display of Black

The display device of "Galaxy SS" manufactured by SAMSUNG was taken out by removing the front glass and polarizing plate. Thereafter, the elliptical polarizing plate produced by the above method was bonded to the above display device via a pressure-sensitive adhesive (pressure-sensitive adhesive (25 μm) manufactured by LINTEC Corporation) such that the 420 nm cut filter was arranged on the viewing side. The hues during the display of white and the display of black were confirmed and evaluated. Results are shown in Table 1.

TABLE 1

| | | Vertically oriented liquid crystal cured film | | | | | | | Horizontally oriented phase difference film |
|---|---|---|---|---|---|---|---|---|---|
| | Coloring matter | | Optical characteristics | | | | | | Optical characteristics |
| | Type | Addition amount (Parts by mass) | λmax/nm | AxC (z = 60)/AxC | AxC (z = 60) | AxC | RthC (450)/RthC (550) | RthC (550) | ReA (450)/ReA 550) |
| Example 1 | Dichroic | 1.5 | 600 | 7.4 | 0.175 | 0.024 | 0.85 | −70 | 0.85 |
| Example 2 | coloring | 1.0 | 596 | 5.7 | 0.085 | 0.015 | 0.85 | −70 | 0.85 |
| Example 3 | matter A | 0.5 | 590 | 4.5 | 0.052 | 0.012 | 0.85 | −70 | 0.85 |
| Example 4 | Dichroic | 3.0 | 450 | 3.1 | 0.138 | 0.045 | 0.85 | −70 | 0.85 |
| Example 5 | coloring | 1.5 | 444 | 3.5 | 0.076 | 0.022 | 0.85 | −70 | 0.85 |
| Example 6 | matter B | 1.0 | 442 | 3.4 | 0.054 | 0.016 | 0.85 | −70 | 0.85 |
| Example 7 | Dichroic | 2.0 | 600 | 5.5 | 0.088 | 0.016 | 1.12 | −70 | 0.85 |
| Example 8 | coloring matter A | 0.9 | 598 | 14.2 | 0.073 | 0.005 | 1.12 | −70 | 0.85 |
| Comparative Example 1 | Without | | — | — | — | — | 0.85 | −70 | 0.85 |
| Comparative Example 2 | Without | | — | — | — | — | 0.85 | −70 | 0.85 |
| Comparative Example 3 | Without (420 cut filter bonded to polarizing plate viewing side | | | | | | | | 0.85 |

| | Horizontally oriented phase difference film | Laminate | | | | | | |
|---|---|---|---|---|---|---|---|---|
| | | | Hue during display of white | | | Reflection hue during display of black | | |
| | Optical characteristics ReA (550) | Panel | Front hue | Oblique hue | Front/Oblique hue difference | Front reflection hue | Oblique reflection hue during display of black | Front/Oblique reflection hue difference |
| Example 1 | 142 | GalaxyS5 | Δ (Pale blue) | ○ (Slightly blue) | ○ | ○ | ○ | ○ |
| Example 2 | 142 | GalaxyS5 | ⊙ (White) | ⊙ (White) | ⊙ | ○ | ○ | ○ |
| Example 3 | 142 | GalaxyS5 | ○ (Slightly yellow) | Δ (Pale yellow) | ○ | ○ | ○ | ○ |
| Example 4 | 142 | GalaxyS8 | Δ (Pale yellow) | ○ (Slightly yellow) | ○ | ○ | ○ | ○ |
| Example 5 | 142 | GalaxyS8 | ⊙ (White) | ⊙ (White) | ⊙ | ○ | ○ | ○ |
| Example 6 | 142 | GalaxyS8 | ○ (Slightly blue) | Δ (Pale blue) | ○ | ○ | ○ | ○ |
| Example 7 | 142 | GalaxyS5 | ⊙ (White) | ⊙ (White) | ⊙ | ○ | Δ | Δ |
| Example 8 | 142 | GalaxyS5 | ○ (Slightly yellow) | ⊙ (White) | ○ | ○ | Δ | Δ |
| Comparative Example 1 | 142 | GalaxyS5 | Δ (Pale yellow) | X (Yellow) | X | ○ | ○ | ○ |
| Comparative Example 2 | 142 | GalaxyS8 | Δ (Pale blue) | XX (Blue) | XX | ○ | ○ | ○ |
| Comparative Example 3 | 142 | GalaxyS8 | ○ (Slightly blue) | X (Blue) | X | ○ | X | X |

In the laminates (Examples 1 to 8) according to the present invention, it was confirmed that on the panel, the difference between the front hue and the oblique hue during the display of white and the difference between the front reflection hue and the oblique reflection hue during the display of black became small.

The invention claimed is:

1. A laminate comprising:
a vertically oriented liquid crystal cured film, which is a cured product of a polymerizable liquid crystal composition containing a polymerizable liquid crystal compound, an orientation promoter, and a dichroic coloring matter, and a horizontally oriented phase difference film;
wherein the orientation promoter satisfies the following formula (8):

$$5 < M < 16 \qquad (8),$$

wherein M=(of the substituents directly bonded onto the positively charged atoms, the number of covalent bonds from the positively charged atom to the end of the molecular chain of the substituent having the largest number of covalent bonds to the end of the molecular chain)÷(number of the positively charged atoms)

and comprising: as the dichroic coloring matter, at least one type of dichroic coloring matter having maximum absorption between a wavelength of 400 nm and a wavelength of 750 nm, the vertically oriented liquid crystal cured film being a cured product of the polymerizable liquid crystal composition that is cured in a state in which the polymerizable liquid crystal compound is oriented in a vertical direction with respect to a flat plane of the liquid crystal cured film, and the vertically oriented liquid crystal cured film satisfying the following formula (1), the following formula (2), and the following formula (5):

$$0.001 \leq AxC \leq 0.3 \qquad (1)$$

$$AxC(z=60)/AxC > 2 \qquad (2)$$

$$RthC(450)/RthC(550) < 1.00 \qquad (5)$$

where, AxC and AxC(z=60) are both absorbances of the vertically oriented liquid crystal cured film at maximum absorption wavelengths between a wavelength of 400 nm and a wavelength of 750 nm, in which AxC represents an absorbance of linearly polarized light that oscillates in an x-axis direction, and AxC (z=60) represents an absorbance of linearly polarized light that oscillates in the x-axis direction when the vertically oriented liquid crystal cured film is rotated by 60° with a y-axis as a rotation axis, where the x-axis means any direction in the plane of the vertically oriented liquid crystal cured film, the y-axis means a direction perpendicular to the x-axis in the plane of the film, and a z-axis means a thickness direction of the vertically oriented liquid crystal cured film and RthC(λ) represents a phase difference value, at the wavelength of λ nm and in the film thickness direction, of the vertically oriented liquid crystal cured film, which is a value determined by RthC(λ)=((nxC(λ)+nyC(λ))/2−nzC(λ))×dC (where, RthC(λ) represents the phase difference value, at the wavelength of λ nm and in the film thickness direction, of the vertically oriented liquid crystal cured film, where nxC(λ) indicates an in-plane main refractive index, at the wavelength of λ nm, of the vertically oriented liquid crystal cured film, nyC(λ) indicates a refractive index at the wavelength of λ nm and in a direction perpendicular, in the plane, to nxC(λ), nzC(λ) indicates a refractive index, at the wavelength of λ nm and in the thickness direction, of the vertically oriented liquid crystal cured film, and dC indicates the thickness of the vertically oriented liquid crystal cured film; and wherein the horizontally oriented phase difference film satisfies the following formula (3)

$$ReA(450)/ReA(550) < 1.00 \qquad (3),$$

where ReA(λ) represents an in-plane phase difference value, at a wavelength of λ nm, of the horizontally oriented phase difference film, and ReA(λ)=(nxA(λ)−nyA(λ))×dA holds (where, nxA(λ) represents a main refractive index at the wavelength of λ nm and in the plane of the horizontally oriented phase difference film, nyA(λ) represents a refractive index at the wavelength of λ nm and in a direction perpendicular to a direction of nxA in the same plane as nxA, and dA indicates a film thickness of the horizontally oriented phase difference film).

2. The laminate according to claim 1, wherein the horizontally oriented phase difference film satisfies the formula (4):

$$120 \text{ nm} \leq ReA(550) \leq 170 \text{ nm} \qquad (4),$$

[where, ReA(λ) represents an in-plane phase difference value, at the wavelength of λ nm, of the horizontally oriented phase difference film, and ReA(λ)=(nxA(λ)−nyA(λ))×dA holds (where, nxA(λ) represents the main refractive index at the wavelength of λ nm and in the plane of the horizontally oriented phase difference film, nyA(λ) represents the refractive index at the wavelength of λ nm and in the direction perpendicular to the direction of nxA in the same plane as nxA, and dA indicates the film thickness of the horizontally oriented phase difference film)].

3. The laminate according to claim 1, wherein the horizontally oriented phase difference film is a cured product of a polymerizable liquid crystal composition containing a polymerizable liquid crystal compound (a) that is cured in a state in which the polymerizable liquid crystal compound is oriented in a horizontal direction with respect to a flat plane of the phase difference film.

4. The laminate according to claim 1, wherein the vertically oriented liquid crystal cured film has a film thickness of 0.2 to 3 μm.

5. The laminate according to claim 1, wherein the polymerizable liquid crystal composition that forms the vertically oriented liquid crystal cured film contains, as the dichroic coloring matter, at least one type of azo coloring matter.

6. The laminate according to claim 1, wherein the polymerizable liquid crystal composition that forms the vertically oriented liquid crystal cured film contains, as the dichroic coloring matter, at least one type of azo coloring matter, and
wherein the vertically oriented liquid crystal cured film satisfies the following condition (6) or (7):
(6) having maximum absorption from a wavelength of 400 nm to a wavelength of less than 550 nm, no maximum absorption between a wavelength of 550 nm and a wavelength of 700 nm;
(7) having maximum absorption between a wavelength of 550 nm and a wavelength of 700 nm, and no maximum absorption from a wavelength of 400 nm to a wavelength of less than 550 nm.

7. The laminate according to claim 1, which is used for an organic EL display device.

* * * * *